(12) United States Patent  
Kumar et al.

(10) Patent No.: US 8,830,093 B2  
(45) Date of Patent: Sep. 9, 2014

(54) SYSTEMS AND METHODS FOR LOAD BALANCING AND VIRTUAL PRIVATE NETWORKING FOR SMS CENTER

(71) Applicants: Abhishek Kumar, Karnataka (IN); Syed Mushtag Ahmed, Karnataka (IN); Vipin Kumar Duleb, Hyderabad (IN); Rajesh Joshi, Karnataka (IN)

(72) Inventors: Abhishek Kumar, Karnataka (IN); Syed Mushtag Ahmed, Karnataka (IN); Vipin Kumar Duleb, Hyderabad (IN); Rajesh Joshi, Karnataka (IN)

(73) Assignee: Citrix Systems, Inc., Fort Lauderdale, FL (US)

( * ) Notice: Subject to any disclaimer, the term of this patent is extended or adjusted under 35 U.S.C. 154(b) by 0 days.

(21) Appl. No.: 13/677,041

(22) Filed: Nov. 14, 2012

(65) Prior Publication Data  
US 2013/0120168 A1  May 16, 2013

Related U.S. Application Data

(60) Provisional application No. 61/559,900, filed on Nov. 15, 2011.

(51) Int. Cl.  
*H03M 7/30* (2006.01)

(52) U.S. Cl.  
USPC .............................................. 341/87; 704/10

(58) Field of Classification Search  
CPC .. H03M 7/30; G06F 17/2735; G06F 17/2785; G06F 17/2247; H03G 3/3042; H04W 80/04  
USPC .......... 341/87; 704/10, 9; 707/755; 455/126; 370/328  
See application file for complete search history.

(56) References Cited

U.S. PATENT DOCUMENTS

2006/0142997 A1* 6/2006 Jakobsen et al. ................ 704/10

FOREIGN PATENT DOCUMENTS

| KR | 20040087503 A | 10/2004 |
| WO | WO-2008/022433 A1 | 2/2008 |
| WO | WO-2008/126067 | 10/2008 |

OTHER PUBLICATIONS

International Search report and Written Opinion issued on Jan. 30, 2013 in PCT Application No. PCT/US2012/065057.

* cited by examiner

*Primary Examiner* — Joseph Lauture  
(74) *Attorney, Agent, or Firm* — Foley & Lardner LLP; Christopher J. McKenna

(57) ABSTRACT

The present disclosure is directed towards systems and methods for compressing messages, such as Short Message Service (SMS) or text messages between fixed or mobile devices through communications networks. The data of, for example, SMS messages is compressed and forwarded through a communication network to an appliance having a processing unit. The appliance decompresses the message and controls its delivery through network communication devices, where the decompressed SMS message is forwarded to its destination.

19 Claims, 22 Drawing Sheets

SYSTEMS AND METHODS FOR LOAD BALANCING AND VIRTUAL PRIVATE NETWORKING FOR SMS CENTER

CROSS-REFERENCE TO RELATED PATENT APPLICATIONS

This application claims the benefit of and priority to U.S. Provisional Patent Application 61/559,900, filed Nov. 15, 2011, incorporated herein by reference in its entirety.

FIELD OF THE INVENTION

The present application generally relates to data communication networks. In particular, the present application relates to systems and methods for compressing data for communication between computing devices through a communication network.

BACKGROUND OF THE INVENTION

A large and growing amount of information is communicated between computing devices over mobile telephone and other communication networks. This information consumes bandwidth and other resources. Insufficient bandwidth to handle the volume of information communicated through these networks can delay or prevent communications through a network.

BRIEF SUMMARY OF THE INVENTION

The present application is directed towards systems and methods for compressing messages, such as Short Message Service (SMS) or text messages between fixed or mobile devices through communications networks. The data of, for example, SMS messages is compressed and forwarded through a communication network to an appliance having a processing unit. The appliance decompresses the message and controls its delivery through network communication devices, where the decompressed SMS message is forwarded to its destination. Compression of the SMS message reduces bandwidth usage between the electronic device that generated and transmitted the SMS message, and facilities of the communications network, such as Short Message Service Centers that deliver the SMS message to a destination device.

The details of various embodiments of the invention are set forth in the accompanying drawings and the description below.

According to one aspect of the disclosure, a method for compressing short text data includes a device receiving a text to be compressed. The text comprising a plurality of symbols. The device identifies a dictionary for each symbol. The dictionary comprising a list of the symbols sorted in decreasing probability of occurring a predetermined distance from a symbol for which the dictionary was generated. The device encodes a first symbol in a first position of the text with the dictionary corresponding to the symbol the predetermined distance away from the first position.

In some embodiments, the predetermined distance is a text position immediately after the symbol for which the dictionary was generated. In some embodiments, a generic dictionary comprising a list of symbols, ordered in decreasing probability of occurring at the beginning of words of a language is also generated. Some embodiments also include encoding the symbol the predetermined distance from one of a space or a special character with the default dictionary, and encoding the symbol at the beginning of the text with the generic dictionary. In some embodiments, the device encodes each symbol of the text with the dictionary of the symbol the predetermined distance away from the symbol to be encoded.

In some embodiments, the symbol comprises one of a letter, a number, a group of symbols, or a special character. In some embodiments a separate dictionary is generated for each letter of a language, and a numerical dictionary is generated for numbers. In some embodiments, the first entry of the dictionaries is set to be a space. In some embodiments, a second symbol in a second position of the text is encoded with the dictionary corresponding to the symbol the predetermined distance away from the second position.

According to another aspect of the disclosure, a device for compressing short text data includes a receiving module and an encoding module. The receiving module is configured to receive a text to be compressed. The encoding modules is configured to identify identifying a dictionary for each symbol of a plurality of symbols, and encoding a first symbol in a first position of the text with the dictionary corresponding to the symbol the predetermined distance away from the first position.

In some embodiments, the predetermined distance is a text position immediately after the symbol for which the dictionary was generated. In some embodiments, the encoding module is further configured to generate a generic dictionary, the generic dictionary comprising a list of symbols, ordered in decreasing probability of occurring at the beginning of words of a language.

In some embodiments, the encoding module is further configured to encode the symbol the predetermined distance from one of a space or a special character with the default dictionary. In some of these embodiments, encoding module is further configured to encode the symbol at the beginning of the text with the generic dictionary. In yet other embodiments, the encoding module is further configured to encode each symbol of the text with the dictionary of the symbol the predetermined distance away from the symbol to be encoded.

In some embodiments, the symbol comprises one of a letter, a number, a group of symbols, or a special character. In some embodiments, encoding module is further configured to generate a separate dictionary for each letter of a language and a numerical dictionary for numbers. In some embodiments, the encoding module sets a first entry of the plurality of dictionaries to be a space. In other embodiments, the encoding module is further configured to encode a second symbol in a second position of the text with the dictionary corresponding to the symbol the predetermined distance away from the second position.

BRIEF DESCRIPTION OF THE FIGURES

The foregoing and other objects, aspects, features, and advantages of the invention will become more apparent and better understood by referring to the following description taken in conjunction with the accompanying drawings, in which.

Figure 1A:
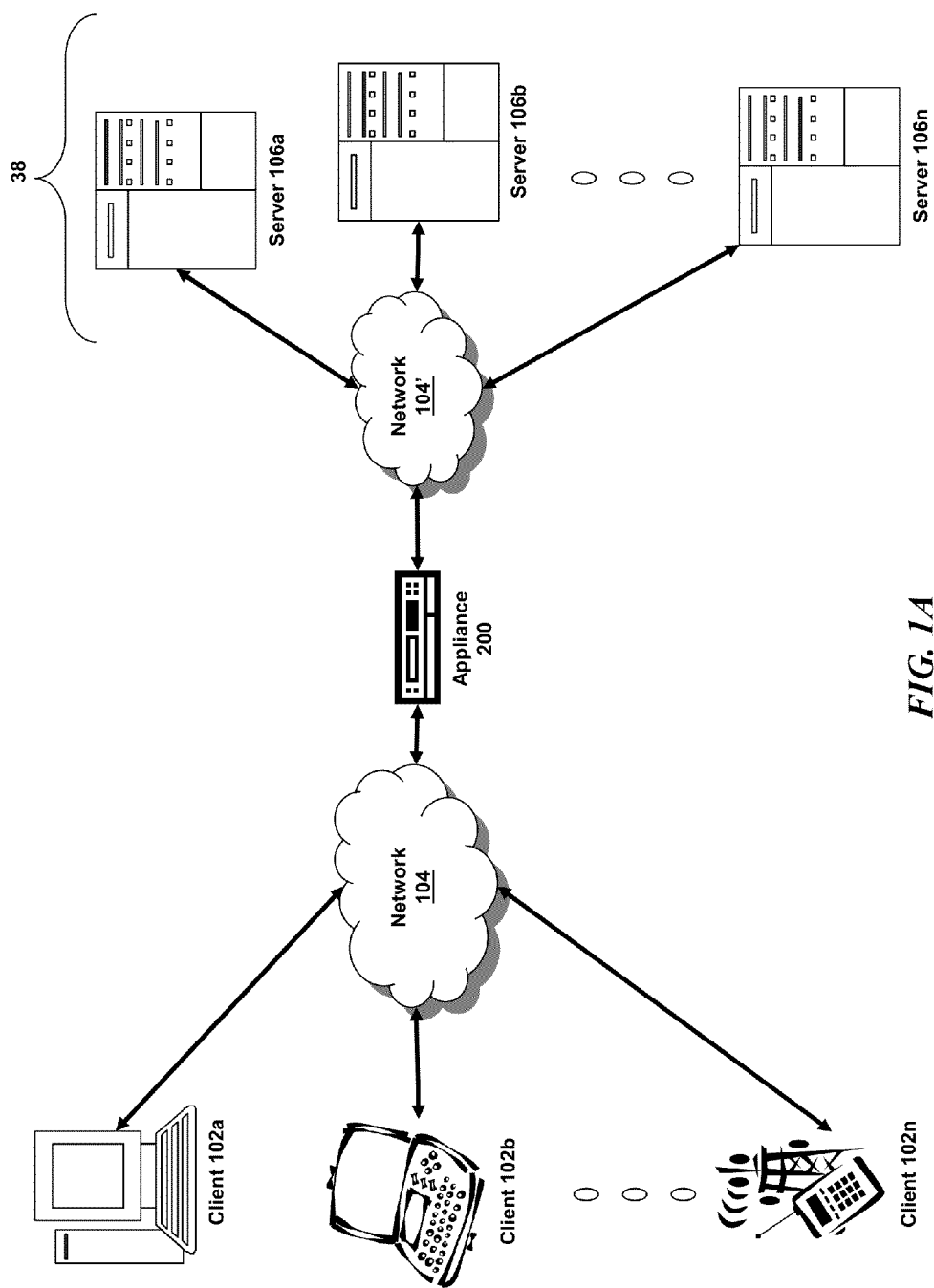
FIG. 1A is a block diagram of an embodiment of a network environment for a client to access a server via an appliance.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

For purposes of reading the description of the various embodiments below, the following descriptions of the sections of the specification and their respective contents may be helpful:

Section A describes a network environment and computing environment which may be useful for practicing embodiments described herein;

Section B describes embodiments of systems and methods for delivering a computing environment to a remote user;

Section C describes embodiments of systems and methods for accelerating communications between a client and a server;

Section D describes embodiments of systems and methods for virtualizing an application delivery controller;

Section E describes embodiments of systems and methods for providing a multi-core architecture and environment; and Section F describes embodiments of systems and methods for communicating messages through a communications network.

A. Network and Computing Environment

Prior to discussing the specifics of embodiments of the systems and methods of an appliance and/or client, it may be helpful to discuss the network and computing environments in which such embodiments may be deployed. Referring now to FIG. 1A, an embodiment of a network environment is depicted. In brief overview, the network environment comprises one or more clients 102a-102n (also generally referred to as local machine(s) 102, or client(s) 102) in communication with one or more servers 106a-106n (also generally referred to as server(s) 106, or remote machine(s) 106) via one or more networks 104, 104' (generally referred to as network 104). In some embodiments, a client 102 communicates with a server 106 via an appliance 200.

Although FIG. 1A shows a network 104 and a network 104' between the clients 102 and the servers 106, the clients 102 and the servers 106 may be on the same network 104. The networks 104 and 104' can be the same type of network or different types of networks. The network 104 and/or the network 104' can be a local-area network (LAN), such as a company Intranet, a metropolitan area network (MAN), or a wide area network (WAN), such as the Internet or the World Wide Web. In one embodiment, network 104' may be a private network and network 104 may be a public network. In some embodiments, network 104 may be a private network and network 104' a public network. In another embodiment, networks 104 and 104' may both be private networks. In some embodiments, clients 102 may be located at a branch office of a corporate enterprise communicating via a WAN connection over the network 104 to the servers 106 located at a corporate data center.

The network 104 and/or 104' be any type and/or form of network and may include any of the following: a point to point network, a broadcast network, a wide area network, a local area network, a telecommunications network, a data communication network, a computer network, an ATM (Asynchronous Transfer Mode) network, a SONET (Synchronous Optical Network) network, a SDH (Synchronous Digital Hierarchy) network, a wireless network and a wireline network. In some embodiments, the network 104 may comprise a wireless link, such as an infrared channel or satellite band. The topology of the network 104 and/or 104' may be a bus, star, or ring network topology. The network 104 and/or 104' and network topology may be of any such network or network topology as known to those ordinarily skilled in the art capable of supporting the operations described herein.

As shown in FIG. 1A, the appliance 200, which also may be referred to as an interface unit 200 or gateway 200, is shown between the networks 104 and 104'. In some embodiments, the appliance 200 may be located on network 104. For example, a branch office of a corporate enterprise may deploy an appliance 200 at the branch office. In other embodiments, the appliance 200 may be located on network 104'. For example, an appliance 200 may be located at a corporate data center. In yet another embodiment, a plurality of appliances 200 may be deployed on network 104. In some embodiments, a plurality of appliances 200 may be deployed on network 104'. In one embodiment, a first appliance 200 communicates with a second appliance 200'. In other embodiments, the appliance 200 could be a part of any client 102 or server 106 on the same or different network 104,104' as the client 102. One or more appliances 200 may be located at any point in the network or network communications path between a client 102 and a server 106.

In some embodiments, the appliance 200 comprises any of the network devices manufactured by Citrix Systems, Inc. of Ft. Lauderdale Fla., referred to as Citrix NetScaler devices. In other embodiments, the appliance 200 includes any of the product embodiments referred to as WebAccelerator and BigIP manufactured by F5 Networks, Inc. of Seattle, Wash. In another embodiment, the appliance 205 includes any of the DX acceleration device platforms and/or the SSL VPN series of devices, such as SA 700, SA 2000, SA 4000, and SA 6000 devices manufactured by Juniper Networks, Inc. of Sunnyvale, Calif. In yet another embodiment, the appliance 200 includes any application acceleration and/or security related appliances and/or software manufactured by Cisco Systems, Inc. of San Jose, Calif., such as the Cisco ACE Application Control Engine Module service software and network modules, and Cisco AVS Series Application Velocity System.

In one embodiment, the system may include multiple, logically-grouped servers 106. In these embodiments, the logical group of servers may be referred to as a server farm 38. In some of these embodiments, the servers 106 may be geographically dispersed. In some cases, a farm 38 may be administered as a single entity. In other embodiments, the server farm 38 comprises a plurality of server farms 38. In one embodiment, the server farm executes one or more applications on behalf of one or more clients 102.

The servers 106 within each farm 38 can be heterogeneous. One or more of the servers 106 can operate according to one type of operating system platform (e.g., WINDOWS NT, manufactured by Microsoft Corp. of Redmond, Wash.), while one or more of the other servers 106 can operate on according to another type of operating system platform (e.g., Unix or Linux). The servers 106 of each farm 38 do not need to be physically proximate to another server 106 in the same farm 38. Thus, the group of servers 106 logically grouped as a farm 38 may be interconnected using a wide-area network (WAN) connection or medium-area network (MAN) connection. For example, a farm 38 may include servers 106 physically located in different continents or different regions of a continent, country, state, city, campus, or room. Data transmission speeds between servers 106 in the farm 38 can be increased if the servers 106 are connected using a local-area network (LAN) connection or some form of direct connection.

Servers 106 may be referred to as a file server, application server, web server, proxy server, or gateway server. In some embodiments, a server 106 may have the capacity to function as either an application server or as a master application server. In one embodiment, a server 106 may include an Active Directory. The clients 102 may also be referred to as client nodes or endpoints. In some embodiments, a client 102 has the capacity to function as both a client node seeking access to applications on a server and as an application server providing access to hosted applications for other clients 102a-102n.

In some embodiments, a client 102 communicates with a server 106. In one embodiment, the client 102 communicates directly with one of the servers 106 in a farm 38. In another embodiment, the client 102 executes a program neighborhood application to communicate with a server 106 in a farm 38. In still another embodiment, the server 106 provides the functionality of a master node. In some embodiments, the client 102 communicates with the server 106 in the farm 38 through a network 104. Over the network 104, the client 102 can, for example, request execution of various applications hosted by the servers 106a-106n in the farm 38 and receive output of the results of the application execution for display. In some embodiments, only the master node provides the functionality required to identify and provide address information associated with a server 106' hosting a requested application.

In one embodiment, the server 106 provides functionality of a web server. In another embodiment, the server 106a receives requests from the client 102, forwards the requests to a second server 106b and responds to the request by the client 102 with a response to the request from the server 106b. In still another embodiment, the server 106 acquires an enumeration of applications available to the client 102 and address information associated with a server 106 hosting an application identified by the enumeration of applications. In yet another embodiment, the server 106 presents the response to the request to the client 102 using a web interface. In one embodiment, the client 102 communicates directly with the server 106 to access the identified application. In another embodiment, the client 102 receives application output data, such as display data, generated by an execution of the identified application on the server 106.

Figure 1B:
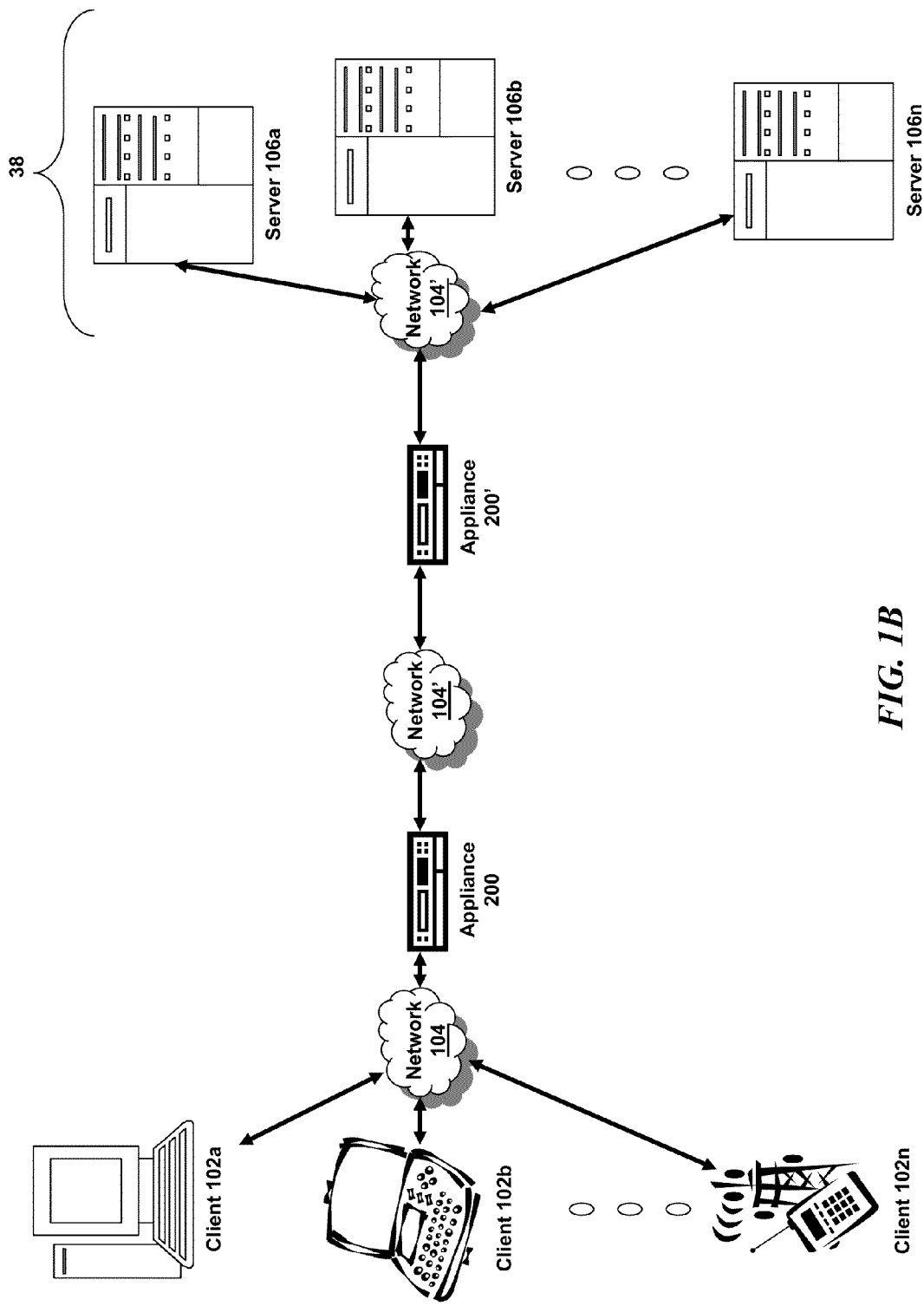
FIG. 1B is a block diagram of an embodiment of an environment for delivering a computing environment from a server to a client via an appliance.
Figure 1C:
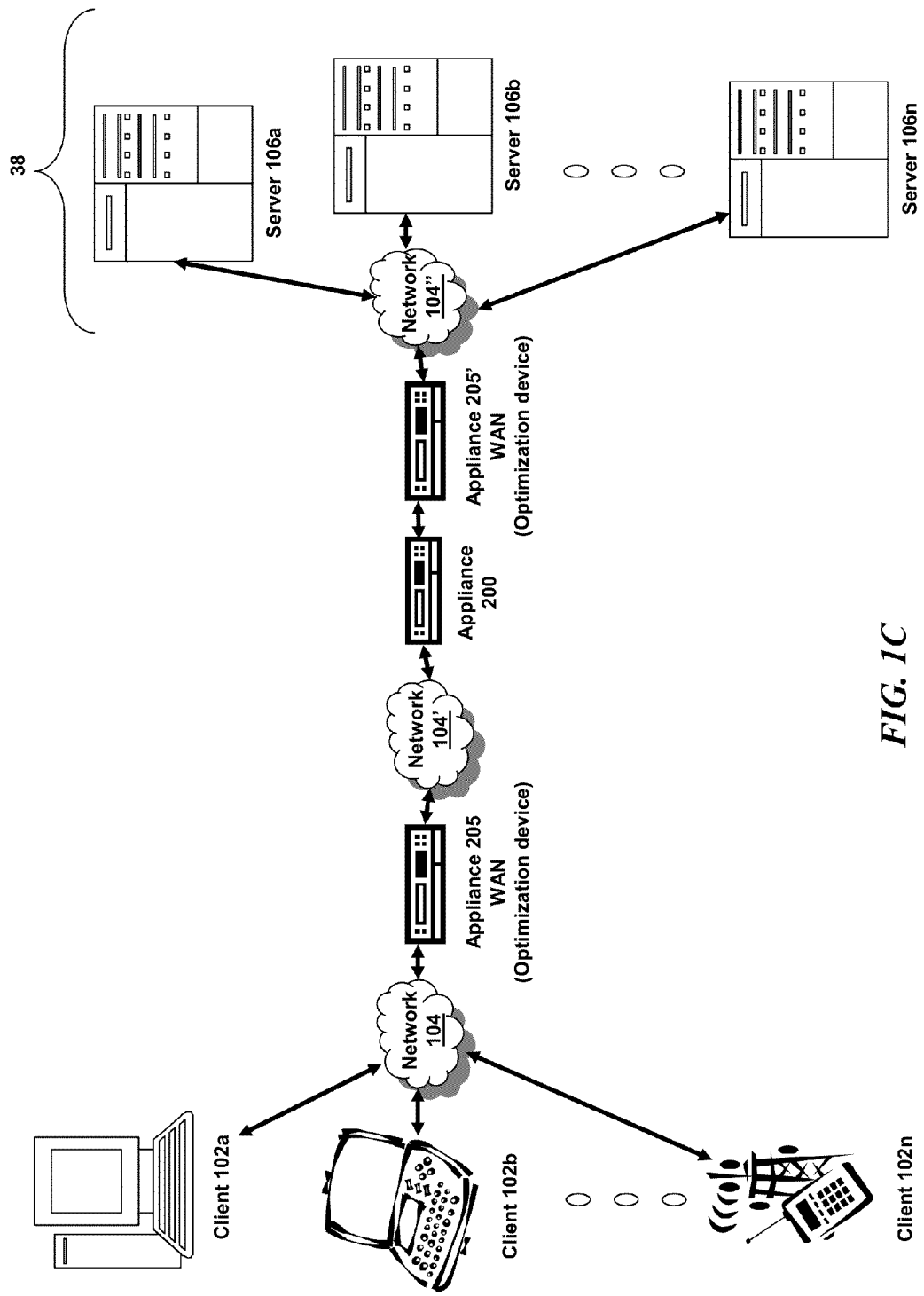
FIG. 1C is a block diagram of another embodiment of an environment for delivering a computing environment from a server to a client via an appliance.

Referring now to FIG. 1B, an embodiment of a network environment deploying multiple appliances 200 is depicted. A first appliance 200 may be deployed on a first network 104 and a second appliance 200' on a second network 104'. For example a corporate enterprise may deploy a first appliance 200 at a branch office and a second appliance 200' at a data center. In another embodiment, the first appliance 200 and second appliance 200' are deployed on the same network 104 or network 104. For example, a first appliance 200 may be deployed for a first server farm 38, and a second appliance 200 may be deployed for a second server farm 38'. In another example, a first appliance 200 may be deployed at a first branch office while the second appliance 200' is deployed at a second branch office'. In some embodiments, the first appliance 200 and second appliance 200' work in cooperation or in conjunction with each other to accelerate network traffic or the delivery of application and data between a client and a server Referring now to FIG. 1C, another embodiment of a network environment deploying the appliance 200 with one or more other types of appliances, such as between one or more WAN optimization appliance 205, 205' is depicted. For example a first WAN optimization appliance 205 is shown between networks 104 and 104' and a second WAN optimization appliance 205' may be deployed between the appliance 200 and one or more servers 106. By way of example, a corporate enterprise may deploy a first WAN optimization appliance 205 at a branch office and a second WAN optimization appliance 205' at a data center. In some embodiments, the appliance 205 may be located on network 104'. In other embodiments, the appliance 205' may be located on network 104. In some embodiments, the appliance 205' may be located on network 104' or network 104". In one embodiment, the appliance 205 and 205' are on the same network. In another embodiment, the appliance 205 and 205' are on different networks. In another example, a first WAN optimization appliance 205 may be deployed for a first server farm 38 and a second WAN optimization appliance 205' for a second server farm 38'

In one embodiment, the appliance 205 is a device for accelerating, optimizing or otherwise improving the performance, operation, or quality of service of any type and form of network traffic, such as traffic to and/or from a WAN connection. In some embodiments, the appliance 205 is a performance enhancing proxy. In other embodiments, the appliance 205 is any type and form of WAN optimization or acceleration device, sometimes also referred to as a WAN optimization controller. In one embodiment, the appliance 205 is any of the product embodiments referred to as WANScaler manufactured by Citrix Systems, Inc. of Ft. Lauderdale, Fla. In other embodiments, the appliance 205 includes any of the product embodiments referred to as BIG-IP link controller and WANjet manufactured by F5 Networks, Inc. of Seattle, Wash. In another embodiment, the appliance 205 includes any of the WX and WXC WAN acceleration device platforms manufactured by Juniper Networks, Inc. of Sunnyvale, Calif. In some embodiments, the appliance 205 includes any of the steelhead line of WAN optimization appliances manufactured by Riverbed Technology of San Francisco, Calif. In other embodiments, the appliance 205 includes any of the WAN related devices manufactured by Expand Networks Inc. of Roseland, N.J. In one embodiment, the appliance 205 includes any of the WAN related appliances manufactured by Packeteer Inc. of Cupertino, Calif., such as the PacketShaper, iShared, and SkyX product embodiments provided by Packeteer. In yet another embodiment, the appliance 205 includes any WAN related appliances and/or software manufactured by Cisco Systems, Inc. of San Jose, Calif., such as the Cisco Wide Area Network Application Services software and network modules, and Wide Area Network engine appliances.

In one embodiment, the appliance 205 provides application and data acceleration services for branch-office or remote offices. In one embodiment, the appliance 205 includes optimization of Wide Area File Services (WAFS). In another embodiment, the appliance 205 accelerates the delivery of files, such as via the Common Internet File System (CIFS) protocol. In other embodiments, the appliance 205 provides caching in memory and/or storage to accelerate delivery of applications and data. In one embodiment, the appliance 205 provides compression of network traffic at any level of the network stack or at any protocol or network layer. In another embodiment, the appliance 205 provides transport layer protocol optimizations, flow control, performance enhancements or modifications and/or management to accelerate delivery of applications and data over a WAN connection. For example, in one embodiment, the appliance 205 provides Transport Control Protocol (TCP) optimizations. In other embodiments, the appliance 205 provides optimizations, flow control, performance enhancements or modifications and/or management for any session or application layer protocol.

In another embodiment, the appliance 205 encoded any type and form of data or information into custom or standard TCP and/or IP header fields or option fields of network packet to announce presence, functionality or capability to another appliance 205'. In another embodiment, an appliance 205' may communicate with another appliance 205' using data encoded in both TCP and/or IP header fields or options. For example, the appliance may use TCP option(s) or IP header fields or options to communicate one or more parameters to be used by the appliances 205, 205' in performing functionality, such as WAN acceleration, or for working in conjunction with each other.

In some embodiments, the appliance 200 preserves any of the information encoded in TCP and/or IP header and/or option fields communicated between appliances 205 and 205'. For example, the appliance 200 may terminate a transport layer connection traversing the appliance 200, such as a transport layer connection from between a client and a server traversing appliances 205 and 205'. In one embodiment, the appliance 200 identifies and preserves any encoded information in a transport layer packet transmitted by a first appliance 205 via a first transport layer connection and communicates a transport layer packet with the encoded information to a second appliance 205' via a second transport layer connection.

Figure 1D:
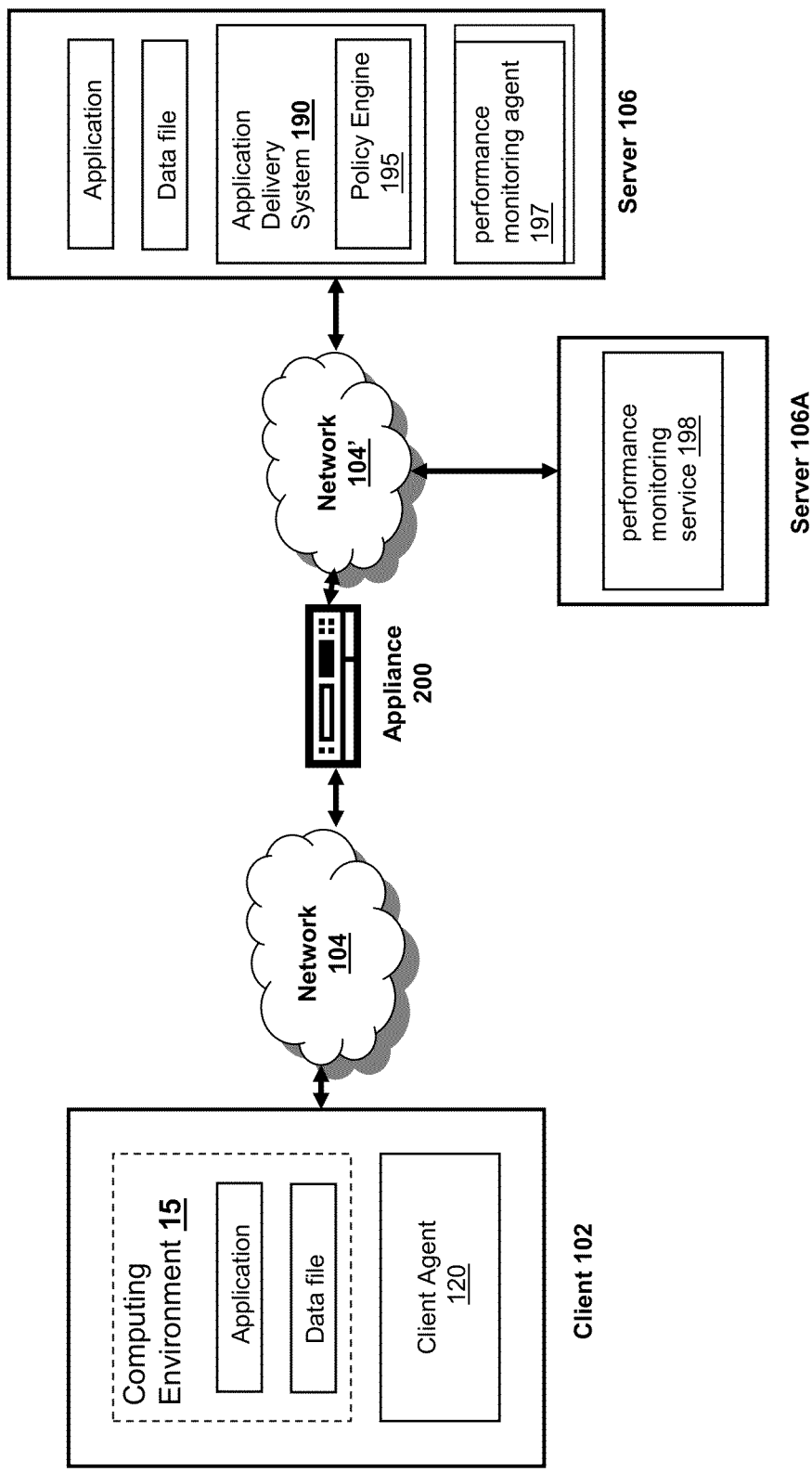
FIG. 1D is a block diagram of another embodiment of an environment for delivering a computing environment from a server to a client via an appliance.

Referring now to FIG. 1D, a network environment for delivering and/or operating a computing environment on a client 102 is depicted. In some embodiments, a server 106 includes an application delivery system 190 for delivering a computing environment or an application and/or data file to one or more clients 102. In brief overview, a client 10 is in communication with a server 106 via network 104, 104' and appliance 200. For example, the client 102 may reside in a remote office of a company, e.g., a branch office, and the server 106 may reside at a corporate data center. The client 102 comprises a client agent 120, and a computing environment 15. The computing environment 15 may execute or operate an application that accesses, processes or uses a data file. The computing environment 15, application and/or data file may be delivered via the appliance 200 and/or the server 106.

In some embodiments, the appliance 200 accelerates delivery of a computing environment 15, or any portion thereof, to a client 102. In one embodiment, the appliance 200 accelerates the delivery of the computing environment 15 by the application delivery system 190. For example, the embodiments described herein may be used to accelerate delivery of a streaming application and data file processable by the application from a central corporate data center to a remote user location, such as a branch office of the company. In another embodiment, the appliance 200 accelerates transport layer traffic between a client 102 and a server 106. The appliance 200 may provide acceleration techniques for accelerating any transport layer payload from a server 106 to a client 102, such as: 1) transport layer connection pooling, 2) transport layer connection multiplexing, 3) transport control protocol buffering, 4) compression and 5) caching. In some embodiments, the appliance 200 provides load balancing of servers 106 in responding to requests from clients 102. In other embodiments, the appliance 200 acts as a proxy or access server to provide access to the one or more servers 106. In another embodiment, the appliance 200 provides a secure virtual private network connection from a first network 104 of the client 102 to the second network 104' of the server 106, such as an SSL VPN connection. It yet other embodiments, the appliance 200 provides application firewall security, control and management of the connection and communications between a client 102 and a server 106.

In some embodiments, the application delivery management system 190 provides application delivery techniques to deliver a computing environment to a desktop of a user, remote or otherwise, based on a plurality of execution methods and based on any authentication and authorization policies applied via a policy engine 195. With these techniques, a remote user may obtain a computing environment and access to server stored applications and data files from any network connected device 100. In one embodiment, the application delivery system 190 may reside or execute on a server 106. In another embodiment, the application delivery system 190 may reside or execute on a plurality of servers 106a-106n. In some embodiments, the application delivery system 190 may execute in a server farm 38. In one embodiment, the server 106 executing the application delivery system 190 may also store or provide the application and data file. In another embodiment, a first set of one or more servers 106 may execute the application delivery system 190, and a different server 106n may store or provide the application and data file. In some embodiments, each of the application delivery system 190, the application, and data file may reside or be located on different servers. In yet another embodiment, any portion of the application delivery system 190 may reside, execute or be stored on or distributed to the appliance 200, or a plurality of appliances.

The client 102 may include a computing environment 15 for executing an application that uses or processes a data file. The client 102 via networks 104, 104' and appliance 200 may request an application and data file from the server 106. In one embodiment, the appliance 200 may forward a request from the client 102 to the server 106. For example, the client 102 may not have the application and data file stored or accessible locally. In response to the request, the application delivery system 190 and/or server 106 may deliver the application and data file to the client 102. For example, in one embodiment, the server 106 may transmit the application as an application stream to operate in computing environment 15 on client 102.

In some embodiments, the application delivery system 190 comprises any portion of the Citrix Access Suite™ by Citrix Systems, Inc., such as the MetaFrame or Citrix Presentation Server™ and/or any of the Microsoft® Windows Terminal Services manufactured by the Microsoft Corporation. In one embodiment, the application delivery system 190 may deliver one or more applications to clients 102 or users via a remote-display protocol or otherwise via remote-based or server-based computing. In another embodiment, the application delivery system 190 may deliver one or more applications to clients or users via steaming of the application.

In one embodiment, the application delivery system 190 includes a policy engine 195 for controlling and managing the access to, selection of application execution methods and the delivery of applications. In some embodiments, the policy engine 195 determines the one or more applications a user or client 102 may access. In another embodiment, the policy engine 195 determines how the application should be delivered to the user or client 102, e.g., the method of execution. In some embodiments, the application delivery system 190 provides a plurality of delivery techniques from which to select a method of application execution, such as a server-based computing, streaming or delivering the application locally to the client 120 for local execution.

In one embodiment, a client 102 requests execution of an application program and the application delivery system 190 comprising a server 106 selects a method of executing the application program. In some embodiments, the server 106 receives credentials from the client 102. In another embodiment, the server 106 receives a request for an enumeration of available applications from the client 102. In one embodiment, in response to the request or receipt of credentials, the application delivery system 190 enumerates a plurality of application programs available to the client 102. The application delivery system 190 receives a request to execute an enumerated application. The application delivery system 190 selects one of a predetermined number of methods for executing the enumerated application, for example, responsive to a policy of a policy engine. The application delivery system 190 may select a method of execution of the application enabling the client 102 to receive application-output data generated by execution of the application program on a server 106. The application delivery system 190 may select a method of execution of the application enabling the local machine 10 to execute the application program locally after retrieving a plurality of application files comprising the application. In yet another embodiment, the application delivery system 190 may select a method of execution of the application to stream the application via the network 104 to the client 102.

A client 102 may execute, operate or otherwise provide an application, which can be any type and/or form of software, program, or executable instructions such as any type and/or form of web browser, web-based client, client-server application, a thin-client computing client, an ActiveX control, or a Java applet, or any other type and/or form of executable instructions capable of executing on client 102. In some embodiments, the application may be a server-based or a remote-based application executed on behalf of the client 102 on a server 106. In one embodiments the server 106 may display output to the client 102 using any thin-client or remote-display protocol, such as the Independent Computing Architecture (ICA) protocol manufactured by Citrix Systems, Inc. of Ft. Lauderdale, Fla. or the Remote Desktop Protocol (RDP) manufactured by the Microsoft Corporation of Redmond, Wash. The application can use any type of protocol and it can be, for example, an HTTP client, an FTP client, an Oscar client, or a Telnet client. In other embodiments, the application comprises any type of software related to VoIP communications, such as a soft IP telephone. In further embodiments, the application comprises any application related to real-time data communications, such as applications for streaming video and/or audio.

In some embodiments, the server 106 or a server farm 38 may be running one or more applications, such as an application providing a thin-client computing or remote display presentation application. In one embodiment, the server 106 or server farm 38 executes as an application, any portion of the Citrix Access Suite™ by Citrix Systems, Inc., such as the MetaFrame or Citrix Presentation Server™, and/or any of the Microsoft® Windows Terminal Services manufactured by the Microsoft Corporation. In one embodiment, the application is an ICA client, developed by Citrix Systems, Inc. of Fort Lauderdale, Fla. In other embodiments, the application includes a Remote Desktop (RDP) client, developed by Microsoft Corporation of Redmond, Wash. Also, the server 106 may run an application, which for example, may be an application server providing email services such as Microsoft Exchange manufactured by the Microsoft Corporation of Redmond, Wash., a web or Internet server, or a desktop sharing server, or a collaboration server. In some embodiments, any of the applications may comprise any type of hosted service or products, such as GoToMeeting™ provided by Citrix Online Division, Inc. of Santa Barbara, Calif., WebEx™ provided by WebEx, Inc. of Santa Clara, Calif., or Microsoft Office Live Meeting provided by Microsoft Corporation of Redmond, Wash.

Still referring to FIG. 1D, an embodiment of the network environment may include a monitoring server 106A. The monitoring server 106A may include any type and form performance monitoring service 198. The performance monitoring service 198 may include monitoring, measurement and/or management software and/or hardware, including data collection, aggregation, analysis, management and reporting. In one embodiment, the performance monitoring service 198 includes one or more monitoring agents 197. The monitoring agent 197 includes any software, hardware or combination thereof for performing monitoring, measurement and data collection activities on a device, such as a client 102, server 106 or an appliance 200, 205. In some embodiments, the monitoring agent 197 includes any type and form of script, such as Visual Basic script, or Javascript. In one embodiment, the monitoring agent 197 executes transparently to any application and/or user of the device. In some embodiments, the monitoring agent 197 is installed and operated unobtrusively to the application or client. In yet another embodiment, the monitoring agent 197 is installed and operated without any instrumentation for the application or device.

In some embodiments, the monitoring agent 197 monitors, measures and collects data on a predetermined frequency. In other embodiments, the monitoring agent 197 monitors, measures and collects data based upon detection of any type and form of event. For example, the monitoring agent 197 may collect data upon detection of a request for a web page or receipt of an HTTP response. In another example, the monitoring agent 197 may collect data upon detection of any user input events, such as a mouse click. The monitoring agent 197 may report or provide any monitored, measured or collected data to the monitoring service 198. In one embodiment, the monitoring agent 197 transmits information to the monitoring service 198 according to a schedule or a predetermined frequency. In another embodiment, the monitoring agent 197 transmits information to the monitoring service 198 upon detection of an event.

In some embodiments, the monitoring service 198 and/or monitoring agent 197 performs monitoring and performance measurement of any network resource or network infrastructure element, such as a client, server, server farm, appliance 200, appliance 205, or network connection. In one embodiment, the monitoring service 198 and/or monitoring agent 197 performs monitoring and performance measurement of any transport layer connection, such as a TCP or UDP connection. In another embodiment, the monitoring service 198 and/or monitoring agent 197 monitors and measures network latency. In yet one embodiment, the monitoring service 198 and/or monitoring agent 197 monitors and measures bandwidth utilization.

In other embodiments, the monitoring service 198 and/or monitoring agent 197 monitors and measures end-user response times. In some embodiments, the monitoring service 198 performs monitoring and performance measurement of an application. In another embodiment, the monitoring service 198 and/or monitoring agent 197 performs monitoring and performance measurement of any session or connection to the application. In one embodiment, the monitoring service 198 and/or monitoring agent 197 monitors and measures performance of a browser. In another embodiment, the monitoring service 198 and/or monitoring agent 197 monitors and measures performance of HTTP based transactions. In some embodiments, the monitoring service 198 and/or monitoring agent 197 monitors and measures performance of a Voice over IP (VoIP) application or session. In other embodiments, the monitoring service 198 and/or monitoring agent 197 monitors and measures performance of a remote display protocol application, such as an ICA client or RDP client. In yet another embodiment, the monitoring service 198 and/or monitoring agent 197 monitors and measures performance of any type and form of streaming media. In still a further embodiment, the monitoring service 198 and/or monitoring agent 197 monitors and measures performance of a hosted application or a Software-As-A-Service (SaaS) delivery model.

In some embodiments, the monitoring service 198 and/or monitoring agent 197 performs monitoring and performance measurement of one or more transactions, requests or responses related to application. In other embodiments, the monitoring service 198 and/or monitoring agent 197 monitors and measures any portion of an application layer stack, such as any .NET or J2EE calls. In one embodiment, the monitoring service 198 and/or monitoring agent 197 monitors and measures database or SQL transactions. In yet another embodiment, the monitoring service 198 and/or monitoring agent 197 monitors and measures any method, function or application programming interface (API) call.

In one embodiment, the monitoring service 198 and/or monitoring agent 197 performs monitoring and performance measurement of a delivery of application and/or data from a server to a client via one or more appliances, such as appliance 200 and/or appliance 205. In some embodiments, the monitoring service 198 and/or monitoring agent 197 monitors and measures performance of delivery of a virtualized application. In other embodiments, the monitoring service 198 and/or monitoring agent 197 monitors and measures performance of delivery of a streaming application. In another embodiment, the monitoring service 198 and/or monitoring agent 197 monitors and measures performance of delivery of a desktop application to a client and/or the execution of the desktop application on the client. In another embodiment, the monitoring service 198 and/or monitoring agent 197 monitors and measures performance of a client/server application.

In one embodiment, the monitoring service 198 and/or monitoring agent 197 is designed and constructed to provide application performance management for the application delivery system 190. For example, the monitoring service 198 and/or monitoring agent 197 may monitor, measure and manage the performance of the delivery of applications via the Citrix Presentation Server. In this example, the monitoring service 198 and/or monitoring agent 197 monitors individual ICA sessions. The monitoring service 198 and/or monitoring agent 197 may measure the total and per session system resource usage, as well as application and networking performance. The monitoring service 198 and/or monitoring agent 197 may identify the active servers for a given user and/or user session. In some embodiments, the monitoring service 198 and/or monitoring agent 197 monitors back-end connections between the application delivery system 190 and an application and/or database server. The monitoring service 198 and/or monitoring agent 197 may measure network latency, delay and volume per user-session or ICA session.

In some embodiments, the monitoring service 198 and/or monitoring agent 197 measures and monitors memory usage for the application delivery system 190, such as total memory usage, per user session and/or per process. In other embodiments, the monitoring service 198 and/or monitoring agent 197 measures and monitors CPU usage the application delivery system 190, such as total CPU usage, per user session and/or per process. In another embodiments, the monitoring service 198 and/or monitoring agent 197 measures and monitors the time required to log-in to an application, a server, or the application delivery system, such as Citrix Presentation Server. In one embodiment, the monitoring service 198 and/or monitoring agent 197 measures and monitors the duration a user is logged into an application, a server, or the application delivery system 190. In some embodiments, the monitoring service 198 and/or monitoring agent 197 measures and monitors active and inactive session counts for an application, server or application delivery system session. In yet another embodiment, the monitoring service 198 and/or monitoring agent 197 measures and monitors user session latency.

In yet further embodiments, the monitoring service 198 and/or monitoring agent 197 measures and monitors measures and monitors any type and form of server metrics. In one embodiment, the monitoring service 198 and/or monitoring agent 197 measures and monitors metrics related to system memory, CPU usage, and disk storage. In another embodiment, the monitoring service 198 and/or monitoring agent 197 measures and monitors metrics related to page faults, such as page faults per second. In other embodiments, the monitoring service 198 and/or monitoring agent 197 measures and monitors round-trip time metrics. In yet another embodiment, the monitoring service 198 and/or monitoring agent 197 measures and monitors metrics related to application crashes, errors and/or hangs.

In some embodiments, the monitoring service 198 and monitoring agent 198 includes any of the product embodiments referred to as EdgeSight manufactured by Citrix Systems, Inc. of Ft. Lauderdale, Fla. In another embodiment, the performance monitoring service 198 and/or monitoring agent 198 includes any portion of the product embodiments referred to as the TrueView product suite manufactured by the Symphoniq Corporation of Palo Alto, Calif. In one embodiment, the performance monitoring service 198 and/or monitoring agent 198 includes any portion of the product embodiments referred to as the TeaLeaf CX product suite manufactured by the TeaLeaf Technology Inc. of San Francisco, Calif. In other embodiments, the performance monitoring service 198 and/or monitoring agent 198 includes any portion of the business service management products, such as the BMC Performance Manager and Patrol products, manufactured by BMC Software, Inc. of Houston, Tex.

Figure 1E:
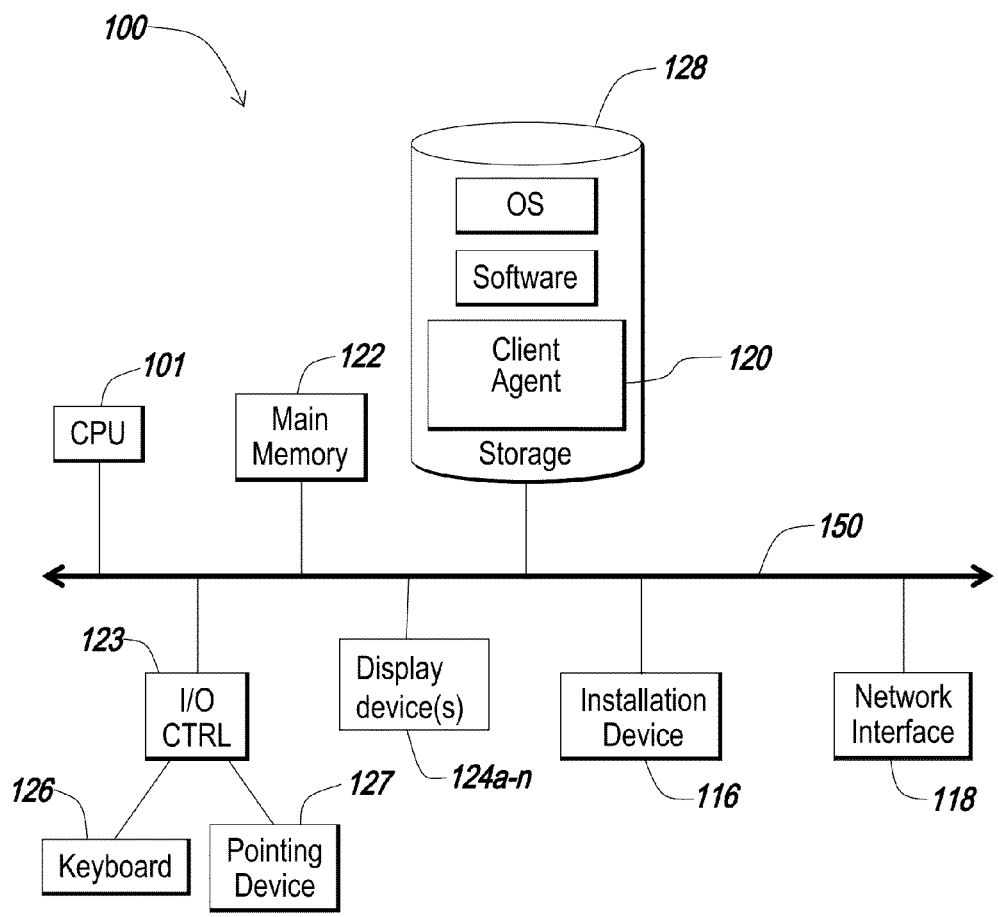
FIGS. 1E-1H are block diagrams of embodiments of a computing device.
Figure 1F:
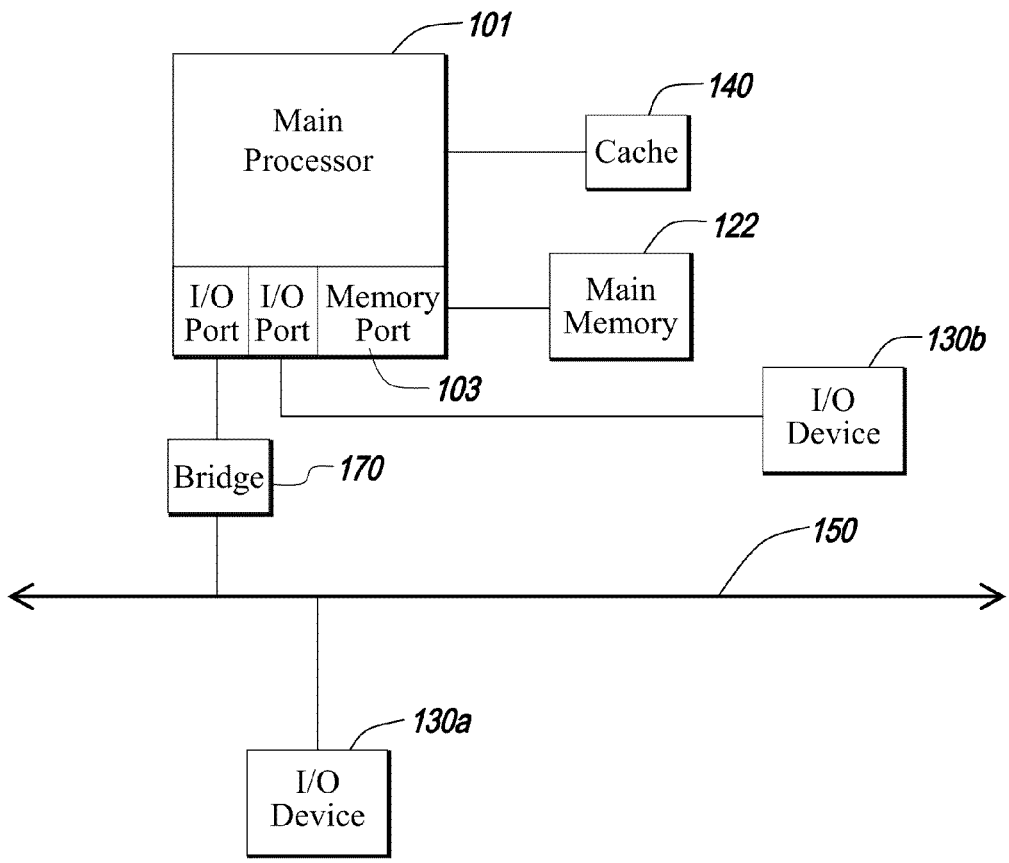

The client 102, server 106, and appliance 200 may be deployed as and/or executed on any type and form of computing device, such as a computer, network device or appliance capable of communicating on any type and form of network and performing the operations described herein. FIGS. 1E and 1F depict block diagrams of a computing device 100 useful for practicing an embodiment of the client 102, server 106 or appliance 200. As shown in FIGS. 1E and 1F, each computing device 100 includes a central processing unit 101, and a main memory unit 122. As shown in FIG. 1E, a computing device 100 may include a visual display device 124, a keyboard 126 and/or a pointing device 127, such as a mouse. Each computing device 100 may also include additional optional elements, such as one or more input/output devices 130a-130b (generally referred to using reference numeral 130), and a cache memory 140 in communication with the central processing unit 101.

The central processing unit 101 is any logic circuitry that responds to and processes instructions fetched from the main memory unit 122. In many embodiments, the central processing unit is provided by a microprocessor unit, such as: those manufactured by Intel Corporation of Mountain View, Calif.; those manufactured by Motorola Corporation of Schaumburg, Ill.; those manufactured by Transmeta Corporation of Santa Clara, Calif.; the RS/6000 processor, those manufactured by International Business Machines of White Plains, N.Y.; or those manufactured by Advanced Micro Devices of Sunnyvale, Calif. The computing device 100 may be based on any of these processors, or any other processor capable of operating as described herein.

Main memory unit 122 may be one or more memory chips capable of storing data and allowing any storage location to be directly accessed by the microprocessor 101, such as Static random access memory (SRAM), Burst SRAM or Synch-Burst SRAM (BSRAM), Dynamic random access memory (DRAM), Fast Page Mode DRAM (FPM DRAM), Enhanced DRAM (EDRAM), Extended Data Output RAM (EDO RAM), Extended Data Output DRAM (EDO DRAM), Burst Extended Data Output DRAM (BEDO DRAM), Enhanced DRAM (EDRAM), synchronous DRAM (SDRAM), JEDEC SRAM, PC 100 SDRAM, Double Data Rate SDRAM (DDR SDRAM), Enhanced SDRAM (ESDRAM), SyncLink DRAM (SLDRAM), Direct Rambus DRAM (DRDRAM), or Ferroelectric RAM (FRAM). The main memory 122 may be based on any of the above described memory chips, or any other available memory chips capable of operating as described herein. In the embodiment shown in FIG. 1E, the processor 101 communicates with main memory 122 via a system bus 150 (described in more detail below). FIG. 1F depicts an embodiment of a computing device 100 in which the processor communicates directly with main memory 122 via a memory port 103. For example, in FIG. 1F the main memory 122 may be DRDRAM.

FIG. 1F depicts an embodiment in which the main processor 101 communicates directly with cache memory 140 via a secondary bus, sometimes referred to as a backside bus. In other embodiments, the main processor 101 communicates with cache memory 140 using the system bus 150. Cache memory 140 typically has a faster response time than main memory 122 and is typically provided by SRAM, BSRAM, or EDRAM. In the embodiment shown in FIG. 1F, the processor 101 communicates with various I/O devices 130 via a local system bus 150. Various busses may be used to connect the central processing unit 101 to any of the I/O devices 130, including a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the processor 101 may use an Advanced Graphics Port (AGP) to communicate with the display 124. FIG. 1F depicts an embodiment of a computer 100 in which the main processor 101 communicates directly with I/O device 130b via HyperTransport, Rapid I/O, or InfiniBand. FIG. 1F also depicts an embodiment in which local busses and direct communication are mixed: the processor 101 communicates with I/O device 130b using a local interconnect bus while communicating with I/O device 130a directly.

The computing device 100 may support any suitable installation device 116, such as a floppy disk drive for receiving floppy disks such as 3.5-inch, 5.25-inch disks or ZIP disks, a CD-ROM drive, a CD-R/RW drive, a DVD-ROM drive, tape drives of various formats, USB device, hard-drive or any other device suitable for installing software and programs such as any client agent 120, or portion thereof. The computing device 100 may further comprise a storage device 128, such as one or more hard disk drives or redundant arrays of independent disks, for storing an operating system and other related software, and for storing application software programs such as any program related to the client agent 120. Optionally, any of the installation devices 116 could also be used as the storage device 128. Additionally, the operating system and the software can be run from a bootable medium, for example, a bootable CD, such as KNOPPIX®, a bootable CD for GNU/Linux that is available as a GNU/Linux distribution from knoppix.net.

Furthermore, the computing device 100 may include a network interface 118 to interface to a Local Area Network (LAN), Wide Area Network (WAN) or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. The network interface 118 may comprise a built-in network adapter, network interface card, PCMCIA network card, card bus network adapter, wireless network adapter, USB network adapter, modem or any other device suitable for interfacing the computing device 100 to any type of network capable of communication and performing the operations described herein. A wide variety of I/O devices 130a-130n may be present in the computing device 100. Input devices include keyboards, mice, trackpads, trackballs, microphones, and drawing tablets. Output devices include video displays, speakers, inkjet printers, laser printers, and dye-sublimation printers. The I/O devices 130 may be controlled by an I/O controller 123 as shown in FIG. 1E. The I/O controller may control one or more I/O devices such as a keyboard 126 and a pointing device 127, e.g., a mouse or optical pen. Furthermore, an I/O device may also provide storage 128 and/or an installation medium 116 for the computing device 100. In still other embodiments, the computing device 100 may provide USB connections to receive handheld USB storage devices such as the USB Flash Drive line of devices manufactured by Twintech Industry, Inc. of Los Alamitos, Calif.

In some embodiments, the computing device 100 may comprise or be connected to multiple display devices 124a-124n, which each may be of the same or different type and/or form. As such, any of the I/O devices 130a-130n and/or the I/O controller 123 may comprise any type and/or form of suitable hardware, software, or combination of hardware and software to support, enable or provide for the connection and use of multiple display devices 124a-124n by the computing device 100. For example, the computing device 100 may include any type and/or form of video adapter, video card, driver, and/or library to interface, communicate, connect or otherwise use the display devices 124a-124n. In one embodiment, a video adapter may comprise multiple connectors to interface to multiple display devices 124a-124n. In other embodiments, the computing device 100 may include multiple video adapters, with each video adapter connected to one or more of the display devices 124a-124n. In some embodiments, any portion of the operating system of the computing device 100 may be configured for using multiple displays 124a-124n. In other embodiments, one or more of the display devices 124a-124n may be provided by one or more other computing devices, such as computing devices 100a and 100b connected to the computing device 100, for example, via a network. These embodiments may include any type of software designed and constructed to use another computer's display device as a second display device 124a for the computing device 100. One ordinarily skilled in the art will recognize and appreciate the various ways and embodiments that a computing device 100 may be configured to have multiple display devices 124a-124n.

In further embodiments, an I/O device 130 may be a bridge 170 between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, or a Serial Attached small computer system interface bus.

A computing device 100 of the sort depicted in FIGS. 1E and 1F typically operate under the control of operating systems, which control scheduling of tasks and access to system resources. The computing device 100 can be running any operating system such as any of the versions of the Microsoft® Windows operating systems, the different releases of the Unix and Linux operating systems, any version of the Mac OS® for Macintosh computers, any embedded operating system, any real-time operating system, any open source operating system, any proprietary operating system, any operating systems for mobile computing devices, or any other operating system capable of running on the computing device and performing the operations described herein. Typical operating systems include: WINDOWS 3.x, WINDOWS 95, WINDOWS 98, WINDOWS 2000, WINDOWS NT 3.51, WINDOWS NT 4.0, WINDOWS CE, and WINDOWS XP, all of which are manufactured by Microsoft Corporation of Redmond, Wash.; MacOS, manufactured by Apple Computer of Cupertino, Calif.; OS/2, manufactured by International Business Machines of Armonk, N.Y.; and Linux, a freely-available operating system distributed by Caldera Corp. of Salt Lake City, Utah, or any type and/or form of a Unix operating system, among others.

In other embodiments, the computing device 100 may have different processors, operating systems, and input devices consistent with the device. For example, in one embodiment the computer 100 is a Treo 180, 270, 1060, 600 or 650 smart phone manufactured by Palm, Inc. In this embodiment, the Treo smart phone is operated under the control of the PalmOS operating system and includes a stylus input device as well as a five-way navigator device. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Figure 1G:
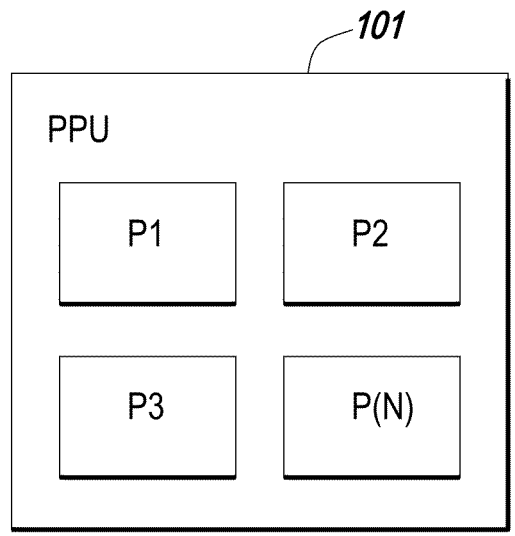

As shown in FIG. 1G, the computing device 100 may comprise multiple processors and may provide functionality for simultaneous execution of instructions or for simultaneous execution of one instruction on more than one piece of data. In some embodiments, the computing device 100 may comprise a parallel processor with one or more cores. In one of these embodiments, the computing device 100 is a shared memory parallel device, with multiple processors and/or multiple processor cores, accessing all available memory as a single global address space. In another of these embodiments, the computing device 100 is a distributed memory parallel device with multiple processors each accessing local memory only. In still another of these embodiments, the computing device 100 has both some memory which is shared and some memory which can only be accessed by particular processors or subsets of processors. In still even another of these embodiments, the computing device 100, such as a multi-core microprocessor, combines two or more independent processors into a single package, often a single integrated circuit (IC). In yet another of these embodiments, the computing device 100 includes a chip having a CELL BROADBAND ENGINE architecture and including a Power processor element and a plurality of synergistic processing elements, the Power processor element and the plurality of synergistic processing elements linked together by an internal high speed bus, which may be referred to as an element interconnect bus.

In some embodiments, the processors provide functionality for execution of a single instruction simultaneously on multiple pieces of data (SIMD). In other embodiments, the processors provide functionality for execution of multiple instructions simultaneously on multiple pieces of data (MIMD). In still other embodiments, the processor may use any combination of SIMD and MIMD cores in a single device.

Figure 1H:
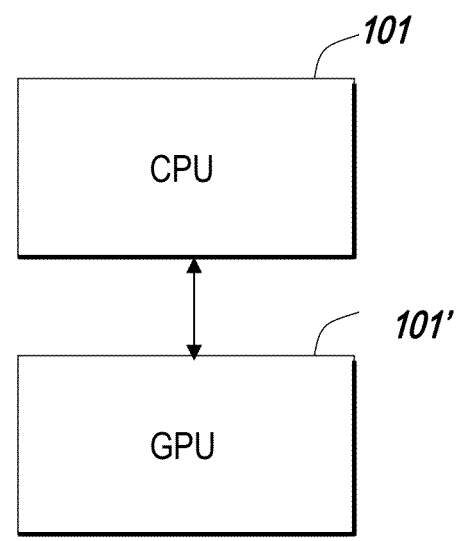

In some embodiments, the computing device 100 may comprise a graphics processing unit. In one of these embodiments, depicted in FIG. 1H, the computing device 100 includes at least one central processing unit 101 and at least one graphics processing unit. In another of these embodiments, the computing device 100 includes at least one parallel processing unit and at least one graphics processing unit. In still another of these embodiments, the computing device 100 includes a plurality of processing units of any type, one of the plurality of processing units comprising a graphics processing unit.

In some embodiments, a first computing device 100a executes an application on behalf of a user of a client computing device 100b. In other embodiments, a computing device 100a executes a virtual machine, which provides an execution session within which applications execute on behalf of a user or a client computing devices 100b. In one of these embodiments, the execution session is a hosted desktop session. In another of these embodiments, the computing device 100 executes a terminal services session. The terminal services session may provide a hosted desktop environment. In still another of these embodiments, the execution session provides access to a computing environment, which may comprise one or more of: an application, a plurality of applications, a desktop application, and a desktop session in which one or more applications may execute.

B. Appliance Architecture

Figure 2A:
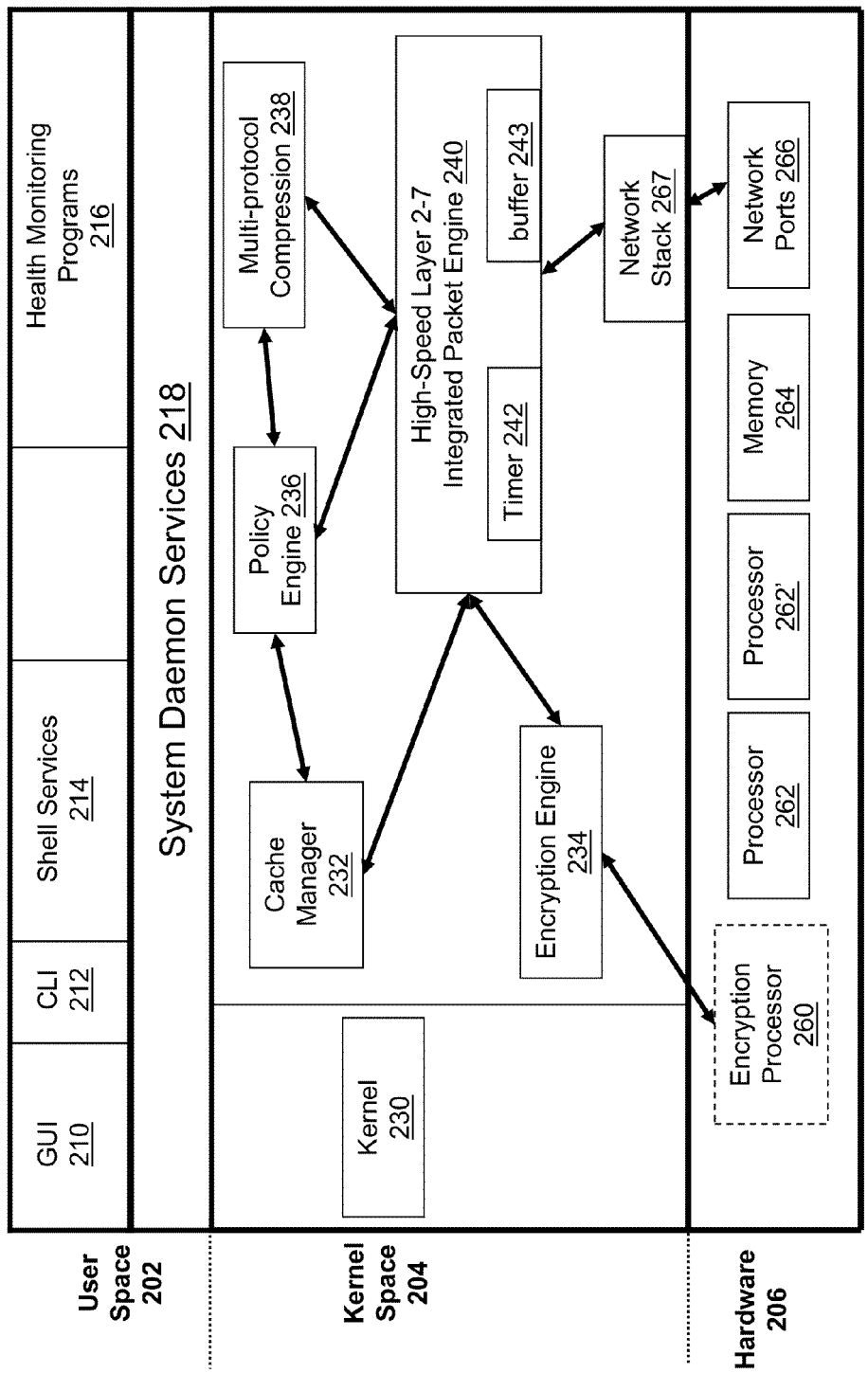
FIG. 2A is a block diagram of an embodiment of an appliance for processing communications between a client and a server.

FIG. 2A illustrates an example embodiment of the appliance 200. The architecture of the appliance 200 in FIG. 2A is provided by way of illustration only and is not intended to be limiting. As shown in FIG. 2, appliance 200 comprises a hardware layer 206 and a software layer divided into a user space 202 and a kernel space 204.

Hardware layer 206 provides the hardware elements upon which programs and services within kernel space 204 and user space 202 are executed. Hardware layer 206 also provides the structures and elements which allow programs and services within kernel space 204 and user space 202 to communicate data both internally and externally with respect to appliance 200. As shown in FIG. 2, the hardware layer 206 includes a processing unit 262 for executing software programs and services, a memory 264 for storing software and data, network ports 266 for transmitting and receiving data over a network, and an encryption processor 260 for performing functions related to Secure Sockets Layer processing of data transmitted and received over the network. In some embodiments, the central processing unit 262 may perform the functions of the encryption processor 260 in a single processor. Additionally, the hardware layer 206 may comprise multiple processors for each of the processing unit 262 and the encryption processor 260. The processor 262 may include any of the processors 101 described above in connection with FIGS. 1E and 1F. For example, in one embodiment, the appliance 200 comprises a first processor 262 and a second processor 262'. In other embodiments, the processor 262 or 262' comprises a multi-core processor.

Although the hardware layer 206 of appliance 200 is generally illustrated with an encryption processor 260, processor 260 may be a processor for performing functions related to any encryption protocol, such as the Secure Socket Layer (SSL) or Transport Layer Security (TLS) protocol. In some embodiments, the processor 260 may be a general purpose processor (GPP), and in further embodiments, may have executable instructions for performing processing of any security related protocol.

Although the hardware layer 206 of appliance 200 is illustrated with certain elements in FIG. 2, the hardware portions or components of appliance 200 may comprise any type and form of elements, hardware or software, of a computing device, such as the computing device 100 illustrated and discussed herein in conjunction with FIGS. 1E and 1F. In some embodiments, the appliance 200 may comprise a server, gateway, router, switch, bridge or other type of computing or network device, and have any hardware and/or software elements associated therewith.

The operating system of appliance 200 allocates, manages, or otherwise segregates the available system memory into kernel space 204 and user space 204. In example software architecture 200, the operating system may be any type and/or form of Unix operating system although the invention is not so limited. As such, the appliance 200 can be running any operating system such as any of the versions of the Microsoft® Windows operating systems, the different releases of the Unix and Linux operating systems, any version of the Mac OS® for Macintosh computers, any embedded operating system, any network operating system, any real-time operating system, any open source operating system, any proprietary operating system, any operating systems for mobile computing devices or network devices, or any other operating system capable of running on the appliance 200 and performing the operations described herein.

The kernel space 204 is reserved for running the kernel 230, including any device drivers, kernel extensions or other kernel related software. As known to those skilled in the art, the kernel 230 is the core of the operating system, and provides access, control, and management of resources and hardware-related elements of the application 104. In accordance with an embodiment of the appliance 200, the kernel space 204 also includes a number of network services or processes working in conjunction with a cache manager 232, sometimes also referred to as the integrated cache, the benefits of which are described in detail further herein. Additionally, the embodiment of the kernel 230 will depend on the embodiment of the operating system installed, configured, or otherwise used by the device 200.

In one embodiment, the device 200 comprises one network stack 267, such as a TCP/IP based stack, for communicating with the client 102 and/or the server 106. In one embodiment, the network stack 267 is used to communicate with a first network, such as network 108, and a second network 110. In some embodiments, the device 200 terminates a first transport layer connection, such as a TCP connection of a client 102, and establishes a second transport layer connection to a server 106 for use by the client 102, e.g., the second transport layer connection is terminated at the appliance 200 and the server 106. The first and second transport layer connections may be established via a single network stack 267. In other embodiments, the device 200 may comprise multiple network stacks, for example 267 and 267', and the first transport layer connection may be established or terminated at one network stack 267, and the second transport layer connection on the second network stack 267'. For example, one network stack may be for receiving and transmitting network packet on a first network, and another network stack for receiving and transmitting network packets on a second network. In one embodiment, the network stack 267 comprises a buffer 243 for queuing one or more network packets for transmission by the appliance 200.

As shown in FIG. 2, the kernel space 204 includes the cache manager 232, a high-speed layer 2-7 integrated packet engine 240, an encryption engine 234, a policy engine 236 and multi-protocol compression logic 238. Running these components or processes 232, 240, 234, 236 and 238 in kernel space 204 or kernel mode instead of the user space 202 improves the performance of each of these components, alone and in combination. Kernel operation means that these components or processes 232, 240, 234, 236 and 238 run in the core address space of the operating system of the device 200. For example, running the encryption engine 234 in kernel mode improves encryption performance by moving encryption and decryption operations to the kernel, thereby reducing the number of transitions between the memory space or a kernel thread in kernel mode and the memory space or a thread in user mode. For example, data obtained in kernel mode may not need to be passed or copied to a process or thread running in user mode, such as from a kernel level data structure to a user level data structure. In another aspect, the number of context switches between kernel mode and user mode are also reduced. Additionally, synchronization of and communications between any of the components or processes 232, 240, 235, 236 and 238 can be performed more efficiently in the kernel space 204.

In some embodiments, any portion of the components 232, 240, 234, 236 and 238 may run or operate in the kernel space 204, while other portions of these components 232, 240, 234, 236 and 238 may run or operate in user space 202. In one embodiment, the appliance 200 uses a kernel-level data structure providing access to any portion of one or more network packets, for example, a network packet comprising a request from a client 102 or a response from a server 106. In some embodiments, the kernel-level data structure may be obtained by the packet engine 240 via a transport layer driver interface or filter to the network stack 267. The kernel-level data structure may comprise any interface and/or data accessible via the kernel space 204 related to the network stack 267, network traffic or packets received or transmitted by the network stack 267. In other embodiments, the kernel-level data structure may be used by any of the components or processes 232, 240, 234, 236 and 238 to perform the desired operation of the component or process. In one embodiment, a component 232, 240, 234, 236 and 238 is running in kernel mode 204 when using the kernel-level data structure, while in another embodiment, the component 232, 240, 234, 236 and 238 is running in user mode when using the kernel-level data structure. In some embodiments, the kernel-level data structure may be copied or passed to a second kernel-level data structure, or any desired user-level data structure.

The cache manager 232 may comprise software, hardware or any combination of software and hardware to provide cache access, control and management of any type and form of content, such as objects or dynamically generated objects served by the originating servers 106. The data, objects or content processed and stored by the cache manager 232 may comprise data in any format, such as a markup language, or communicated via any protocol. In some embodiments, the cache manager 232 duplicates original data stored elsewhere or data previously computed, generated or transmitted, in which the original data may require longer access time to fetch, compute or otherwise obtain relative to reading a cache memory element. Once the data is stored in the cache memory element, future use can be made by accessing the cached copy rather than refetching or recomputing the original data, thereby reducing the access time. In some embodiments, the cache memory element may comprise a data object in memory 264 of device 200. In other embodiments, the cache memory element may comprise memory having a faster access time than memory 264. In another embodiment, the cache memory element may comprise any type and form of storage element of the device 200, such as a portion of a hard disk. In some embodiments, the processing unit 262 may provide cache memory for use by the cache manager 232. In yet further embodiments, the cache manager 232 may use any portion and combination of memory, storage, or the processing unit for caching data, objects, and other content.

Furthermore, the cache manager 232 includes any logic, functions, rules, or operations to perform any embodiments of the techniques of the appliance 200 described herein. For example, the cache manager 232 includes logic or functionality to invalidate objects based on the expiration of an invalidation time period or upon receipt of an invalidation command from a client 102 or server 106. In some embodiments, the cache manager 232 may operate as a program, service, process or task executing in the kernel space 204, and in other embodiments, in the user space 202. In one embodiment, a first portion of the cache manager 232 executes in the user space 202 while a second portion executes in the kernel space 204. In some embodiments, the cache manager 232 can comprise any type of general purpose processor (GPP), or any other type of integrated circuit, such as a Field Programmable Gate Array (FPGA), Programmable Logic Device (PLD), or Application Specific Integrated Circuit (ASIC).

The policy engine 236 may include, for example, an intelligent statistical engine or other programmable application(s). In one embodiment, the policy engine 236 provides a configuration mechanism to allow a user to identify, specify, define or configure a caching policy. Policy engine 236, in some embodiments, also has access to memory to support data structures such as lookup tables or hash tables to enable user-selected caching policy decisions. In other embodiments, the policy engine 236 may comprise any logic, rules, functions or operations to determine and provide access, control and management of objects, data or content being cached by the appliance 200 in addition to access, control and management of security, network traffic, network access, compression or any other function or operation performed by the appliance 200. Further examples of specific caching policies are further described herein.

The encryption engine 234 comprises any logic, business rules, functions or operations for handling the processing of any security related protocol, such as SSL or TLS, or any function related thereto. For example, the encryption engine 234 encrypts and decrypts network packets, or any portion thereof, communicated via the appliance 200. The encryption engine 234 may also setup or establish SSL or TLS connections on behalf of the client 102a-102n, server 106a-106n, or appliance 200. As such, the encryption engine 234 provides offloading and acceleration of SSL processing. In one embodiment, the encryption engine 234 uses a tunneling protocol to provide a virtual private network between a client 102a-102n and a server 106a-106n. In some embodiments, the encryption engine 234 is in communication with the Encryption processor 260. In other embodiments, the encryption engine 234 comprises executable instructions running on the Encryption processor 260.

The multi-protocol compression engine 238 comprises any logic, business rules, function or operations for compressing one or more protocols of a network packet, such as any of the protocols used by the network stack 267 of the device 200. In one embodiment, multi-protocol compression engine 238 compresses bi-directionally between clients 102a-102n and servers 106a-106n any TCP/IP based protocol, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In other embodiments, multi-protocol compression engine 238 provides compression of Hypertext Markup Language (HTML) based protocols and in some embodiments, provides compression of any markup languages, such as the Extensible Markup Language (XML). In one embodiment, the multi-protocol compression engine 238 provides compression of any high-performance protocol, such as any protocol designed for appliance 200 to appliance 200 communications. In another embodiment, the multi-protocol compression engine 238 compresses any payload of or any communication using a modified transport control protocol, such as Transaction TCP (T/TCP), TCP with selection acknowledgements (TCP-SACK), TCP with large windows (TCP-LW), a congestion prediction protocol such as the TCP-Vegas protocol, and a TCP spoofing protocol.

As such, the multi-protocol compression engine 238 accelerates performance for users accessing applications via desktop clients, e.g., Microsoft Outlook and non-Web thin clients, such as any client launched by popular enterprise applications like Oracle, SAP and Siebel, and even mobile clients, such as the Pocket PC. In some embodiments, the multi-protocol compression engine 238 by executing in the kernel mode 204 and integrating with packet processing engine 240 accessing the network stack 267 is able to compress any of the protocols carried by the TCP/IP protocol, such as any application layer protocol.

High speed layer 2-7 integrated packet engine 240, also generally referred to as a packet processing engine or packet engine, is responsible for managing the kernel-level processing of packets received and transmitted by appliance 200 via network ports 266. The high speed layer 2-7 integrated packet engine 240 may comprise a buffer for queuing one or more network packets during processing, such as for receipt of a network packet or transmission of a network packet. Additionally, the high speed layer 2-7 integrated packet engine 240 is in communication with one or more network stacks 267 to send and receive network packets via network ports 266. The high speed layer 2-7 integrated packet engine 240 works in conjunction with encryption engine 234, cache manager 232, policy engine 236 and multi-protocol compression logic 238. In particular, encryption engine 234 is configured to perform SSL processing of packets, policy engine 236 is configured to perform functions related to traffic management such as request-level content switching and request-level cache redirection, and multi-protocol compression logic 238 is configured to perform functions related to compression and decompression of data.

The high speed layer 2-7 integrated packet engine 240 includes a packet processing timer 242. In one embodiment, the packet processing timer 242 provides one or more time intervals to trigger the processing of incoming, i.e., received, or outgoing, i.e., transmitted, network packets. In some embodiments, the high speed layer 2-7 integrated packet engine 240 processes network packets responsive to the timer 242. The packet processing timer 242 provides any type and form of signal to the packet engine 240 to notify, trigger, or communicate a time related event, interval or occurrence. In many embodiments, the packet processing timer 242 operates in the order of milliseconds, such as for example 100 ms, 50 ms or 25 ms. For example, in some embodiments, the packet processing timer 242 provides time intervals or otherwise causes a network packet to be processed by the high speed layer 2-7 integrated packet engine 240 at a 10 ms time interval, while in other embodiments, at a 5 ms time interval, and still yet in further embodiments, as short as a 3, 2, or 1 ms time interval. The high speed layer 2-7 integrated packet engine 240 may be interfaced, integrated or in communication with the encryption engine 234, cache manager 232, policy engine 236 and multi-protocol compression engine 238 during operation. As such, any of the logic, functions, or operations of the encryption engine 234, cache manager 232, policy engine 236 and multi-protocol compression logic 238 may be performed responsive to the packet processing timer 242 and/or the packet engine 240. Therefore, any of the logic, functions, or operations of the encryption engine 234, cache manager 232, policy engine 236 and multi-protocol compression logic 238 may be performed at the granularity of time intervals provided via the packet processing timer 242, for example, at a time interval of less than or equal to 10 ms. For example, in one embodiment, the cache manager 232 may perform invalidation of any cached objects responsive to the high speed layer 2-7 integrated packet engine 240 and/or the packet processing timer 242. In another embodiment, the expiry or invalidation time of a cached object can be set to the same order of granularity as the time interval of the packet processing timer 242, such as at every 10 ms.

In contrast to kernel space 204, user space 202 is the memory area or portion of the operating system used by user mode applications or programs otherwise running in user mode. A user mode application may not access kernel space 204 directly and uses service calls in order to access kernel services. As shown in FIG. 2, user space 202 of appliance 200 includes a graphical user interface (GUI) 210, a command line interface (CLI) 212, shell services 214, health monitoring program 216, and daemon services 218. GUI 210 and CLI 212 provide a means by which a system administrator or other user can interact with and control the operation of appliance 200, such as via the operating system of the appliance 200. The GUI 210 or CLI 212 can comprise code running in user space 202 or kernel space 204. The GUI 210 may be any type and form of graphical user interface and may be presented via text, graphical or otherwise, by any type of program or application, such as a browser. The CLI 212 may be any type and form of command line or text-based interface, such as a command line provided by the operating system. For example, the CLI 212 may comprise a shell, which is a tool to enable users to interact with the operating system. In some embodiments, the CLI 212 may be provided via a bash, csh, tcsh, or ksh type shell. The shell services 214 comprises the programs, services, tasks, processes or executable instructions to support interaction with the appliance 200 or operating system by a user via the GUI 210 and/or CLI 212.

Health monitoring program 216 is used to monitor, check, report and ensure that network systems are functioning properly and that users are receiving requested content over a network. Health monitoring program 216 comprises one or more programs, services, tasks, processes or executable instructions to provide logic, rules, functions or operations for monitoring any activity of the appliance 200. In some embodiments, the health monitoring program 216 intercepts and inspects any network traffic passed via the appliance 200. In other embodiments, the health monitoring program 216 interfaces by any suitable means and/or mechanisms with one or more of the following: the encryption engine 234, cache manager 232, policy engine 236, multi-protocol compression logic 238, packet engine 240, daemon services 218, and shell services 214. As such, the health monitoring program 216 may call any application programming interface (API) to determine a state, status, or health of any portion of the appliance 200. For example, the health monitoring program 216 may ping or send a status inquiry on a periodic basis to check if a program, process, service or task is active and currently running. In another example, the health monitoring program 216 may check any status, error or history logs provided by any program, process, service or task to determine any condition, status or error with any portion of the appliance 200.

Daemon services 218 are programs that run continuously or in the background and handle periodic service requests received by appliance 200. In some embodiments, a daemon service may forward the requests to other programs or processes, such as another daemon service 218 as appropriate. As known to those skilled in the art, a daemon service 218 may run unattended to perform continuous or periodic system wide functions, such as network control, or to perform any desired task. In some embodiments, one or more daemon services 218 run in the user space 202, while in other embodiments, one or more daemon services 218 run in the kernel space.

Figure 2B:
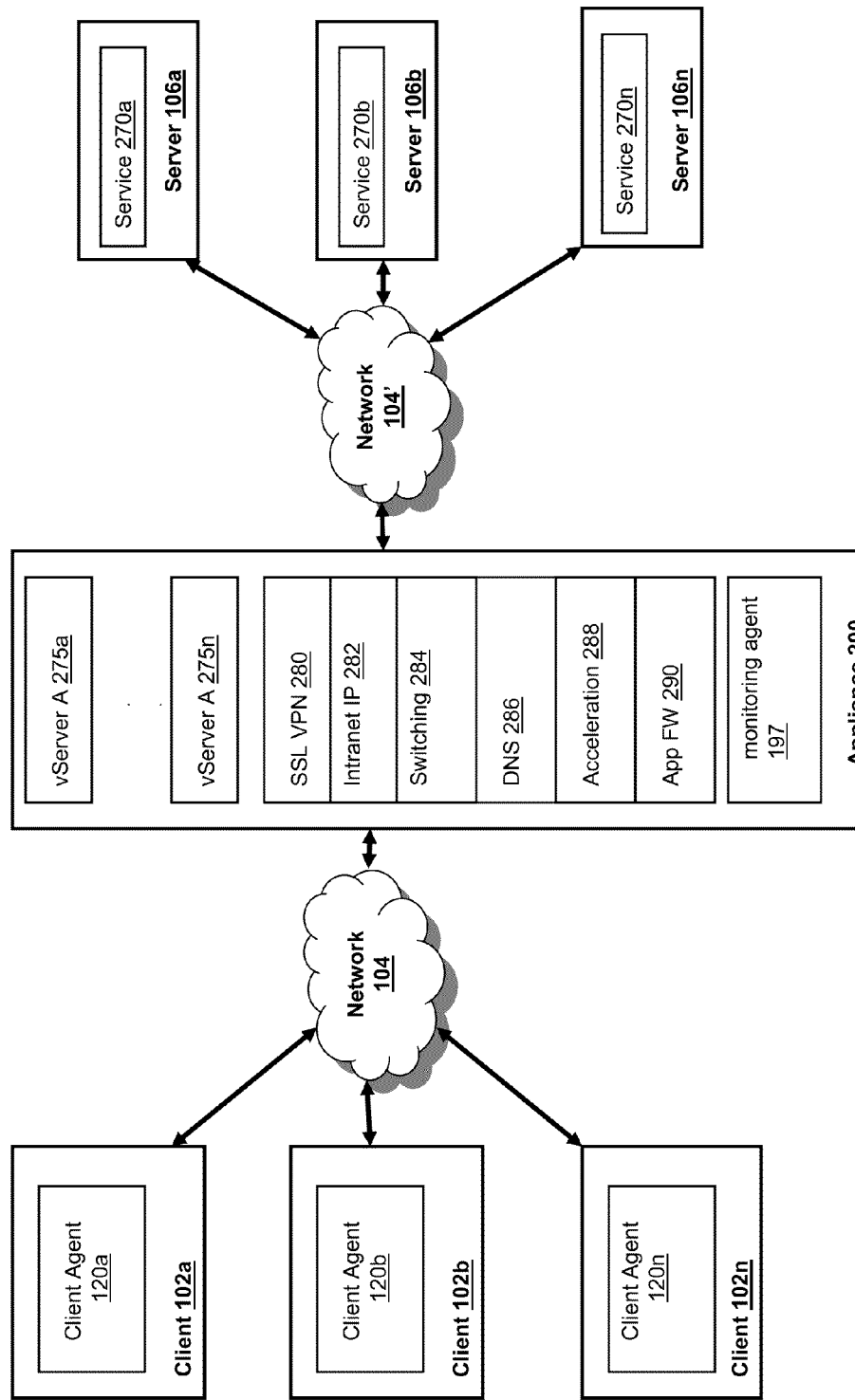
FIG. 2B is a block diagram of another embodiment of an appliance for optimizing, accelerating, load-balancing and routing communications between a client and a server.

Referring now to FIG. 2B, another embodiment of the appliance 200 is depicted. In brief overview, the appliance 200 provides one or more of the following services, functionality or operations: SSL VPN connectivity 280, switching/load balancing 284, Domain Name Service resolution 286, acceleration 288 and an application firewall 290 for communications between one or more clients 102 and one or more servers 106. Each of the servers 106 may provide one or more network related services 270a-270n (referred to as services 270). For example, a server 106 may provide an http service 270. The appliance 200 comprises one or more virtual servers or virtual internet protocol servers, referred to as a vServer, VIP server, or just VIP 275a-275n (also referred herein as vServer 275). The vServer 275 receives, intercepts or otherwise processes communications between a client 102 and a server 106 in accordance with the configuration and operations of the appliance 200.

The vServer 275 may comprise software, hardware or any combination of software and hardware. The vServer 275 may comprise any type and form of program, service, task, process or executable instructions operating in user mode 202, kernel mode 204 or any combination thereof in the appliance 200. The vServer 275 includes any logic, functions, rules, or operations to perform any embodiments of the techniques described herein, such as SSL VPN 280, switching/load balancing 284, Domain Name Service resolution 286, acceleration 288 and an application firewall 290. In some embodiments, the vServer 275 establishes a connection to a service 270 of a server 106. The service 275 may comprise any program, application, process, task or set of executable instructions capable of connecting to and communicating to the appliance 200, client 102 or vServer 275. For example, the service 275 may comprise a web server, http server, ftp, email or database server. In some embodiments, the service 270 is a daemon process or network driver for listening, receiving and/or sending communications for an application, such as email, database or an enterprise application. In some embodiments, the service 270 may communicate on a specific IP address, or IP address and port.

In some embodiments, the vServer 275 applies one or more policies of the policy engine 236 to network communications between the client 102 and server 106. In one embodiment, the policies are associated with a vServer 275. In another embodiment, the policies are based on a user, or a group of users. In yet another embodiment, a policy is global and applies to one or more vServers 275a-275n, and any user or group of users communicating via the appliance 200. In some embodiments, the policies of the policy engine have conditions upon which the policy is applied based on any content of the communication, such as internet protocol address, port, protocol type, header or fields in a packet, or the context of the communication, such as user, group of the user, vServer 275, transport layer connection, and/or identification or attributes of the client 102 or server 106.

In other embodiments, the appliance 200 communicates or interfaces with the policy engine 236 to determine authentication and/or authorization of a remote user or a remote client 102 to access the computing environment 15, application, and/or data file from a server 106. In another embodiment, the appliance 200 communicates or interfaces with the policy engine 236 to determine authentication and/or authorization of a remote user or a remote client 102 to have the application delivery system 190 deliver one or more of the computing environment 15, application, and/or data file. In yet another embodiment, the appliance 200 establishes a VPN or SSL VPN connection based on the policy engine's 236 authentication and/or authorization of a remote user or a remote client 102 In one embodiment, the appliance 200 controls the flow of network traffic and communication sessions based on policies of the policy engine 236. For example, the appliance 200 may control the access to a computing environment 15, application or data file based on the policy engine 236.

In some embodiments, the vServer 275 establishes a transport layer connection, such as a TCP or UDP connection with a client 102 via the client agent 120. In one embodiment, the vServer 275 listens for and receives communications from the client 102. In other embodiments, the vServer 275 establishes a transport layer connection, such as a TCP or UDP connection with a client server 106. In one embodiment, the vServer 275 establishes the transport layer connection to an internet protocol address and port of a server 270 running on the server 106. In another embodiment, the vServer 275 associates a first transport layer connection to a client 102 with a second transport layer connection to the server 106. In some embodiments, a vServer 275 establishes a pool of transport layer connections to a server 106 and multiplexes client requests via the pooled transport layer connections.

In some embodiments, the appliance 200 provides a SSL VPN connection 280 between a client 102 and a server 106. For example, a client 102 on a first network 102 requests to establish a connection to a server 106 on a second network 104'. In some embodiments, the second network 104' is not routable from the first network 104. In other embodiments, the client 102 is on a public network 104 and the server 106 is on a private network 104', such as a corporate network. In one embodiment, the client agent 120 intercepts communications of the client 102 on the first network 104, encrypts the communications, and transmits the communications via a first transport layer connection to the appliance 200. The appliance 200 associates the first transport layer connection on the first network 104 to a second transport layer connection to the server 106 on the second network 104. The appliance 200 receives the intercepted communication from the client agent 102, decrypts the communications, and transmits the communication to the server 106 on the second network 104 via the second transport layer connection. The second transport layer connection may be a pooled transport layer connection. As such, the appliance 200 provides an end-to-end secure transport layer connection for the client 102 between the two networks 104, 104'.

In one embodiment, the appliance 200 hosts an intranet internet protocol or IntranetIP 282 address of the client 102 on the virtual private network 104. The client 102 has a local network identifier, such as an internet protocol (IP) address and/or host name on the first network 104. When connected to the second network 104' via the appliance 200, the appliance 200 establishes, assigns or otherwise provides an IntranetIP address 282, which is a network identifier, such as IP address and/or host name, for the client 102 on the second network 104'. The appliance 200 listens for and receives on the second or private network 104' for any communications directed towards the client 102 using the client's established IntranetIP 282. In one embodiment, the appliance 200 acts as or on behalf of the client 102 on the second private network 104. For example, in another embodiment, a vServer 275 listens for and responds to communications to the IntranetIP 282 of the client 102. In some embodiments, if a computing device 100 on the second network 104' transmits a request, the appliance 200 processes the request as if it were the client 102. For example, the appliance 200 may respond to a ping to the client's IntranetIP 282. In another example, the appliance may establish a connection, such as a TCP or UDP connection, with computing device 100 on the second network 104 requesting a connection with the client's IntranetIP 282.

In some embodiments, the appliance 200 provides one or more of the following acceleration techniques 288 to communications between the client 102 and server 106: 1) compression; 2) decompression; 3) Transmission Control Protocol pooling; 4) Transmission Control Protocol multiplexing; 5) Transmission Control Protocol buffering; and 6) caching. In one embodiment, the appliance 200 relieves servers 106 of much of the processing load caused by repeatedly opening and closing transport layers connections to clients 102 by opening one or more transport layer connections with each server 106 and maintaining these connections to allow repeated data accesses by clients via the Internet. This technique is referred to herein as "connection pooling".

In some embodiments, in order to seamlessly splice communications from a client 102 to a server 106 via a pooled transport layer connection, the appliance 200 translates or multiplexes communications by modifying sequence number and acknowledgment numbers at the transport layer protocol level. This is referred to as "connection multiplexing". In some embodiments, no application layer protocol interaction is required. For example, in the case of an in-bound packet (that is, a packet received from a client 102), the source network address of the packet is changed to that of an output port of appliance 200, and the destination network address is changed to that of the intended server. In the case of an outbound packet (that is, one received from a server 106), the source network address is changed from that of the server 106 to that of an output port of appliance 200 and the destination address is changed from that of appliance 200 to that of the requesting client 102. The sequence numbers and acknowledgment numbers of the packet are also translated to sequence numbers and acknowledgement numbers expected by the client 102 on the appliance's 200 transport layer connection to the client 102. In some embodiments, the packet checksum of the transport layer protocol is recalculated to account for these translations.

In another embodiment, the appliance 200 provides switching or load-balancing functionality 284 for communications between the client 102 and server 106. In some embodiments, the appliance 200 distributes traffic and directs client requests to a server 106 based on layer 4 or application-layer request data. In one embodiment, although the network layer or layer 2 of the network packet identifies a destination server 106, the appliance 200 determines the server 106 to distribute the network packet by application information and data carried as payload of the transport layer packet. In one embodiment, the health monitoring programs 216 of the appliance 200 monitor the health of servers to determine the server 106 for which to distribute a client's request. In some embodiments, if the appliance 200 detects a server 106 is not available or has a load over a predetermined threshold, the appliance 200 can direct or distribute client requests to another server 106.

In some embodiments, the appliance 200 acts as a Domain Name Service (DNS) resolver or otherwise provides resolution of a DNS request from clients 102. In some embodiments, the appliance intercepts a DNS request transmitted by the client 102. In one embodiment, the appliance 200 responds to a client's DNS request with an IP address of or hosted by the appliance 200. In this embodiment, the client 102 transmits network communication for the domain name to the appliance 200. In another embodiment, the appliance 200 responds to a client's DNS request with an IP address of or hosted by a second appliance 200'. In some embodiments, the appliance 200 responds to a client's DNS request with an IP address of a server 106 determined by the appliance 200.

In yet another embodiment, the appliance 200 provides application firewall functionality 290 for communications between the client 102 and server 106. In one embodiment, the policy engine 236 provides rules for detecting and blocking illegitimate requests. In some embodiments, the application firewall 290 protects against denial of service (DoS) attacks. In other embodiments, the appliance inspects the content of intercepted requests to identify and block application-based attacks. In some embodiments, the rules/policy engine 236 comprises one or more application firewall or security control policies for providing protections against various classes and types of web or Internet based vulnerabilities, such as one or more of the following: 1) buffer overflow, 2) CGI-BIN parameter manipulation, 3) form/hidden field manipulation, 4) forceful browsing, 5) cookie or session poisoning, 6) broken access control list (ACLs) or weak passwords, 7) cross-site scripting (XSS), 8) command injection, 9) SQL injection, 10) error triggering sensitive information leak, 11) insecure use of cryptography, 12) server misconfiguration, 13) back doors and debug options, 14) website defacement, 15) platform or operating systems vulnerabilities, and 16) zero-day exploits. In an embodiment, the application firewall 290 provides HTML form field protection in the form of inspecting or analyzing the network communication for one or more of the following: 1) required fields are returned, 2) no added field allowed, 3) read-only and hidden field enforcement, 4) drop-down list and radio button field conformance, and 5) form-field max-length enforcement. In some embodiments, the application firewall 290 ensures cookies are not modified. In other embodiments, the application firewall 290 protects against forceful browsing by enforcing legal URLs.

In still yet other embodiments, the application firewall 290 protects any confidential information contained in the network communication. The application firewall 290 may inspect or analyze any network communication in accordance with the rules or polices of the engine 236 to identify any confidential information in any field of the network packet. In some embodiments, the application firewall 290 identifies in the network communication one or more occurrences of a credit card number, password, social security number, name, patient code, contact information, and age. The encoded portion of the network communication may comprise these occurrences or the confidential information. Based on these occurrences, in one embodiment, the application firewall 290 may take a policy action on the network communication, such as prevent transmission of the network communication. In another embodiment, the application firewall 290 may rewrite, remove or otherwise mask such identified occurrence or confidential information.

Still referring to FIG. 2B, the appliance 200 may include a performance monitoring agent 197 as discussed above in conjunction with FIG. 1D. In one embodiment, the appliance 200 receives the monitoring agent 197 from the monitoring service 198 or monitoring server 106 as depicted in FIG. 1D. In some embodiments, the appliance 200 stores the monitoring agent 197 in storage, such as disk, for delivery to any client or server in communication with the appliance 200. For example, in one embodiment, the appliance 200 transmits the monitoring agent 197 to a client upon receiving a request to establish a transport layer connection. In other embodiments, the appliance 200 transmits the monitoring agent 197 upon establishing the transport layer connection with the client 102. In another embodiment, the appliance 200 transmits the monitoring agent 197 to the client upon intercepting or detecting a request for a web page. In yet another embodiment, the appliance 200 transmits the monitoring agent 197 to a client or a server in response to a request from the monitoring server 198. In one embodiment, the appliance 200 transmits the monitoring agent 197 to a second appliance 200' or appliance 205.

In other embodiments, the appliance 200 executes the monitoring agent 197. In one embodiment, the monitoring agent 197 measures and monitors the performance of any application, program, process, service, task or thread executing on the appliance 200. For example, the monitoring agent 197 may monitor and measure performance and operation of vServers 275A-275N. In another embodiment, the monitoring agent 197 measures and monitors the performance of any transport layer connections of the appliance 200. In some embodiments, the monitoring agent 197 measures and monitors the performance of any user sessions traversing the appliance 200. In one embodiment, the monitoring agent 197 measures and monitors the performance of any virtual private network connections and/or sessions traversing the appliance 200, such an SSL VPN session. In still further embodiments, the monitoring agent 197 measures and monitors the memory, CPU and disk usage and performance of the appliance 200. In yet another embodiment, the monitoring agent 197 measures and monitors the performance of any acceleration technique 288 performed by the appliance 200, such as SSL offloading, connection pooling and multiplexing, caching, and compression. In some embodiments, the monitoring agent 197 measures and monitors the performance of any load balancing and/or content switching 284 performed by the appliance 200. In other embodiments, the monitoring agent 197 measures and monitors the performance of application firewall 290 protection and processing performed by the appliance 200.

C. Client Agent

Figure 3:
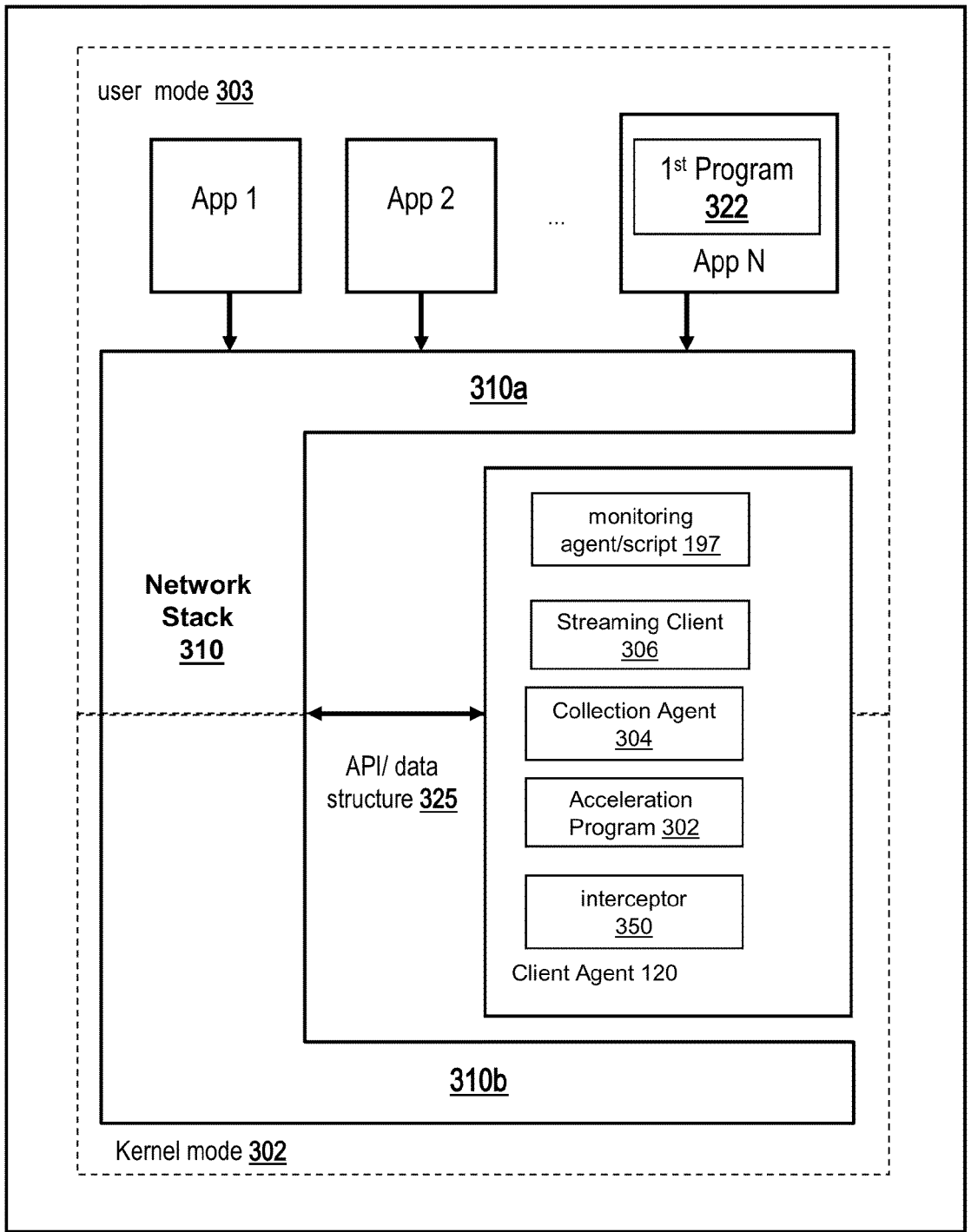
FIG. 3 is a block diagram of an embodiment of a client for communicating with a server via the appliance.

Referring now to FIG. 3, an embodiment of the client agent 120 is depicted. The client 102 includes a client agent 120 for establishing and exchanging communications with the appliance 200 and/or server 106 via a network 104. In brief overview, the client 102 operates on computing device 100 having an operating system with a kernel mode 302 and a user mode 303, and a network stack 310 with one or more layers 310a-310b. The client 102 may have installed and/or execute one or more applications. In some embodiments, one or more applications may communicate via the network stack 310 to a network 104. One of the applications, such as a web browser, may also include a first program 322. For example, the first program 322 may be used in some embodiments to install and/or execute the client agent 120, or any portion thereof. The client agent 120 includes an interception mechanism, or interceptor 350, for intercepting network communications from the network stack 310 from the one or more applications.

The network stack 310 of the client 102 may comprise any type and form of software, or hardware, or any combinations thereof, for providing connectivity to and communications with a network. In one embodiment, the network stack 310 comprises a software implementation for a network protocol suite. The network stack 310 may comprise one or more network layers, such as any networks layers of the Open Systems Interconnection (OSI) communications model as those skilled in the art recognize and appreciate. As such, the network stack 310 may comprise any type and form of protocols for any of the following layers of the OSI model: 1) physical link layer, 2) data link layer, 3) network layer, 4) transport layer, 5) session layer, 6) presentation layer, and 7) application layer. In one embodiment, the network stack 310 may comprise a transport control protocol (TCP) over the network layer protocol of the internet protocol (IP), generally referred to as TCP/IP. In some embodiments, the TCP/IP protocol may be carried over the Ethernet protocol, which may comprise any of the family of IEEE wide-area-network (WAN) or local-area-network (LAN) protocols, such as those protocols covered by the IEEE 802.3. In some embodiments, the network stack 310 comprises any type and form of a wireless protocol, such as IEEE 802.11 and/or mobile internet protocol.

In view of a TCP/IP based network, any TCP/IP based protocol may be used, including Messaging Application Programming Interface (MAPI) (email), File Transfer Protocol (FTP), HyperText Transfer Protocol (HTTP), Common Internet File System (CIFS) protocol (file transfer), Independent Computing Architecture (ICA) protocol, Remote Desktop Protocol (RDP), Wireless Application Protocol (WAP), Mobile IP protocol, and Voice Over IP (VoIP) protocol. In another embodiment, the network stack 310 comprises any type and form of transport control protocol, such as a modified transport control protocol, for example a Transaction TCP (T/TCP), TCP with selection acknowledgements (TCP-SACK), TCP with large windows (TCP-LW), a congestion prediction protocol such as the TCP-Vegas protocol, and a TCP spoofing protocol. In other embodiments, any type and form of user datagram protocol (UDP), such as UDP over IP, may be used by the network stack 310, such as for voice communications or real-time data communications.

Furthermore, the network stack 310 may include one or more network drivers supporting the one or more layers, such as a TCP driver or a network layer driver. The network drivers may be included as part of the operating system of the computing device 100 or as part of any network interface cards or other network access components of the computing device 100. In some embodiments, any of the network drivers of the network stack 310 may be customized, modified or adapted to provide a custom or modified portion of the network stack 310 in support of any of the techniques described herein. In other embodiments, the acceleration program 302 is designed and constructed to operate with or work in conjunction with the network stack 310 installed or otherwise provided by the operating system of the client 102.

The network stack 310 comprises any type and form of interfaces for receiving, obtaining, providing or otherwise accessing any information and data related to network communications of the client 102. In one embodiment, an interface to the network stack 310 comprises an application programming interface (API). The interface may also comprise any function call, hooking or filtering mechanism, event or call back mechanism, or any type of interfacing technique. The network stack 310 via the interface may receive or provide any type and form of data structure, such as an object, related to functionality or operation of the network stack 310. For example, the data structure may comprise information and data related to a network packet or one or more network packets. In some embodiments, the data structure comprises a portion of the network packet processed at a protocol layer of the network stack 310, such as a network packet of the transport layer. In some embodiments, the data structure 325 comprises a kernel-level data structure, while in other embodiments, the data structure 325 comprises a user-mode data structure. A kernel-level data structure may comprise a data structure obtained or related to a portion of the network stack 310 operating in kernel-mode 302, or a network driver or other software running in kernel-mode 302, or any data structure obtained or received by a service, process, task, thread or other executable instructions running or operating in kernel-mode of the operating system.

Additionally, some portions of the network stack 310 may execute or operate in kernel-mode 302, for example, the data link or network layer, while other portions execute or operate in user-mode 303, such as an application layer of the network stack 310. For example, a first portion 310a of the network stack may provide user-mode access to the network stack 310 to an application while a second portion 310a of the network stack 310 provides access to a network. In some embodiments, a first portion 310a of the network stack may comprise one or more upper layers of the network stack 310, such as any of layers 5-7. In other embodiments, a second portion 310b of the network stack 310 comprises one or more lower layers, such as any of layers 1-4. Each of the first portion 310a and second portion 310b of the network stack 310 may comprise any portion of the network stack 310, at any one or more network layers, in user-mode 203, kernel-mode, 202, or combinations thereof, or at any portion of a network layer or interface point to a network layer or any portion of or interface point to the user-mode 203 and kernel-mode 203.

The interceptor 350 may comprise software, hardware, or any combination of software and hardware. In one embodiment, the interceptor 350 intercept a network communication at any point in the network stack 310, and redirects or transmits the network communication to a destination desired, managed or controlled by the interceptor 350 or client agent 120. For example, the interceptor 350 may intercept a network communication of a network stack 310 of a first network and transmit the network communication to the appliance 200 for transmission on a second network 104. In some embodiments, the interceptor 350 comprises any type interceptor 350 comprises a driver, such as a network driver constructed and designed to interface and work with the network stack 310. In some embodiments, the client agent 120 and/or interceptor 350 operates at one or more layers of the network stack 310, such as at the transport layer. In one embodiment, the interceptor 350 comprises a filter driver, hooking mechanism, or any form and type of suitable network driver interface that interfaces to the transport layer of the network stack, such as via the transport driver interface (TDI). In some embodiments, the interceptor 350 interfaces to a first protocol layer, such as the transport layer and another protocol layer, such as any layer above the transport protocol layer, for example, an application protocol layer. In one embodiment, the interceptor 350 may comprise a driver complying with the Network Driver Interface Specification (NDIS), or a NDIS driver. In another embodiment, the interceptor 350 may comprise a mini-filter or a mini-port driver. In one embodiment, the interceptor 350, or portion thereof, operates in kernel-mode 202. In another embodiment, the interceptor 350, or portion thereof, operates in user-mode 203. In some embodiments, a portion of the interceptor 350 operates in kernel-mode 202 while another portion of the interceptor 350 operates in user-mode 203. In other embodiments, the client agent 120 operates in user-mode 203 but interfaces via the interceptor 350 to a kernel-mode driver, process, service, task or portion of the operating system, such as to obtain a kernel-level data structure 225. In further embodiments, the interceptor 350 is a user-mode application or program, such as application.

In one embodiment, the interceptor 350 intercepts any transport layer connection requests. In these embodiments, the interceptor 350 execute transport layer application programming interface (API) calls to set the destination information, such as destination IP address and/or port to a desired location for the location. In this manner, the interceptor 350 intercepts and redirects the transport layer connection to a IP address and port controlled or managed by the interceptor 350 or client agent 120. In one embodiment, the interceptor 350 sets the destination information for the connection to a local IP address and port of the client 102 on which the client agent 120 is listening. For example, the client agent 120 may comprise a proxy service listening on a local IP address and port for redirected transport layer communications. In some embodiments, the client agent 120 then communicates the redirected transport layer communication to the appliance 200.

In some embodiments, the interceptor 350 intercepts a Domain Name Service (DNS) request. In one embodiment, the client agent 120 and/or interceptor 350 resolves the DNS request. In another embodiment, the interceptor transmits the intercepted DNS request to the appliance 200 for DNS resolution. In one embodiment, the appliance 200 resolves the DNS request and communicates the DNS response to the client agent 120. In some embodiments, the appliance 200 resolves the DNS request via another appliance 200' or a DNS server 106.

In yet another embodiment, the client agent 120 may comprise two agents 120 and 120'. In one embodiment, a first agent 120 may comprise an interceptor 350 operating at the network layer of the network stack 310. In some embodiments, the first agent 120 intercepts network layer requests such as Internet Control Message Protocol (ICMP) requests (e.g., ping and traceroute). In other embodiments, the second agent 120' may operate at the transport layer and intercept transport layer communications. In some embodiments, the first agent 120 intercepts communications at one layer of the network stack 210 and interfaces with or communicates the intercepted communication to the second agent 120'.

The client agent 120 and/or interceptor 350 may operate at or interface with a protocol layer in a manner transparent to any other protocol layer of the network stack 310. For example, in one embodiment, the interceptor 350 operates or interfaces with the transport layer of the network stack 310 transparently to any protocol layer below the transport layer, such as the network layer, and any protocol layer above the transport layer, such as the session, presentation or application layer protocols. This allows the other protocol layers of the network stack 310 to operate as desired and without modification for using the interceptor 350. As such, the client agent 120 and/or interceptor 350 can interface with the transport layer to secure, optimize, accelerate, route or load-balance any communications provided via any protocol carried by the transport layer, such as any application layer protocol over TCP/IP.

Furthermore, the client agent 120 and/or interceptor may operate at or interface with the network stack 310 in a manner transparent to any application, a user of the client 102, and any other computing device, such as a server, in communications with the client 102. The client agent 120 and/or interceptor 350 may be installed and/or executed on the client 102 in a manner without modification of an application. In some embodiments, the user of the client 102 or a computing device in communications with the client 102 are not aware of the existence, execution or operation of the client agent 120 and/or interceptor 350. As such, in some embodiments, the client agent 120 and/or interceptor 350 is installed, executed, and/or operated transparently to an application, user of the client 102, another computing device, such as a server, or any of the protocol layers above and/or below the protocol layer interfaced to by the interceptor 350.

The client agent 120 includes an acceleration program 302, a streaming client 306, a collection agent 304, and/or monitoring agent 197. In one embodiment, the client agent 120 comprises an Independent Computing Architecture (ICA) client, or any portion thereof, developed by Citrix Systems, Inc. of Fort Lauderdale, Fla., and is also referred to as an ICA client. In some embodiments, the client 120 comprises an application streaming client 306 for streaming an application from a server 106 to a client 102. In some embodiments, the client agent 120 comprises an acceleration program 302 for accelerating communications between client 102 and server 106. In another embodiment, the client agent 120 includes a collection agent 304 for performing end-point detection/scanning and collecting end-point information for the appliance 200 and/or server 106.

In some embodiments, the acceleration program 302 comprises a client-side acceleration program for performing one or more acceleration techniques to accelerate, enhance or otherwise improve a client's communications with and/or access to a server 106, such as accessing an application provided by a server 106. The logic, functions, and/or operations of the executable instructions of the acceleration program 302 may perform one or more of the following acceleration techniques: 1) multi-protocol compression, 2) transport control protocol pooling, 3) transport control protocol multiplexing, 4) transport control protocol buffering, and 5) caching via a cache manager. Additionally, the acceleration program 302 may perform encryption and/or decryption of any communications received and/or transmitted by the client 102. In some embodiments, the acceleration program 302 performs one or more of the acceleration techniques in an integrated manner or fashion. Additionally, the acceleration program 302 can perform compression on any of the protocols, or multiple-protocols, carried as a payload of a network packet of the transport layer protocol.

The streaming client 306 comprises an application, program, process, service, task or executable instructions for receiving and executing a streamed application from a server 106. A server 106 may stream one or more application data files to the streaming client 306 for playing, executing or otherwise causing to be executed the application on the client 102. In some embodiments, the server 106 transmits a set of compressed or packaged application data files to the streaming client 306. In some embodiments, the plurality of application files are compressed and stored on a file server within an archive file such as a CAB, ZIP, SIT, TAR, JAR or other archive. In one embodiment, the server 106 decompresses, unpackages or unarchives the application files and transmits the files to the client 102. In another embodiment, the client 102 decompresses, unpackages or unarchives the application files. The streaming client 306 dynamically installs the application, or portion thereof, and executes the application. In one embodiment, the streaming client 306 may be an executable program. In some embodiments, the streaming client 306 may be able to launch another executable program.

The collection agent 304 comprises an application, program, process, service, task or executable instructions for identifying, obtaining and/or collecting information about the client 102. In some embodiments, the appliance 200 transmits the collection agent 304 to the client 102 or client agent 120. The collection agent 304 may be configured according to one or more policies of the policy engine 236 of the appliance. In other embodiments, the collection agent 304 transmits collected information on the client 102 to the appliance 200. In one embodiment, the policy engine 236 of the appliance 200 uses the collected information to determine and provide access, authentication and authorization control of the client's connection to a network 104.

In one embodiment, the collection agent 304 comprises an end-point detection and scanning mechanism, which identifies and determines one or more attributes or characteristics of the client. For example, the collection agent 304 may identify and determine any one or more of the following client-side attributes: 1) the operating system an/or a version of an operating system, 2) a service pack of the operating system, 3) a running service, 4) a running process, and 5) a file. The collection agent 304 may also identify and determine the presence or versions of any one or more of the following on the client: 1) antivirus software, 2) personal firewall software, 3) anti-spam software, and 4) internet security software. The policy engine 236 may have one or more policies based on any one or more of the attributes or characteristics of the client or client-side attributes.

In some embodiments, the client agent 120 includes a monitoring agent 197 as discussed in conjunction with FIGS. 1D and 2B. The monitoring agent 197 may be any type and form of script, such as Visual Basic or Java script. In one embodiment, the monitoring agent 197 monitors and measures performance of any portion of the client agent 120. For example, in some embodiments, the monitoring agent 197 monitors and measures performance of the acceleration program 302. In another embodiment, the monitoring agent 197 monitors and measures performance of the streaming client 306. In other embodiments, the monitoring agent 197 monitors and measures performance of the collection agent 304. In still another embodiment, the monitoring agent 197 monitors and measures performance of the interceptor 350. In some embodiments, the monitoring agent 197 monitors and measures any resource of the client 102, such as memory, CPU and disk.

The monitoring agent 197 may monitor and measure performance of any application of the client. In one embodiment, the monitoring agent 197 monitors and measures performance of a browser on the client 102. In some embodiments, the monitoring agent 197 monitors and measures performance of any application delivered via the client agent 120. In other embodiments, the monitoring agent 197 measures and monitors end user response times for an application, such as web-based or HTTP response times. The monitoring agent 197 may monitor and measure performance of an ICA or RDP client. In another embodiment, the monitoring agent 197 measures and monitors metrics for a user session or application session. In some embodiments, monitoring agent 197 measures and monitors an ICA or RDP session. In one embodiment, the monitoring agent 197 measures and monitors the performance of the appliance 200 in accelerating delivery of an application and/or data to the client 102.

In some embodiments and still referring to FIG. 3, a first program 322 may be used to install and/or execute the client agent 120, or portion thereof, such as the interceptor 350, automatically, silently, transparently, or otherwise. In one embodiment, the first program 322 comprises a plugin component, such an ActiveX control or Java control or script that is loaded into and executed by an application. For example, the first program comprises an ActiveX control loaded and run by a web browser application, such as in the memory space or context of the application. In another embodiment, the first program 322 comprises a set of executable instructions loaded into and run by the application, such as a browser. In one embodiment, the first program 322 comprises a designed and constructed program to install the client agent 120. In some embodiments, the first program 322 obtains, downloads, or receives the client agent 120 via the network from another computing device. In another embodiment, the first program 322 is an installer program or a plug and play manager for installing programs, such as network drivers, on the operating system of the client 102.

Figure 4A:
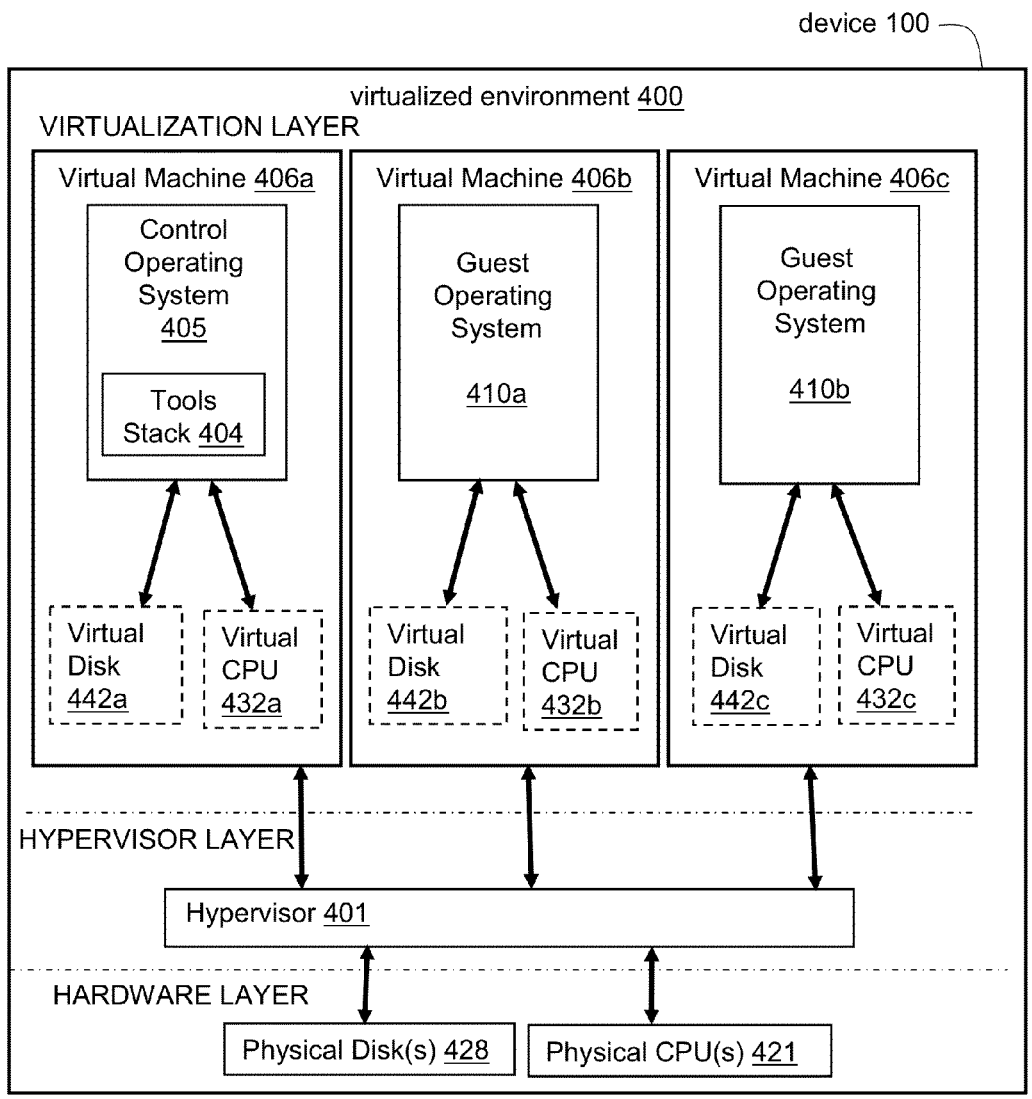
FIG. 4A is a block diagram of an embodiment of a virtualization environment.

D. Systems and Methods for Providing Virtualized Application Delivery Controller Referring now to FIG. 4A, a block diagram depicts one embodiment of a virtualization environment 400. In brief overview, a computing device 100 includes a hypervisor layer, a virtualization layer, and a hardware layer. The hypervisor layer includes a hypervisor 401 (also referred to as a virtualization manager) that allocates and manages access to a number of physical resources in the hardware layer (e.g., the processor(s) 421, and disk(s) 428) by at least one virtual machine executing in the virtualization layer. The virtualization layer includes at least one operating system 410 and a plurality of virtual resources allocated to the at least one operating system 410. Virtual resources may include, without limitation, a plurality of virtual processors 432a, 432b, 432c (generally 432), and virtual disks 442a, 442b, 442c (generally 442), as well as virtual resources such as virtual memory and virtual network interfaces. The plurality of virtual resources and the operating system 410 may be referred to as a virtual machine 406. A virtual machine 406 may include a control operating system 405 in communication with the hypervisor 401 and used to execute applications for managing and configuring other virtual machines on the computing device 100.

In greater detail, a hypervisor 401 may provide virtual resources to an operating system in any manner which simulates the operating system having access to a physical device. A hypervisor 401 may provide virtual resources to any number of guest operating systems 410a, 410b (generally 410). In some embodiments, a computing device 100 executes one or more types of hypervisors. In these embodiments, hypervisors may be used to emulate virtual hardware, partition physical hardware, virtualize physical hardware, and execute virtual machines that provide access to computing environments. Hypervisors may include those manufactured by VMWare, Inc., of Palo Alto, Calif.; the XEN hypervisor, an open source product whose development is overseen by the open source Xen.org community; HyperV, VirtualServer or virtual PC hypervisors provided by Microsoft, or others. In some embodiments, a computing device 100 executing a hypervisor that creates a virtual machine platform on which guest operating systems may execute is referred to as a host server. In one of these embodiments, for example, the computing device 100 is a XEN SERVER provided by Citrix Systems, Inc., of Fort Lauderdale, Fla.

In some embodiments, a hypervisor 401 executes within an operating system executing on a computing device. In one of these embodiments, a computing device executing an operating system and a hypervisor 401 may be said to have a host operating system (the operating system executing on the computing device), and a guest operating system (an operating system executing within a computing resource partition provided by the hypervisor 401). In other embodiments, a hypervisor 401 interacts directly with hardware on a computing device, instead of executing on a host operating system. In one of these embodiments, the hypervisor 401 may be said to be executing on "bare metal," referring to the hardware comprising the computing device.

In some embodiments, a hypervisor 401 may create a virtual machine 406a-c (generally 406) in which an operating system 410 executes. In one of these embodiments, for example, the hypervisor 401 loads a virtual machine image to create a virtual machine 406. In another of these embodiments, the hypervisor 401 executes an operating system 410 within the virtual machine 406. In still another of these embodiments, the virtual machine 406 executes an operating system 410.

In some embodiments, the hypervisor 401 controls processor scheduling and memory partitioning for a virtual machine 406 executing on the computing device 100. In one of these embodiments, the hypervisor 401 controls the execution of at least one virtual machine 406. In another of these embodiments, the hypervisor 401 presents at least one virtual machine 406 with an abstraction of at least one hardware resource provided by the computing device 100. In other embodiments, the hypervisor 401 controls whether and how physical processor capabilities are presented to the virtual machine 406.

A control operating system 405 may execute at least one application for managing and configuring the guest operating systems. In one embodiment, the control operating system 405 may execute an administrative application, such as an application including a user interface providing administrators with access to functionality for managing the execution of a virtual machine, including functionality for executing a virtual machine, terminating an execution of a virtual machine, or identifying a type of physical resource for allocation to the virtual machine. In another embodiment, the hypervisor 401 executes the control operating system 405 within a virtual machine 406 created by the hypervisor 401. In still another embodiment, the control operating system 405 executes in a virtual machine 406 that is authorized to directly access physical resources on the computing device 100. In some embodiments, a control operating system 405a on a computing device 100a may exchange data with a control operating system 405b on a computing device 100b, via communications between a hypervisor 401a and a hypervisor 401b. In this way, one or more computing devices 100 may exchange data with one or more of the other computing devices 100 regarding processors and other physical resources available in a pool of resources. In one of these embodiments, this functionality allows a hypervisor to manage a pool of resources distributed across a plurality of physical computing devices. In another of these embodiments, multiple hypervisors manage one or more of the guest operating systems executed on one of the computing devices 100.

In one embodiment, the control operating system 405 executes in a virtual machine 406 that is authorized to interact with at least one guest operating system 410. In another embodiment, a guest operating system 410 communicates with the control operating system 405 via the hypervisor 401 in order to request access to a disk or a network. In still another embodiment, the guest operating system 410 and the control operating system 405 may communicate via a communication channel established by the hypervisor 401, such as, for example, via a plurality of shared memory pages made available by the hypervisor 401.

In some embodiments, the control operating system 405 includes a network back-end driver for communicating directly with networking hardware provided by the computing device 100. In one of these embodiments, the network back-end driver processes at least one virtual machine request from at least one guest operating system 110. In other embodiments, the control operating system 405 includes a block back-end driver for communicating with a storage element on the computing device 100. In one of these embodiments, the block back-end driver reads and writes data from the storage element based upon at least one request received from a guest operating system 410.

In one embodiment, the control operating system 405 includes a tools stack 404. In another embodiment, a tools stack 404 provides functionality for interacting with the hypervisor 401, communicating with other control operating systems 405 (for example, on a second computing device 100*b*), or managing virtual machines 406*b*, 406*c* on the computing device 100. In another embodiment, the tools stack 404 includes customized applications for providing improved management functionality to an administrator of a virtual machine farm. In some embodiments, at least one of the tools stack 404 and the control operating system 405 include a management API that provides an interface for remotely configuring and controlling virtual machines 406 running on a computing device 100. In other embodiments, the control operating system 405 communicates with the hypervisor 401 through the tools stack 404.

In one embodiment, the hypervisor 401 executes a guest operating system 410 within a virtual machine 406 created by the hypervisor 401. In another embodiment, the guest operating system 410 provides a user of the computing device 100 with access to resources within a computing environment. In still another embodiment, a resource includes a program, an application, a document, a file, a plurality of applications, a plurality of files, an executable program file, a desktop environment, a computing environment, or other resource made available to a user of the computing device 100. In yet another embodiment, the resource may be delivered to the computing device 100 via a plurality of access methods including, but not limited to, conventional installation directly on the computing device 100, delivery to the computing device 100 via a method for application streaming, delivery to the computing device 100 of output data generated by an execution of the resource on a second computing device 100' and communicated to the computing device 100 via a presentation layer protocol, delivery to the computing device 100 of output data generated by an execution of the resource via a virtual machine executing on a second computing device 100', or execution from a removable storage device connected to the computing device 100, such as a USB device, or via a virtual machine executing on the computing device 100 and generating output data. In some embodiments, the computing device 100 transmits output data generated by the execution of the resource to another computing device 100'.

In one embodiment, the guest operating system 410, in conjunction with the virtual machine on which it executes, forms a fully-virtualized virtual machine which is not aware that it is a virtual machine; such a machine may be referred to as a "Domain U HVM (Hardware Virtual Machine) virtual machine". In another embodiment, a fully-virtualized machine includes software emulating a Basic Input/Output System (BIOS) in order to execute an operating system within the fully-virtualized machine. In still another embodiment, a fully-virtualized machine may include a driver that provides functionality by communicating with the hypervisor 401. In such an embodiment, the driver may be aware that it executes within a virtualized environment. In another embodiment, the guest operating system 410, in conjunction with the virtual machine on which it executes, forms a paravirtualized virtual machine, which is aware that it is a virtual machine; such a machine may be referred to as a "Domain U PV virtual machine". In another embodiment, a paravirtualized machine includes additional drivers that a fully-virtualized machine does not include. In still another embodiment, the paravirtualized machine includes the network back-end driver and the block back-end driver included in a control operating system 405, as described above.

Figure 4B:
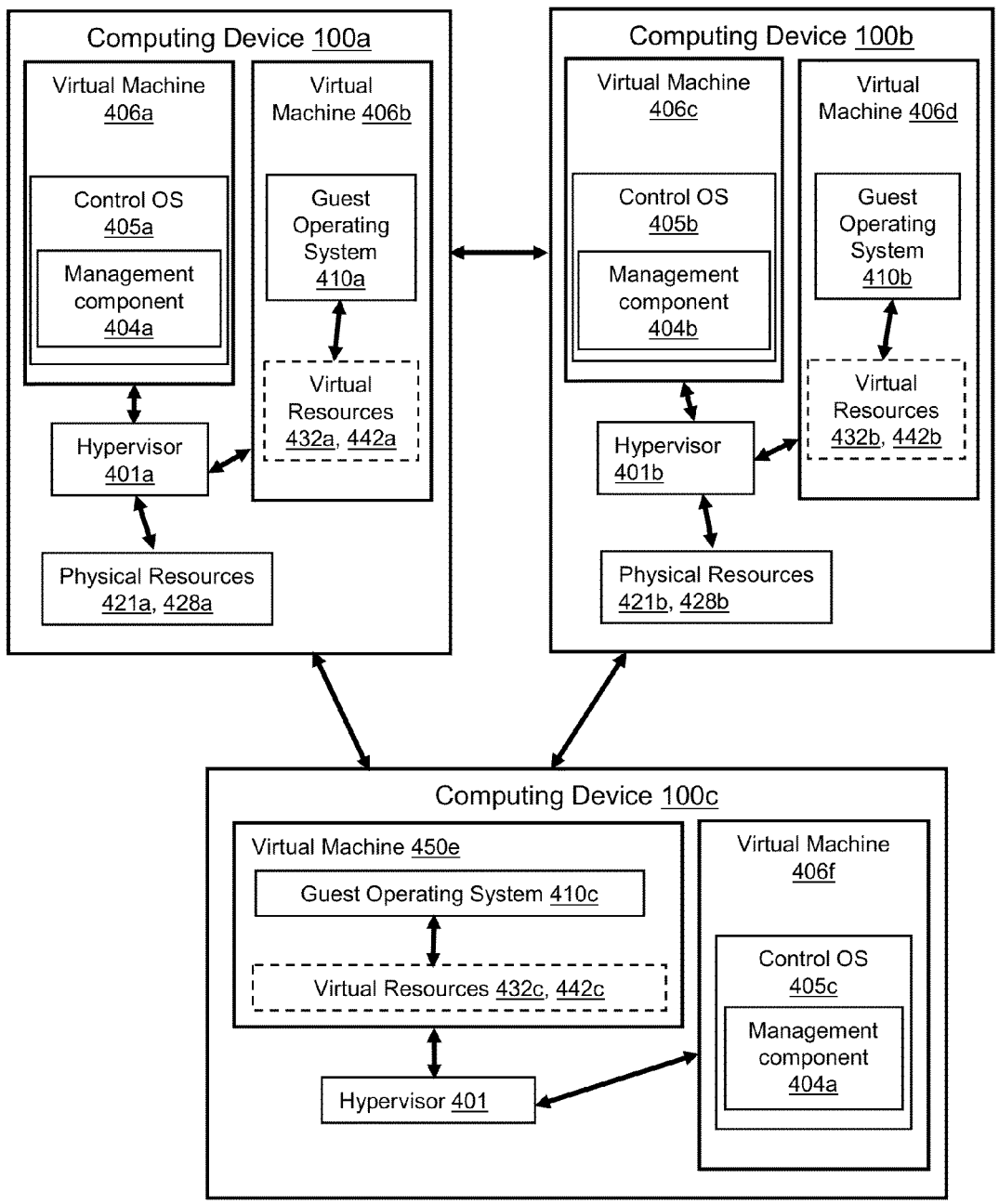
FIG. 4B is a block diagram of another embodiment of a virtualization environment.

Referring now to FIG. 4B, a block diagram depicts one embodiment of a plurality of networked computing devices in a system in which at least one physical host executes a virtual machine. In brief overview, the system includes a management component 404 and a hypervisor 401. The system includes a plurality of computing devices 100, a plurality of virtual machines 406, a plurality of hypervisors 401, a plurality of management components referred to variously as tools stacks 404 or management components 404, and a physical resource 421, 428. The plurality of physical machines 100 may each be provided as computing devices 100, described above in connection with FIGS. 1E-1H and 4A.

In greater detail, a physical disk 428 is provided by a computing device 100 and stores at least a portion of a virtual disk 442. In some embodiments, a virtual disk 442 is associated with a plurality of physical disks 428. In one of these embodiments, one or more computing devices 100 may exchange data with one or more of the other computing devices 100 regarding processors and other physical resources available in a pool of resources, allowing a hypervisor to manage a pool of resources distributed across a plurality of physical computing devices. In some embodiments, a computing device 100 on which a virtual machine 406 executes is referred to as a physical host 100 or as a host machine 100.

The hypervisor executes on a processor on the computing device 100. The hypervisor allocates, to a virtual disk, an amount of access to the physical disk. In one embodiment, the hypervisor 401 allocates an amount of space on the physical disk. In another embodiment, the hypervisor 401 allocates a plurality of pages on the physical disk. In some embodiments, the hypervisor provisions the virtual disk 442 as part of a process of initializing and executing a virtual machine 450.

In one embodiment, the management component 404*a* is referred to as a pool management component 404*a*. In another embodiment, a management operating system 405*a*, which may be referred to as a control operating system 405*a*, includes the management component. In some embodiments, the management component is referred to as a tools stack. In one of these embodiments, the management component is the tools stack 404 described above in connection with FIG. 4A. In other embodiments, the management component 404 provides a user interface for receiving, from a user such as an administrator, an identification of a virtual machine 406 to provision and/or execute. In still other embodiments, the management component 404 provides a user interface for receiving, from a user such as an administrator, the request for migration of a virtual machine 406*b* from one physical machine 100 to another. In further embodiments, the management component 404*a* identifies a computing device 100*b* on which to execute a requested virtual machine 406*d* and instructs the hypervisor 401*b* on the identified computing device 100*b* to execute the identified virtual machine; such a management component may be referred to as a pool management component.

Figure 4C:
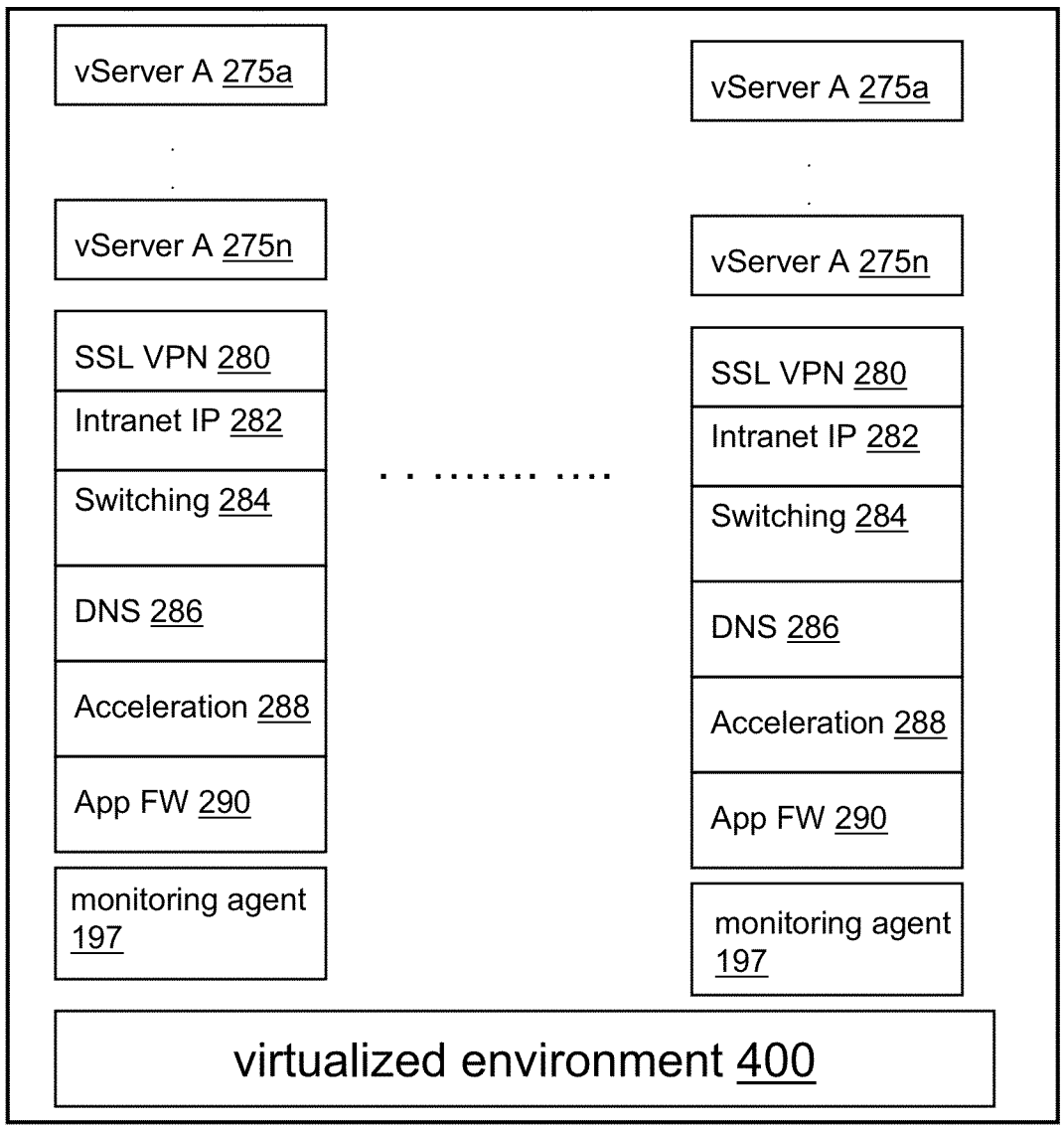
FIG. 4C is a block diagram of an embodiment of a virtualized appliance.

Referring now to FIG. 4C, embodiments of a virtual application delivery controller or virtual appliance 450 are depicted. In brief overview, any of the functionality and/or embodiments of the appliance 200 (e.g., an application delivery controller) described above in connection with FIGS. 2A and 2B may be deployed in any embodiment of the virtualized environment described above in connection with FIGS. 4A and 4B. Instead of the functionality of the application delivery controller being deployed in the form of an appliance 200, such functionality may be deployed in a virtualized environment 400 on any computing device 100, such as a client 102, server 106 or appliance 200.

Referring now to FIG. 4C, a diagram of an embodiment of a virtual appliance 450 operating on a hypervisor 401 of a server 106 is depicted. As with the appliance 200 of FIGS. 2A and 2B, the virtual appliance 450 may provide functionality for availability, performance, offload and security. For availability, the virtual appliance may perform load balancing between layers 4 and 7 of the network and may also perform intelligent service health monitoring. For performance increases via network traffic acceleration, the virtual appliance may perform caching and compression. To offload processing of any servers, the virtual appliance may perform connection multiplexing and pooling and/or SSL processing. For security, the virtual appliance may perform any of the application firewall functionality and SSL VPN function of appliance 200.

Any of the modules of the appliance 200 as described in connection with FIG. 2A may be packaged, combined, designed or constructed in a form of the virtualized appliance delivery controller 450 deployable as one or more software modules or components executable in a virtualized environment 300 or non-virtualized environment on any server, such as an off the shelf server. For example, the virtual appliance may be provided in the form of an installation package to install on a computing device. With reference to FIG. 2A, any of the cache manager 232, policy engine 236, compression 238, encryption engine 234, packet engine 240, GUI 210, CLI 212, shell services 214 and health monitoring programs 216 may be designed and constructed as a software component or module to run on any operating system of a computing device and/or of a virtualized environment 300. Instead of using the encryption processor 260, processor 262, memory 264 and network stack 267 of the appliance 200, the virtualized appliance 400 may use any of these resources as provided by the virtualized environment 400 or as otherwise available on the server 106.

Still referring to FIG. 4C, and in brief overview, any one or more vServers 275A-275N may be in operation or executed in a virtualized environment 400 of any type of computing device 100, such as any server 106. Any of the modules or functionality of the appliance 200 described in connection with FIG. 2B may be designed and constructed to operate in either a virtualized or non-virtualized environment of a server. Any of the vServer 275, SSL VPN 280, Intranet UP 282, Switching 284, DNS 286, acceleration 288, App FW 280 and monitoring agent may be packaged, combined, designed or constructed in a form of application delivery controller 450 deployable as one or more software modules or components executable on a device and/or virtualized environment 400.

In some embodiments, a server may execute multiple virtual machines 406a-406n in the virtualization environment with each virtual machine running the same or different embodiments of the virtual application delivery controller 450. In some embodiments, the server may execute one or more virtual appliances 450 on one or more virtual machines on a core of a multi-core processing system. In some embodiments, the server may execute one or more virtual appliances 450 on one or more virtual machines on each processor of a multiple processor device.

E. Systems and Methods for Providing A Multi-Core Architecture

In accordance with Moore's Law, the number of transistors that may be placed on an integrated circuit may double approximately every two years. However, CPU speed increases may reach plateaus, for example CPU speed has been around 3.5-4 GHz range since 2005. In some cases, CPU manufacturers may not rely on CPU speed increases to gain additional performance. Some CPU manufacturers may add additional cores to their processors to provide additional performance. Products, such as those of software and networking vendors, that rely on CPUs for performance gains may improve their performance by leveraging these multi-core CPUs. The software designed and constructed for a single CPU may be redesigned and/or rewritten to take advantage of a multi-threaded, parallel architecture or otherwise a multi-core architecture.

A multi-core architecture of the appliance 200, referred to as nCore or multi-core technology, allows the appliance in some embodiments to break the single core performance barrier and to leverage the power of multi-core CPUs. In the previous architecture described in connection with FIG. 2A, a single network or packet engine is run. The multiple cores of the nCore technology and architecture allow multiple packet engines to run concurrently and/or in parallel. With a packet engine running on each core, the appliance architecture leverages the processing capacity of additional cores. In some embodiments, this provides up to a 7× increase in performance and scalability.

Figure 5A:
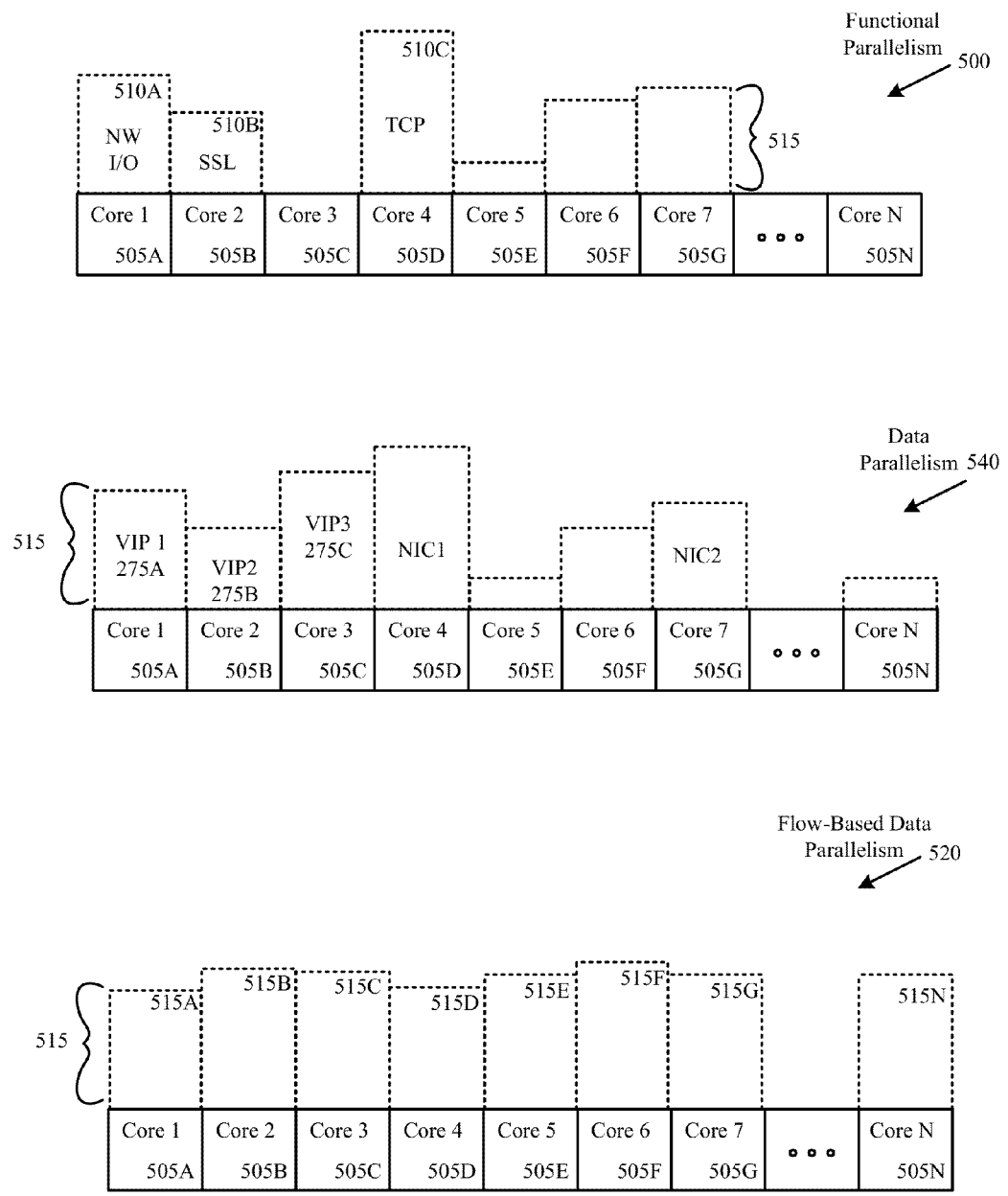
FIG. 5A are block diagrams of embodiments of approaches to implementing parallelism in a multi-core system.

Illustrated in FIG. 5A are some embodiments of work, task, load or network traffic distribution across one or more processor cores according to a type of parallelism or parallel computing scheme, such as functional parallelism, data parallelism or flow-based data parallelism. In brief overview, FIG. 5A illustrates embodiments of a multi-core system such as an appliance 200' with n-cores, a total of cores numbers 1 through N. In one embodiment, work, load or network traffic can be distributed among a first core 505A, a second core 505B, a third core 505C, a fourth core 505D, a fifth core 505E, a sixth core 505F, a seventh core 505G, and so on such that distribution is across all or two or more of the n cores 505N (hereinafter referred to collectively as cores 505.) There may be multiple VIPs 275 each running on a respective core of the plurality of cores. There may be multiple packet engines 240 each running on a respective core of the plurality of cores. Any of the approaches used may lead to different, varying or similar work load or performance level 515 across any of the cores. For a functional parallelism approach, each core may run a different function of the functionalities provided by the packet engine, a VIP 275 or appliance 200. In a data parallelism approach, data may be paralleled or distributed across the cores based on the Network Interface Card (NIC) or VIP 275 receiving the data. In another data parallelism approach, processing may be distributed across the cores by distributing data flows to each core.

In further detail to FIG. 5A, in some embodiments, load, work or network traffic can be distributed among cores 505 according to functional parallelism 500. Functional parallelism may be based on each core performing one or more respective functions. In some embodiments, a first core may perform a first function while a second core performs a second function. In functional parallelism approach, the functions to be performed by the multi-core system are divided and distributed to each core according to functionality. In some embodiments, functional parallelism may be referred to as task parallelism and may be achieved when each processor or core executes a different process or function on the same or different data. The core or processor may execute the same or different code. In some cases, different execution threads or code may communicate with one another as they work. Communication may take place to pass data from one thread to the next as part of a workflow.

In some embodiments, distributing work across the cores 505 according to functional parallelism 500, can comprise distributing network traffic according to a particular function such as network input/output management (NW I/O) 510A, secure sockets layer (SSL) encryption and decryption 510B and transmission control protocol (TCP) functions 510C. This may lead to a work, performance or computing load 515 based on a volume or level of functionality being used. In some embodiments, distributing work across the cores 505 according to data parallelism 540, can comprise distributing an amount of work 515 based on distributing data associated with a particular hardware or software component. In some embodiments, distributing work across the cores 505 according to flow-based data parallelism 520, can comprise distributing data based on a context or flow such that the amount of work 515A-N on each core may be similar, substantially equal or relatively evenly distributed.

In the case of the functional parallelism approach, each core may be configured to run one or more functionalities of the plurality of functionalities provided by the packet engine or VIP of the appliance. For example, core 1 may perform network I/O processing for the appliance 200' while core 2 performs TCP connection management for the appliance. Likewise, core 3 may perform SSL offloading while core 4 may perform layer 7 or application layer processing and traffic management. Each of the cores may perform the same function or different functions. Each of the cores may perform more than one function. Any of the cores may run any of the functionality or portions thereof identified and/or described in conjunction with FIGS. 2A and 2B. In this the approach, the work across the cores may be divided by function in either a coarse-grained or fine-grained manner. In some cases, as illustrated in FIG. 5A, division by function may lead to different cores running at different levels of performance or load 515.

In the case of the functional parallelism approach, each core may be configured to run one or more functionalities of the plurality of functionalities provided by the packet engine of the appliance. For example, core 1 may perform network I/O processing for the appliance 200' while core 2 performs TCP connection management for the appliance. Likewise, core 3 may perform SSL offloading while core 4 may perform layer 7 or application layer processing and traffic management. Each of the cores may perform the same function or different functions. Each of the cores may perform more than one function. Any of the cores may run any of the functionality or portions thereof identified and/or described in conjunction with FIGS. 2A and 2B. In this the approach, the work across the cores may be divided by function in either a coarse-grained or fine-grained manner. In some cases, as illustrated in FIG. 5A division by function may lead to different cores running at different levels of load or performance.

Figure 5B:
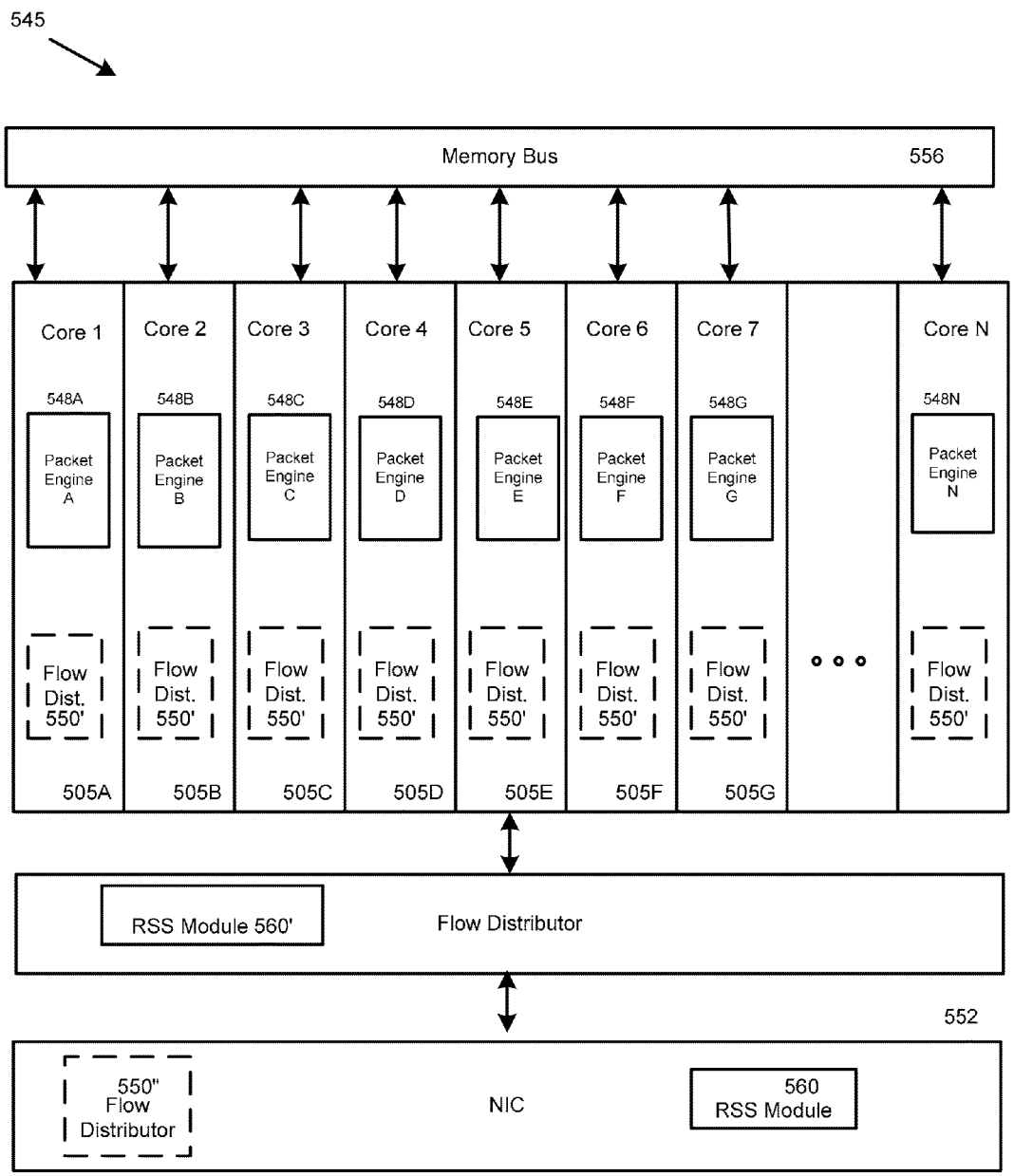
FIG. 5B is a block diagram of an embodiment of a system utilizing a multi-core system.

The functionality or tasks may be distributed in any arrangement and scheme. For example, FIG. 5B illustrates a first core, Core 1 505A, processing applications and processes associated with network I/O functionality 510A. Network traffic associated with network I/O, in some embodiments, can be associated with a particular port number. Thus, outgoing and incoming packets having a port destination associated with NW I/O 510A will be directed towards Core 1 505A which is dedicated to handling all network traffic associated with the NW I/O port. Similarly, Core 2 505B is dedicated to handling functionality associated with SSL processing and Core 4 505D may be dedicated handling all TCP level processing and functionality.

While FIG. 5A illustrates functions such as network I/O, SSL and TCP, other functions can be assigned to cores. These other functions can include any one or more of the functions or operations described herein. For example, any of the functions described in conjunction with FIGS. 2A and 2B may be distributed across the cores on a functionality basis. In some cases, a first VIP 275A may run on a first core while a second VIP 275B with a different configuration may run on a second core. In some embodiments, each core 505 can handle a particular functionality such that each core 505 can handle the processing associated with that particular function. For example, Core 2 505B may handle SSL offloading while Core 4 505D may handle application layer processing and traffic management.

In other embodiments, work, load or network traffic may be distributed among cores 505 according to any type and form of data parallelism 540. In some embodiments, data parallelism may be achieved in a multi-core system by each core performing the same task or functionally on different pieces of distributed data. In some embodiments, a single execution thread or code controls operations on all pieces of data. In other embodiments, different threads or instructions control the operation, but may execute the same code. In some embodiments, data parallelism is achieved from the perspective of a packet engine, vServers (VIPs) 275A-C, network interface cards (NIC) 542D-E and/or any other networking hardware or software included on or associated with an appliance 200. For example, each core may run the same packet engine or VIP code or configuration but operate on different sets of distributed data. Each networking hardware or software construct can receive different, varying or substantially the same amount of data, and as a result may have varying, different or relatively the same amount of load 515.

In the case of a data parallelism approach, the work may be divided up and distributed based on VIPs, NICs and/or data flows of the VIPs or NICs. In one of these approaches, the work of the multi-core system may be divided or distributed among the VIPs by having each VIP work on a distributed set of data. For example, each core may be configured to run one or more VIPs. Network traffic may be distributed to the core for each VIP handling that traffic. In another of these approaches, the work of the appliance may be divided or distributed among the cores based on which NIC receives the network traffic. For example, network traffic of a first NIC may be distributed to a first core while network traffic of a second NIC may be distributed to a second core. In some cases, a core may process data from multiple NICs.

While FIG. 5A illustrates a single vServer associated with a single core 505, as is the case for VIP1 275A, VIP2 275B and VIP3 275C. In some embodiments, a single vServer can be associated with one or more cores 505. In contrast, one or more vServers can be associated with a single core 505. Associating a vServer with a core 505 may include that core 505 to process all functions associated with that particular vServer. In some embodiments, each core executes a VIP having the same code and configuration. In other embodiments, each core executes a VIP having the same code but different configuration. In some embodiments, each core executes a VIP having different code and the same or different configuration.

Like vServers, NICs can also be associated with particular cores 505. In many embodiments, NICs can be connected to one or more cores 505 such that when a NIC receives or transmits data packets, a particular core 505 handles the processing involved with receiving and transmitting the data packets. In one embodiment, a single NIC can be associated with a single core 505, as is the case with NIC1 542D and NIC2 542E. In other embodiments, one or more NICs can be associated with a single core 505. In other embodiments, a single NIC can be associated with one or more cores 505. In these embodiments, load could be distributed amongst the one or more cores 505 such that each core 505 processes a substantially similar amount of load. A core 505 associated with a NIC may process all functions and/or data associated with that particular NIC.

While distributing work across cores based on data of VIPs or NICs may have a level of independency, in some embodiments, this may lead to unbalanced use of cores as illustrated by the varying loads 515 of FIG. 5A.

In some embodiments, load, work or network traffic can be distributed among cores 505 based on any type and form of data flow. In another of these approaches, the work may be divided or distributed among cores based on data flows. For example, network traffic between a client and a server traversing the appliance may be distributed to and processed by one core of the plurality of cores. In some cases, the core initially establishing the session or connection may be the core for which network traffic for that session or connection is distributed. In some embodiments, the data flow is based on any unit or portion of network traffic, such as a transaction, a request/response communication or traffic originating from an application on a client. In this manner and in some embodiments, data flows between clients and servers traversing the appliance 200' may be distributed in a more balanced manner than the other approaches.

In flow-based data parallelism 520, distribution of data is related to any type of flow of data, such as request/response pairings, transactions, sessions, connections or application communications. For example, network traffic between a client and a server traversing the appliance may be distributed to and processed by one core of the plurality of cores. In some cases, the core initially establishing the session or connection may be the core for which network traffic for that session or connection is distributed. The distribution of data flow may be such that each core 505 carries a substantially equal or relatively evenly distributed amount of load, data or network traffic.

In some embodiments, the data flow is based on any unit or portion of network traffic, such as a transaction, a request/response communication or traffic originating from an application on a client. In this manner and in some embodiments, data flows between clients and servers traversing the appliance 200' may be distributed in a more balanced manner than the other approached. In one embodiment, data flow can be distributed based on a transaction or a series of transactions. This transaction, in some embodiments, can be between a client and a server and can be characterized by an IP address or other packet identifier. For example, Core 1 505A can be dedicated to transactions between a particular client and a particular server, therefore the load 515A on Core 1 505A may be comprised of the network traffic associated with the transactions between the particular client and server. Allocating the network traffic to Core 1 505A can be accomplished by routing all data packets originating from either the particular client or server to Core 1 505A.

While work or load can be distributed to the cores based in part on transactions, in other embodiments load or work can be allocated on a per packet basis. In these embodiments, the appliance 200 can intercept data packets and allocate them to a core 505 having the least amount of load. For example, the appliance 200 could allocate a first incoming data packet to Core 1 505A because the load 515A on Core 1 is less than the load 515B-N on the rest of the cores 505B-N. Once the first data packet is allocated to Core 1 505A, the amount of load 515A on Core 1 505A is increased proportional to the amount of processing resources needed to process the first data packet. When the appliance 200 intercepts a second data packet, the appliance 200 will allocate the load to Core 4 505D because Core 4 505D has the second least amount of load. Allocating data packets to the core with the least amount of load can, in some embodiments, ensure that the load 515A-N distributed to each core 505 remains substantially equal.

In other embodiments, load can be allocated on a per unit basis where a section of network traffic is allocated to a particular core 505. The above-mentioned example illustrates load balancing on a per/packet basis. In other embodiments, load can be allocated based on a number of packets such that every 10, 100 or 1000 packets are allocated to the core 505 having the least amount of load. The number of packets allocated to a core 505 can be a number determined by an application, user or administrator and can be any number greater than zero. In still other embodiments, load can be allocated based on a time metric such that packets are distributed to a particular core 505 for a predetermined amount of time. In these embodiments, packets can be distributed to a particular core 505 for five milliseconds or for any period of time determined by a user, program, system, administrator or otherwise. After the predetermined time period elapses, data packets are transmitted to a different core 505 for the predetermined period of time.

Flow-based data parallelism methods for distributing work, load or network traffic among the one or more cores 505 can comprise any combination of the above-mentioned embodiments. These methods can be carried out by any part of the appliance 200, by an application or set of executable instructions executing on one of the cores 505, such as the packet engine, or by any application, program or agent executing on a computing device in communication with the appliance 200.

The functional and data parallelism computing schemes illustrated in FIG. 5A can be combined in any manner to generate a hybrid parallelism or distributed processing scheme that encompasses function parallelism 500, data parallelism 540, flow-based data parallelism 520 or any portions thereof. In some cases, the multi-core system may use any type and form of load balancing schemes to distribute load among the one or more cores 505. The load balancing scheme may be used in any combination with any of the functional and data parallelism schemes or combinations thereof.

Illustrated in FIG. 5B is an embodiment of a multi-core system 545, which may be any type and form of one or more systems, appliances, devices or components. This system 545, in some embodiments, can be included within an appliance 200 having one or more processing cores 505A-N. The system 545 can further include one or more packet engines (PE) or packet processing engines (PPE) 548A-N communicating with a memory bus 556. The memory bus may be used to communicate with the one or more processing cores 505A-N. Also included within the system 545 can be one or more network interface cards (NIC) 552 and a flow distributor 550 which can further communicate with the one or more processing cores 505A-N. The flow distributor 550 can comprise a Receive Side Scaler (RSS) or Receive Side Scaling (RSS) module 560.

Further referring to FIG. 5B, and in more detail, in one embodiment the packet engine(s) 548A-N can comprise any portion of the appliance 200 described herein, such as any portion of the appliance described in FIGS. 2A and 2B. The packet engine(s) 548A-N can, in some embodiments, comprise any of the following elements: the packet engine 240, a network stack 267; a cache manager 232; a policy engine 236; a compression engine 238; an encryption engine 234; a GUI 210; a CLI 212; shell services 214; monitoring programs 216; and any other software or hardware element able to receive data packets from one of either the memory bus 556 or the one of more cores 505A-N. In some embodiments, the packet engine(s) 548A-N can comprise one or more vServers 275A-N, or any portion thereof. In other embodiments, the packet engine(s) 548A-N can provide any combination of the following functionalities: SSL VPN 280; Intranet UP 282; switching 284; DNS 286; packet acceleration 288; App FW 280; monitoring such as the monitoring provided by a monitoring agent 197; functionalities associated with functioning as a TCP stack; load balancing; SSL offloading and processing; content switching; policy evaluation; caching; compression; encoding; decompression; decoding; application firewall functionalities; XML processing and acceleration; and SSL VPN connectivity.

The packet engine(s) 548A-N can, in some embodiments, be associated with a particular server, user, client or network. When a packet engine 548 becomes associated with a particular entity, that packet engine 548 can process data packets associated with that entity. For example, should a packet engine 548 be associated with a first user, that packet engine 548 will process and operate on packets generated by the first user, or packets having a destination address associated with the first user. Similarly, the packet engine 548 may choose not to be associated with a particular entity such that the packet engine 548 can process and otherwise operate on any data packets not generated by that entity or destined for that entity.

In some instances, the packet engine(s) 548A-N can be configured to carry out the any of the functional and/or data parallelism schemes illustrated in FIG. 5A. In these instances, the packet engine(s) 548A-N can distribute functions or data among the processing cores 505A-N so that the distribution is according to the parallelism or distribution scheme. In some embodiments, a single packet engine(s) 548A-N carries out a load balancing scheme, while in other embodiments one or more packet engine(s) 548A-N carry out a load balancing scheme. Each core 505A-N, in one embodiment, can be associated with a particular packet engine 548 such that load balancing can be carried out by the packet engine. Load balancing may in this embodiment, require that each packet engine 548A-N associated with a core 505 communicate with the other packet engines associated with cores so that the packet engines 548A-N can collectively determine where to distribute load. One embodiment of this process can include an arbiter that receives votes from each packet engine for load. The arbiter can distribute load to each packet engine 548A-N based in part on the age of the engine's vote and in some cases a priority value associated with the current amount of load on an engine's associated core 505.

Any of the packet engines running on the cores may run in user mode, kernel or any combination thereof. In some embodiments, the packet engine operates as an application or program running is user or application space. In these embodiments, the packet engine may use any type and form of interface to access any functionality provided by the kernel. In some embodiments, the packet engine operates in kernel mode or as part of the kernel. In some embodiments, a first portion of the packet engine operates in user mode while a second portion of the packet engine operates in kernel mode. In some embodiments, a first packet engine on a first core executes in kernel mode while a second packet engine on a second core executes in user mode. In some embodiments, the packet engine or any portions thereof operates on or in conjunction with the NIC or any drivers thereof.

In some embodiments the memory bus 556 can be any type and form of memory or computer bus. While a single memory bus 556 is depicted in FIG. 5B, the system 545 can comprise any number of memory buses 556. In one embodiment, each packet engine 548 can be associated with one or more individual memory buses 556.

The NIC 552 can in some embodiments be any of the network interface cards or mechanisms described herein. The NIC 552 can have any number of ports. The NIC can be designed and constructed to connect to any type and form of network 104. While a single NIC 552 is illustrated, the system 545 can comprise any number of NICs 552. In some embodiments, each core 505A-N can be associated with one or more single NICs 552. Thus, each core 505 can be associated with a single NIC 552 dedicated to a particular core 505. The cores 505A-N can comprise any of the processors described herein. Further, the cores 505A-N can be configured according to any of the core 505 configurations described herein. Still further, the cores 505A-N can have any of the core 505 functionalities described herein. While FIG. 5B illustrates seven cores 505A-G, any number of cores 505 can be included within the system 545. In particular, the system 545 can comprise "N" cores, where "N" is a whole number greater than zero.

A core may have or use memory that is allocated or assigned for use to that core. The memory may be considered private or local memory of that core and only accessible by that core. A core may have or use memory that is shared or assigned to multiple cores. The memory may be considered public or shared memory that is accessible by more than one core. A core may use any combination of private and public memory. With separate address spaces for each core, some level of coordination is eliminated from the case of using the same address space. With a separate address space, a core can perform work on information and data in the core's own address space without worrying about conflicts with other cores. Each packet engine may have a separate memory pool for TCP and/or SSL connections.

Further referring to FIG. 5B, any of the functionality and/or embodiments of the cores 505 described above in connection with FIG. 5A can be deployed in any embodiment of the virtualized environment described above in connection with FIGS. 4A and 4B. Instead of the functionality of the cores 505 being deployed in the form of a physical processor 505, such functionality may be deployed in a virtualized environment 400 on any computing device 100, such as a client 102, server 106 or appliance 200. In other embodiments, instead of the functionality of the cores 505 being deployed in the form of an appliance or a single device, the functionality may be deployed across multiple devices in any arrangement. For example, one device may comprise two or more cores and another device may comprise two or more cores. For example, a multi-core system may include a cluster of computing devices, a server farm or network of computing devices. In some embodiments, instead of the functionality of the cores 505 being deployed in the form of cores, the functionality may be deployed on a plurality of processors, such as a plurality of single core processors.

In one embodiment, the cores 505 may be any type and form of processor. In some embodiments, a core can function substantially similar to any processor or central processing unit described herein. In some embodiment, the cores 505 may comprise any portion of any processor described herein. While FIG. 5A illustrates seven cores, there can exist any "N" number of cores within an appliance 200, where "N" is any whole number greater than one. In some embodiments, the cores 505 can be installed within a common appliance 200, while in other embodiments the cores 505 can be installed within one or more appliance(s) 200 communicatively connected to one another. The cores 505 can in some embodiments comprise graphics processing software, while in other embodiments the cores 505 provide general processing capabilities. The cores 505 can be installed physically near each other and/or can be communicatively connected to each other. The cores may be connected by any type and form of bus or subsystem physically and/or communicatively coupled to the cores for transferring data between to, from and/or between the cores.

While each core 505 can comprise software for communicating with other cores, in some embodiments a core manager (not shown) can facilitate communication between each core 505. In some embodiments, the kernel may provide core management. The cores may interface or communicate with each other using a variety of interface mechanisms. In some embodiments, core to core messaging may be used to communicate between cores, such as a first core sending a message or data to a second core via a bus or subsystem connecting the cores. In some embodiments, cores may communicate via any type and form of shared memory interface. In one embodiment, there may be one or more memory locations shared among all the cores. In some embodiments, each core may have separate memory locations shared with each other core. For example, a first core may have a first shared memory with a second core and a second share memory with a third core. In some embodiments, cores may communicate via any type of programming or API, such as function calls via the kernel. In some embodiments, the operating system may recognize and support multiple core devices and provide interfaces and API for inter-core communications.

The flow distributor 550 can be any application, program, library, script, task, service, process or any type and form of executable instructions executing on any type and form of hardware. In some embodiments, the flow distributor 550 may any design and construction of circuitry to perform any of the operations and functions described herein. In some embodiments, the flow distributor distribute, forwards, routes, controls and/ors manage the distribution of data packets among the cores 505 and/or packet engine or VIPs running on the cores. The flow distributor 550, in some embodiments, can be referred to as an interface master. In one embodiment, the flow distributor 550 comprises a set of executable instructions executing on a core or processor of the appliance 200. In another embodiment, the flow distributor 550 comprises a set of executable instructions executing on a computing machine in communication with the appliance 200. In some embodiments, the flow distributor 550 comprises a set of executable instructions executing on a NIC, such as firmware. In still other embodiments, the flow distributor 550 comprises any combination of software and hardware to distribute data packets among cores or processors. In one embodiment, the flow distributor 550 executes on at least one of the cores 505A-N, while in other embodiments a separate flow distributor 550 assigned to each core 505A-N executes on an associated core 505A-N. The flow distributor may use any type and form of statistical or probabilistic algorithms or decision making to balance the flows across the cores. The hardware of the appliance, such as a NIC, or the kernel may be designed and constructed to support sequential operations across the NICs and/or cores.

In embodiments where the system 545 comprises one or more flow distributors 550, each flow distributor 550 can be associated with a processor 505 or a packet engine 548. The flow distributors 550 can comprise an interface mechanism that allows each flow distributor 550 to communicate with the other flow distributors 550 executing within the system 545. In one instance, the one or more flow distributors 550 can determine how to balance load by communicating with each other. This process can operate substantially similarly to the process described above for submitting votes to an arbiter which then determines which flow distributor 550 should receive the load. In other embodiments, a first flow distributor 550' can identify the load on an associated core and determine whether to forward a first data packet to the associated core based on any of the following criteria: the load on the associated core is above a predetermined threshold; the load on the associated core is below a predetermined threshold; the load on the associated core is less than the load on the other cores; or any other metric that can be used to determine where to forward data packets based in part on the amount of load on a processor.

The flow distributor 550 can distribute network traffic among the cores 505 according to a distribution, computing or load balancing scheme such as those described herein. In one embodiment, the flow distributor can distribute network traffic according to any one of a functional parallelism distribution scheme 550, a data parallelism load distribution scheme 540, a flow-based data parallelism distribution scheme 520, or any combination of these distribution scheme or any load balancing scheme for distributing load among multiple processors. The flow distributor 550 can therefore act as a load distributor by taking in data packets and distributing them across the processors according to an operative load balancing or distribution scheme. In one embodiment, the flow distributor 550 can comprise one or more operations, functions or logic to determine how to distribute packers, work or load accordingly. In still other embodiments, the flow distributor 550 can comprise one or more sub operations, functions or logic that can identify a source address and a destination address associated with a data packet, and distribute packets accordingly.

In some embodiments, the flow distributor 550 can comprise a receive-side scaling (RSS) network driver, module 560 or any type and form of executable instructions which distribute data packets among the one or more cores 505. The RSS module 560 can comprise any combination of hardware and software, In some embodiments, the RSS module 560 works in conjunction with the flow distributor 550 to distribute data packets across the cores 505A-N or among multiple processors in a multi-processor network. The RSS module 560 can execute within the NIC 552 in some embodiments, and in other embodiments can execute on any one of the cores 505.

In some embodiments, the RSS module 560 uses the MICROSOFT receive-side-scaling (RSS) scheme. In one embodiment, RSS is a Microsoft Scalable Networking initiative technology that enables receive processing to be balanced across multiple processors in the system while maintaining in-order delivery of the data. The RSS may use any type and form of hashing scheme to determine a core or processor for processing a network packet.

The RSS module 560 can apply any type and form hash function such as the Toeplitz hash function. The hash function may be applied to the hash type or any the sequence of values. The hash function may be a secure hash of any security level or is otherwise cryptographically secure. The hash function may use a hash key. The size of the key is dependent upon the hash function. For the Toeplitz hash, the size may be 40 bytes for IPv6 and 16 bytes for IPv4.

The hash function may be designed and constructed based on any one or more criteria or design goals. In some embodiments, a hash function may be used that provides an even distribution of hash result for different hash inputs and different hash types, including TCP/IPv4, TCP/IPv6, IPv4, and IPv6 headers. In some embodiments, a hash function may be used that provides a hash result that is evenly distributed when a small number of buckets are present (for example, two or four). In some embodiments, hash function may be used that provides a hash result that is randomly distributed when a large number of buckets were present (for example, 64 buckets). In some embodiments, the hash function is determined based on a level of computational or resource usage. In some embodiments, the hash function is determined based on ease or difficulty of implementing the hash in hardware. In some embodiments, the hash function is determined based on the ease or difficulty of a malicious remote host to send packets that would all hash to the same bucket.

The RSS may generate hashes from any type and form of input, such as a sequence of values. This sequence of values can include any portion of the network packet, such as any header, field or payload of network packet, or portions thereof. In some embodiments, the input to the hash may be referred to as a hash type and include any tuples of information associated with a network packet or data flow, such as any of the following: a four tuple comprising at least two IP addresses and two ports; a four tuple comprising any four sets of values; a six tuple; a two tuple; and/or any other sequence of numbers or values. The following are example of hash types that may be used by RSS:

- 4-tuple of source TCP Port, source IP version 4 (IPv4) address, destination TCP Port, and destination IPv4 address.
- 4-tuple of source TCP Port, source IP version 6 (IPv6) address, destination TCP Port, and destination IPv6 address.
- 2-tuple of source IPv4 address, and destination IPv4 address.
- 2-tuple of source IPv6 address, and destination IPv6 address.
- 2-tuple of source IPv6 address, and destination IPv6 address, including support for parsing IPv6 extension headers.

The hash result or any portion thereof may used to identify a core or entity, such as a packet engine or VIP, for distributing a network packet. In some embodiments, one or more hash bits or mask are applied to the hash result. The hash bit or mask may be any number of bits or bytes. A NIC may support any number of bits, such as seven bits. The network stack may set the actual number of bits to be used during initialization. The number will be between 1 and 7, inclusive.

The hash result may be used to identify the core or entity via any type and form of table, such as a bucket table or indirection table. In some embodiments, the number of hash-result bits are used to index into the table. The range of the hash mask may effectively define the size of the indirection table. Any portion of the hash result or the hast result itself may be used to index the indirection table. The values in the table may identify any of the cores or processor, such as by a core or processor identifier. In some embodiments, all of the cores of the multi-core system are identified in the table. In other embodiments, a port of the cores of the multi-core system are identified in the table. The indirection table may comprise any number of buckets for example 2 to 128 buckets that may be indexed by a hash mask. Each bucket may comprise a range of index values that identify a core or processor. In some embodiments, the flow controller and/or RSS module may rebalance the network rebalance the network load by changing the indirection table.

In some embodiments, the multi-core system 575 does not include a RSS driver or RSS module 560. In some of these embodiments, a software steering module (not shown) or a software embodiment of the RSS module within the system can operate in conjunction with or as part of the flow distributor 550 to steer packets to cores 505 within the multi-core system 575.

The flow distributor 550, in some embodiments, executes within any module or program on the appliance 200, on any one of the cores 505 and on any one of the devices or components included within the multi-core system 575. In some embodiments, the flow distributor 550' can execute on the first core 505A, while in other embodiments the flow distributor 550" can execute on the NIC 552. In still other embodiments, an instance of the flow distributor 550' can execute on each core 505 included in the multi-core system 575. In this embodiment, each instance of the flow distributor 550' can communicate with other instances of the flow distributor 550' to forward packets back and forth across the cores 505. There exist situations where a response to a request packet may not be processed by the same core, i.e. the first core processes the request while the second core processes the response. In these situations, the instances of the flow distributor 550' can intercept the packet and forward it to the desired or correct core 505, i.e. a flow distributor instance 550' can forward the response to the first core. Multiple instances of the flow distributor 550' can execute on any number of cores 505 and any combination of cores 505.

The flow distributor may operate responsive to any one or more rules or policies. The rules may identify a core or packet processing engine to receive a network packet, data or data flow. The rules may identify any type and form of tuple information related to a network packet, such as a 4-tuple of source and destination IP address and source and destination ports. Based on a received packet matching the tuple specified by the rule, the flow distributor may forward the packet to a core or packet engine. In some embodiments, the packet is forwarded to a core via shared memory and/or core to core messaging.

Although FIG. 5B illustrates the flow distributor 550 as executing within the multi-core system 575, in some embodiments the flow distributor 550 can execute on a computing device or appliance remotely located from the multi-core system 575. In such an embodiment, the flow distributor 550 can communicate with the multi-core system 575 to take in data packets and distribute the packets across the one or more cores 505. The flow distributor 550 can, in one embodiment, receive data packets destined for the appliance 200, apply a distribution scheme to the received data packets and distribute the data packets to the one or more cores 505 of the multi-core system 575. In one embodiment, the flow distributor 550 can be included in a router or other appliance such that the router can target particular cores 505 by altering meta data associated with each packet so that each packet is targeted towards a sub-node of the multi-core system 575. In such an embodiment, CISCO's vn-tag mechanism can be used to alter or tag each packet with the appropriate meta data.

Figure 5C:
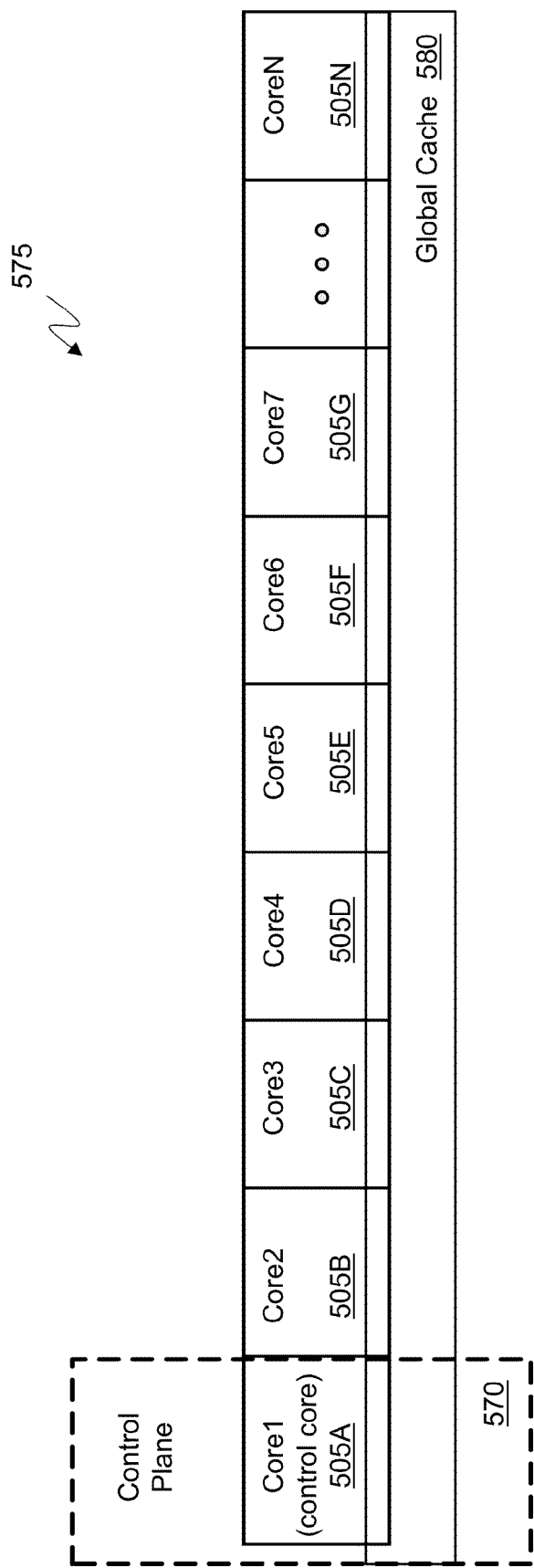
FIG. 5C is a block diagram of another embodiment of an aspect of a multi-core system.

Illustrated in FIG. 5C is an embodiment of a multi-core system 575 comprising one or more processing cores 505A-N. In brief overview, one of the cores 505 can be designated as a control core 505A and can be used as a control plane 570 for the other cores 505. The other cores may be secondary cores which operate in a data plane while the control core provides the control plane. The cores 505A-N may share a global cache 580. While the control core provides a control plane, the other cores in the multi-core system form or provide a data plane. These cores perform data processing functionality on network traffic while the control provides initialization, configuration and control of the multi-core system.

Further referring to FIG. 5C, and in more detail, the cores 505A-N as well as the control core 505A can be any processor described herein. Furthermore, the cores 505A-N and the control core 505A can be any processor able to function within the system 575 described in FIG. 5C. Still further, the cores 505A-N and the control core 505A can be any core or group of cores described herein. The control core may be a different type of core or processor than the other cores. In some embodiments, the control may operate a different packet engine or have a packet engine configured differently than the packet engines of the other cores.

Any portion of the memory of each of the cores may be allocated to or used for a global cache that is shared by the cores. In brief overview, a predetermined percentage or predetermined amount of each of the memory of each core may be used for the global cache. For example, 50% of each memory of each code may be dedicated or allocated to the shared global cache. That is, in the illustrated embodiment, 2 GB of each core excluding the control plane core or core 1 may be used to form a 28 GB shared global cache. The configuration of the control plane such as via the configuration services may determine the amount of memory used for the shared global cache. In some embodiments, each core may provide a different amount of memory for use by the global cache. In other embodiments, any one core may not provide any memory or use the global cache. In some embodiments, any of the cores may also have a local cache in memory not allocated to the global shared memory. Each of the cores may store any portion of network traffic to the global shared cache. Each of the cores may check the cache for any content to use in a request or response. Any of the cores may obtain content from the global shared cache to use in a data flow, request or response.

The global cache 580 can be any type and form of memory or storage element, such as any memory or storage element described herein. In some embodiments, the cores 505 may have access to a predetermined amount of memory (i.e. 32 GB or any other memory amount commensurate with the system 575). The global cache 580 can be allocated from that predetermined amount of memory while the rest of the available memory can be allocated among the cores 505. In other embodiments, each core 505 can have a predetermined amount of memory. The global cache 580 can comprise an amount of the memory allocated to each core 505. This memory amount can be measured in bytes, or can be measured as a percentage of the memory allocated to each core 505. Thus, the global cache 580 can comprise 1 GB of memory from the memory associated with each core 505, or can comprise 20 percent or one-half of the memory associated with each core 505. In some embodiments, only a portion of the cores 505 provide memory to the global cache 580, while in other embodiments the global cache 580 can comprise memory not allocated to the cores 505.

Each core 505 can use the global cache 580 to store network traffic or cache data. In some embodiments, the packet engines of the core use the global cache to cache and use data stored by the plurality of packet engines. For example, the cache manager of FIG. 2A and cache functionality of FIG. 2B may use the global cache to share data for acceleration. For example, each of the packet engines may store responses, such as HTML data, to the global cache. Any of the cache managers operating on a core may access the global cache to server caches responses to client requests.

In some embodiments, the cores 505 can use the global cache 580 to store a port allocation table which can be used to determine data flow based in part on ports. In other embodiments, the cores 505 can use the global cache 580 to store an address lookup table or any other table or list that can be used by the flow distributor to determine where to direct incoming and outgoing data packets. The cores 505 can, in some embodiments read from and write to cache 580, while in other embodiments the cores 505 can only read from or write to cache 580. The cores may use the global cache to perform core to core communications.

The global cache 580 may be sectioned into individual memory sections where each section can be dedicated to a particular core 505. In one embodiment, the control core 505A can receive a greater amount of available cache, while the other cores 505 can receiving varying amounts or access to the global cache 580.

In some embodiments, the system 575 can comprise a control core 505A. While FIG. 5C illustrates core 1 505A as the control core, the control core can be any core within the appliance 200 or multi-core system. Further, while only a single control core is depicted, the system 575 can comprise one or more control cores each having a level of control over the system. In some embodiments, one or more control cores can each control a particular aspect of the system 575. For example, one core can control deciding which distribution scheme to use, while another core can determine the size of the global cache 580.

The control plane of the multi-core system may be the designation and configuration of a core as the dedicated management core or as a master core. This control plane core may provide control, management and coordination of operation and functionality the plurality of cores in the multi-core system. This control plane core may provide control, management and coordination of allocation and use of memory of the system among the plurality of cores in the multi-core system, including initialization and configuration of the same. In some embodiments, the control plane includes the flow distributor for controlling the assignment of data flows to cores and the distribution of network packets to cores based on data flows. In some embodiments, the control plane core runs a packet engine and in other embodiments, the control plane core is dedicated to management and control of the other cores of the system.

The control core 505A can exercise a level of control over the other cores 505 such as determining how much memory should be allocated to each core 505 or determining which core 505 should be assigned to handle a particular function or hardware/software entity. The control core 505A, in some embodiments, can exercise control over those cores 505 within the control plan 570. Thus, there can exist processors outside of the control plane 570 which are not controlled by the control core 505A. Determining the boundaries of the control plane 570 can include maintaining, by the control core 505A or agent executing within the system 575, a list of those cores 505 controlled by the control core 505A. The control core 505A can control any of the following: initialization of a core; determining when a core is unavailable; re-distributing load to other cores 505 when one core fails; determining which distribution scheme to implement; determining which core should receive network traffic; determining how much cache should be allocated to each core; determining whether to assign a particular function or element to a particular core; determining whether to permit cores to communicate with one another; determining the size of the global cache 580; and any other determination of a function, configuration or operation of the cores within the system 575.

F. Systems and Methods for Compressed Message Communication

Figure 6A:
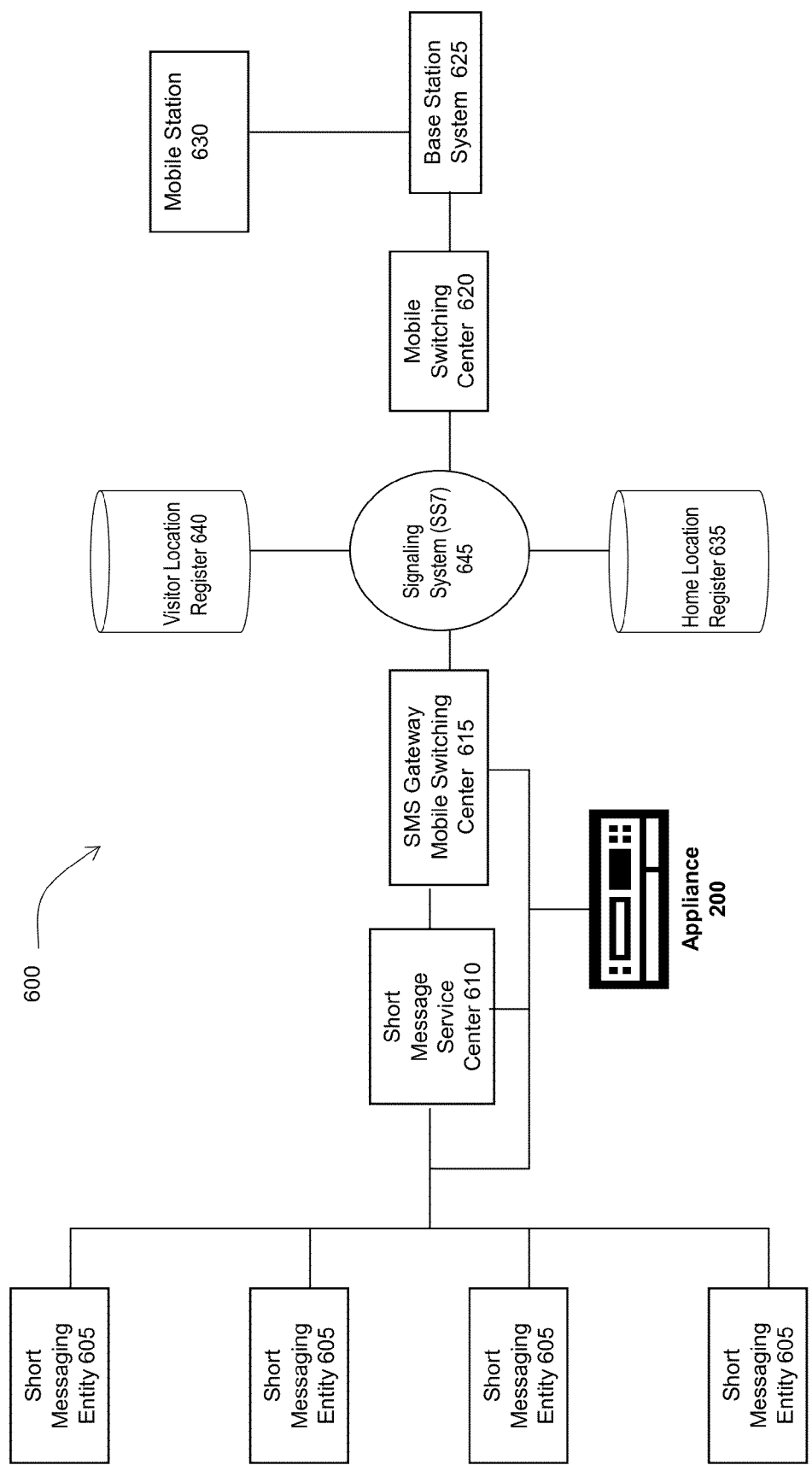
FIG. 6A is a block diagram of an embodiment of a system for compressing and load balancing messages for communication through a network.
Figure 6B:
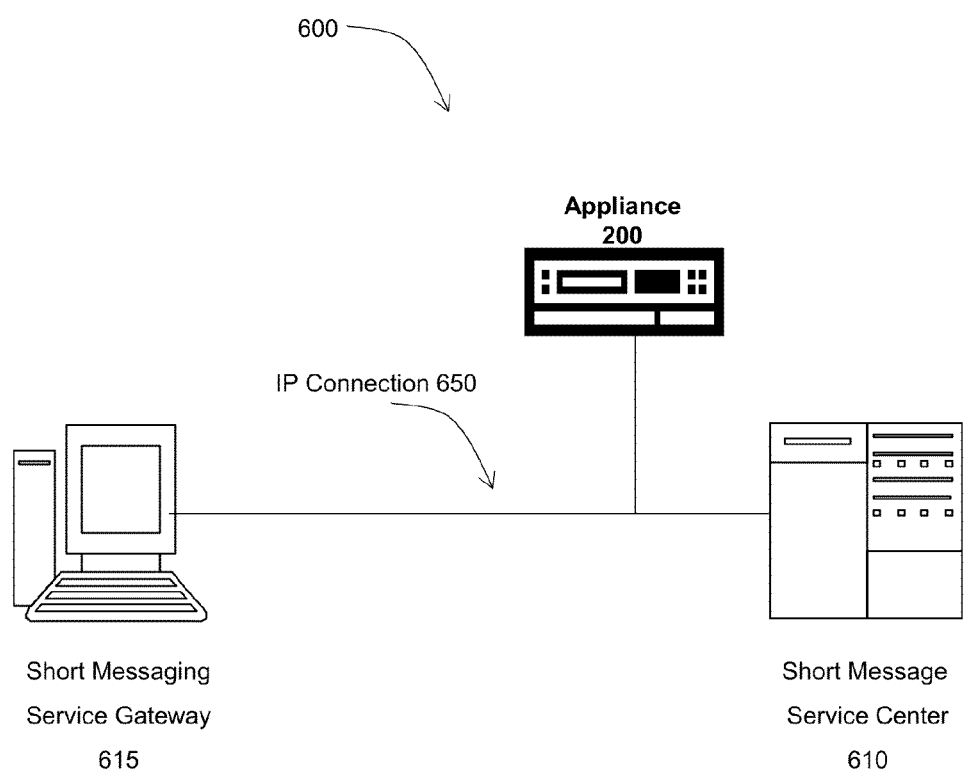
FIG. 6B is a block diagram of an embodiment of a system for compressing and load balancing messages for communication through a network.
Figure 6C:
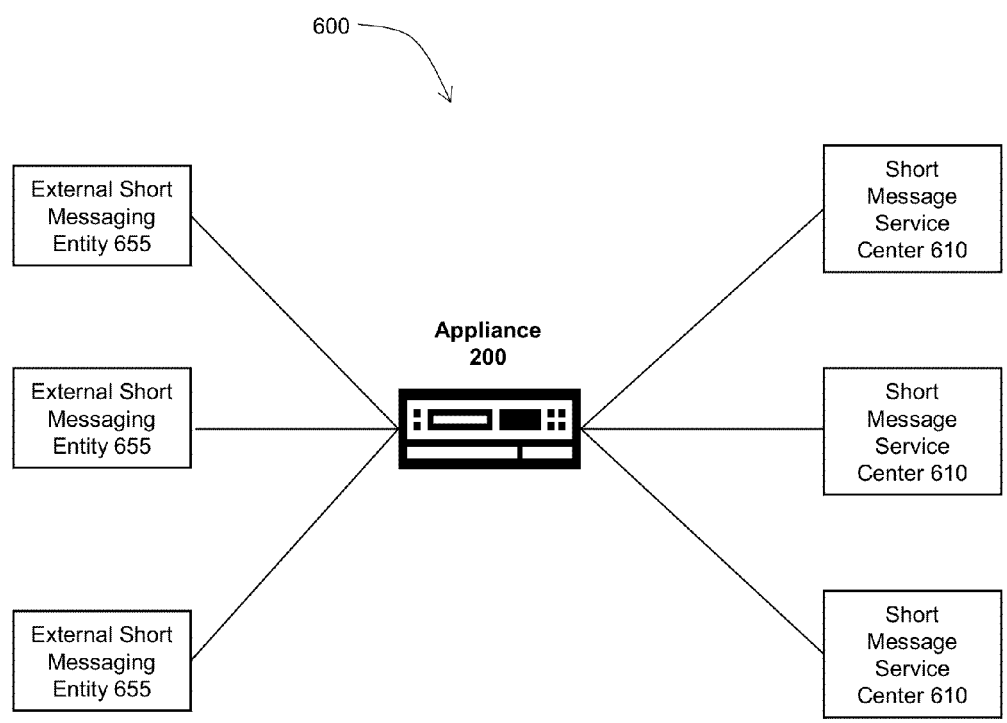
FIG. 6C is a block diagram of an embodiment of a system for compressing and load balancing messages for communication through a network.

The systems and methods of the present invention are directed towards message compression for communication between messaging devices through a communications network. FIGS. 6A-6C, described below, depict examples of a communications network that include appliance 200. Appliance 200 can compress SMS messages for reduced bandwidth transmission through the communications network. The appliance 200 and compression technique can integrate with Short Message Peer to Peer or other protocols for data communication (e.g., SMS messages) between message centers such as Short Message Service Centers (SMSCs) or GSM Unstructured Supplementary Services Data (USSD) Servers and SMS application systems such as SMS Messaging Gateways, WAP proxy Servers, Email Gateways or other messaging gateways.

Referring to FIG. 6A, a block diagram depicts one embodiment of a communications network 600, such as a Global System for Mobile communications (GSM) network configured for the communication of data messages between computing devices such as mobile telephones, smart phones, and computers. Examples of the data messages include Short Message Service (SMS) messages or text messages. In one embodiment, the SMS messages are 1120 bits or less in length. For example, SMS or other text messages may not be greater than 160 7-bit characters, 140 8-bit characters, or 70 16-bit characters. In one embodiment, the messages that are transmitted through communications network 600 can be greater than these amounts. For example, multipart or long SMS messages can include larger amounts of data.

The communications network 600 can include at least one Short Messaging Entity (SME) 605. SMS (or other) messages can be sent between SMEs 605 by communicating with the communications network 600. The SMS messages can originate or terminate at SMEs 605. SMEs 605 can include mobile telephones, smart phones, personal digital assistants, tablet computers, laptop computers, desktop computers, personal computers, and other computing devices having message sending and receiving capabilities. In one embodiment, SMEs 605 include a device having a Mobile Subscriber Integrated Services Digital Network Number (MSISDN) or other number identifying a subscriber in communications network 600. In one embodiment, SME 605 includes a computer equipped with messaging capabilities, such as a server or desktop computer.

The communications network 600 can include at least one Short Message Service Center (SMSC) 610 to receive SMS messages from an originating device (e.g., an SME 605) and forward them to at least one destination device (e.g., another SME 605). The SMSC 610 can communicate with at least one SMS Gateway Mobile Switching Center 615 and at least one Mobile Switching Center 620 to locate a Short Messaging Entity 605 that is the destination of an SMS message. In one embodiment, the SMSC 610 includes at least one data storage unit to store SMS messages. For example, if an SME 605 that is a destination for a text message is switched off, the SMSC 610 can store the text message and forward the text message to that SME 605 when the device is turned on. In one embodiment, the SMSC 610 of the communications network 600 is the device generally responsible for receiving, storing and delivering SMS messages in and through the network 600.

The communications network 600 can include at least one Home Location Register 635 to provide information about the SMEs 605 such as the MSISDN or other subscriber identity module (SIM) information, and at least one Visitor Location Register (VLR) 640 to determine the location of one or more SMEs 605. For example, the VLR 640 can store information about SMEs 605 that roamed into a location covered by base station 625 or mobile station 630 of the communications network 600. The base station system 625 and mobile station 630 can include antennae and electronic communications equipment to transmit and receive the SMS messages between SMEs 605. In one embodiment, the communications network 600 operates using a common channel signaling protocol such as Signaling System No. 7 (SS7) protocol 645 to establish and disconnect voice and data communications.

Referring to FIG. 6B, in one embodiment, the Short Messaging Entity Gateway (SME Gateway) 615 can communicate directly with the Short Message Service Center (SMSC) 610 via the Internet or another network such as a private IP network using the IP connection 650. The IP connection 650 may be referred to as a direct connection between the SME Gateway 615 and the SMSC 610. This direct IP connection 650 allows a large number of messages to be transmitted in a short time period, and can be used to monitor the availability of SMSC 610. The SMS Gateway 615 and IP connection 650 can support SMS protocols such as a Universal Computer Protocol (UCP), Short Message Peer to Peer (SMPP), and Computer Interface for Message Distribution (CIMD or CIMD2) protocols to connect with the SMSC 610. The SME Gateway 615 can include an SME 605 that is a computer equipped with messaging capabilities. A plurality of SMEs 605 can connect to SME Gateway 615.

A service provider associated with the SMSC 610 can grant access via IP connection 650 by providing an IP address of the SMSC 610, port number of the SMSC 610, username or password. Further, the IP connection 650 may include a virtual private network (VPN) between the SME Gateway 615 and the SMSC 610. The VPN can use tunneling protocols to secure SMS messages transmitted between the SME Gateway 615 and the SMSC 610. In one embodiment, an IP address of the SME Gateway 615 is provided to the SMSC 610 to, for example gain access past a security barrier (e.g., firewall) that protects the SMSC 610 from unauthorized access.

FIG. 6C depicts an example where communications network 600 includes a plurality of External Short Messaging Entities (ESMEs) 655 that connect to at least one SMC 610 to send and receive SMS messages. In one embodiment, ESMEs 655 differ from SMEs 605 in that ESMEs 655 lack the wireless capabilities of some SMEs 605 and are not consumer devices for the general public. For example, an SME 605 can include a smart phone having a human user, and an ESME 655 can be a device of communication network 600 that sends mass automated messages to users, or that receives and processes incoming SMS communications such as votes or donations. In this example, the ESMEs 655 process a high volume of SMS messages during a relatively short time period, (e.g., a matter of several minutes), such as when TV viewers vote by SMS message for their favorite person or product responsive to a request to do so on a television program or through a social network. In another example, ESMEs 655 can originate a high volume of SMS messages and distribute them to SMEs 605 via network 600 to advertise for a product, or to provide a news, weather, or current events alert. This high volume messaging can consume significant bandwidth, and the appliance 200 can compress the SMS messages to reduce bandwidth usage through network 600 using the compression techniques described further herein.

Referring to FIGS. 6A to 6C, in one embodiment the appliance 200 interfaces with components of the communications network 600 and operates as an application delivery controller (or virtual application delivery controller) to control the transmission of SMS messages to and from SMEs 605 through the network 600. In one embodiment, appliance 200 securely connects with SMSC 610 via the IP connection 650. For example, the appliance 200 can use a Secure Sockets Layer (SSL) protocol of a Virtual Private Network (VPN) to connect with SMSC 610.

The appliance 200 can be located between ESMEs 655 and SMSCs 610 and reduces bandwidth usage between SMEs 605 and SMSCs 610. For example, appliance 200 can connect ESMEs 655 with SMSCs 610 via a TCP/IP or X.25 protocol connection. The protocol can be based on pairs of request/response protocol data units (e.g. packets) exchanged over OSI layer 4 (TCP session or X.25 SVCS) connections. The protocol data units can be binary encoded for efficiency with the SMPP protocol data units having a header and body. The SMS gateway 615 receives the SMS message (e.g., from Short Messaging Entity 605 or External Short Messaging Entity 655) and compresses the SMS message as described further herein. The compressed SMS message can be forwarded to appliance 200, where the compressed SMS message is received and decompressed using the decompression technique also described further herein. The decompressed message can be forwarded from appliance 200 to SMSC 610 and then to its destination, e.g., SMEs 605 or ESMEs 655. The SMS compression reduces bandwidth usage of the network 600 and increases the number of SMS messages that can be transmitted at a threshold bandwidth requirement.

The appliance 200 further provides load balancing functionality. For example, the communications network 600 can include a plurality of Short Message Service Centers (SMSCs) 610, as in FIG. 6C. The appliance 200 can distribute SMS messages between the plurality of SMSCs 610 to balance their loads. For example, appliance 200 can redistribute SMS messages from one SMSC 610 to another SMSC 610 that is determined to be underutilized.

In one embodiment, the appliance 200 is configured to limit the rate of SMS messages sent to SMSCs 610. For example, the appliance 200 can determine that a number of SMS messages going from a particular source SME 605 (or ESME 655) to a particular destination SME 605 (or ESME 655) is above a threshold amount. In this example, the appliance 200 can limit, block, delay, cancel, or suspend SMS messages beyond the threshold number. In one embodiment, the appliance 200 provides a notification to the source SME 605 that the number of SMS messages has exceeded the threshold allowance and that further SMS message communication is suspended for a period of time. For example, a user of an SME 605 may be allowed to send or receive a threshold number of SMS messages per day, and appliance 200 can block SMS messages beyond this threshold.

In one embodiment, the appliance 200 determines statistical or other information about the behavior of users of the network 600. For example, the appliance can identify the heaviest users of the network 600, e.g., the users of SMEs 605 that are transmitting or receiving the most data via SMS messaging. This information can be provided to service providers, for example for billing purposes, or can be used by appliance 200 to improve usage of and workload distribution to SMSCs 610.

The appliance 200 can also adjust the content of the SMS messages before forwarding the SMS messages to SMSCs 610. For example, the appliance 200 can insert an advertisement into the SMS message, or can translate the language of the SMS message. In this example, a user could send an SMS message from an SME 605 in one language, the appliance 200 translates the message to a different language, and forwards the translated message to SMSCs 610, where the translated message is ultimately received by a destination SME 605 in the different language.

In one embodiment, the appliance 200 is configured to block SMS messages, based for example on the source or the destination of the SMS message. This blocking can be unique for each SME 605 (or ESME 655). For example, the appliance 200 can receive an SMS message from an ESME 655 and determine that message to be spam, for which a destination SME 605 (or their service provider) has identified as a message to be blocked. In this example, the appliance 200 can block delivery of the SMS message. In another example, the appliance 200 can receive instructions that an identified SME 605 is not to send or receive SMS messages from another identified SME 605, and appliance 200 can act to block any such SMS messages.

Compression and Decompression Techniques of the Compression Scheme

The example compression scheme described herein uses English as a reference language. The compression scheme can be applied to other languages as well. Further, the compression scheme is described with respect to SMS messages as an example; the compression scheme may be applied to other forms of text messages (e.g., tweets, updates to social networking sites, instant messages, email communication) and other data to reduce bandwidth usage during transmission through a data network.

In one embodiment, the compression scheme is a dictionary based compression scheme that is based on the probability of the occurrence of letters in a particular language where the most used or most common letters have shorter codewords. Using English as an example, a dictionary can be maintained for each letter of the English alphabet. Dictionaries can also be maintained for numbers, and a default dictionary can also be maintained. The dictionaries can be static dictionaries that are pre-generated according to the probability of words being used, and can be stored in one or more databases accessible by the appliance 200, the SMS Gateway 615, and other components of the communications network 600. The static dictionaries in this example occupy a constant amount of memory (e.g., RAM) when stored in a database.

The compression scheme executed at least in part by the appliance 200 or other components of the network 600 such as the SMS gateway 615 can use multiple dictionaries for encoding and decoding the text of an SMS message. The individual dictionaries can, for example, be constructed based on a probability measure that is calculated by taking a weighted sum of the occurrences of the characters in the English dictionary, and be based on the probability of letter combinations occurring in frequent words, for example per equation (1) below. In one embodiment, each letter of the alphabet has its own dictionary. In the dictionary for the letter "A," the letter "N" may have the highest probability of occurring after "A" per the probability measure of equation (1) below. In this example, "N" will appear at the top of A's dictionary and can have a shorter codeword than the rest of the letters in A's dictionary. In one embodiment, there are a total of 28 dictionaries, one for each letter of the English alphabet (26 total), one for numbers, and one as a default dictionary for the first letter of an SMS message and or special characters. In this example, each dictionary has 30 entries.

In one embodiment, $D_{(i)}$ represents a dictionary, where i represents each dictionary from A to Z and includes an ordering of letters based on the probability of what letter will follow. For example, $D_{(i)}=\{S1_i, S2_i, S3_i, S4_i \ldots S31_i, S32_i\}$, where S is the combination of the letter from A to Z, high frequency words such as "and" or "the" and high frequency suffixes such as "ing" "ed" or "ion" for example.

A value (V) can represent the rank (K) of a character. In one embodiment, rankings start with the number 2, and each dictionary can have a different ordering based on letter frequencies following each letter. For example, the dictionary for the letter "Q" can be: Q={" ", U, I, A, B, C, D, E, F, G, H, J, K, L, M, N, O, P, Q, R, S, T, V, W, X, Y, Z, "AND" "IN" "THE" "FOR"}. (The dictionary entries need not be case sensitive.) In this example the first entry in the dictionary is a space represented by empty quotation marks " ". In one embodiment, the last four entries "and" "in" "the" and "for" can be the same high frequency words in all dictionaries. These particular four words are examples and other words can be used. For some words like "and" spaces before and after the word can be considered, as the probability of "and" being a complete word as opposed to a substring of another word can be determined to be high. In other words, such as "in" spaces may not be considered, as the appliance 200 could determine "in" to be sufficiently likely to be part of another word.

In the above example dictionary for "Q", the letter "U" occurs first as the compression scheme indicates that "U" has the highest frequency of appearing after "Q" in the English language. In another example, the dictionary for "T" can be T={" ", H, O, I, E, A, S, R, Y, U, T, L, C, W, M, N, F, B, P, Z, G, D, V, K, J, Q, "ION" "AND" "IN" "THE" "FOR"}. In this example, for the letter "T", the letter "H" has the highest frequency of occurrence followed by the letter "O". In this example, the word "ION" replaces the letter "X" because the probability of "ION" occurring after the letter "T" is determined by the compression scheme to be greater than the probability of the letter "X" occurring.

In one embodiment, the compression scheme includes a default dictionary arranged with regions corresponding to the placement of the letters in the dictionaries for A-Z. The order of the letters in the default dictionary can be arranged based on the probability of the occurrence of the first letter of words in the English language. For example, the first letter in the default dictionary can be "S" where more words from all or a subset of the English language are determined to begin with the letter "S".

The compression scheme can also include a numeric dictionary arranged based on the probability of a number following another number being higher than a number followed by a letter. For example, the numeric dictionary can be arranged first with a space, then with the number 0-9, and then with letters of the alphabet. In the alphabet, default, and numeric dictionaries, the probabilities can be calculated based on frequencies of the letters and numbers that follow each other in the English language. In one embodiment, the dictionaries are static for each document, text string, or SMS message being encoded, so that the decoding operation involves a dictionary lookup procedure in the static dictionary.

In one embodiment, the rank of each character in the corresponding dictionary can be calculated using the probability measure of equation (1) below, where $P_{(c_{i-1}, c_i)}$ is the probability measure of the character $c_i$ coming after $c_{i-1}$. In this example, this is given by the sum of probability of a character coming after another in the English language (or a subset thereof) and in the most frequently occurring words in the language multiplied by a constant K. Equation (1):

$$P_{(c_{i-1},c_i)} = \frac{f_d(c_{i-1}c_i)}{T(w_d)} + K * \frac{f_{c_0}(c_{i-1}c_i)}{T(w_{c_0})}$$

In this example, the probability of a pair of letters can be calculated by dividing the total number of occurrences in a given sample $f_d$ by the total sample space $T(w_d)$. The constant K gives the relative weight to the pairs occurring in the frequent words. In one embodiment, K is approximately 1.5.

In one embodiment, an SMS message or other data is compressed as follows: In this example the symbol (e.g., letter, number or character) that occurs first in the SMS message is read and encoded using the default dictionary. In this example, the first symbol can be a letter. The compression scheme reads and encodes the first letter, then evaluates the dictionary associated with that first letter to encode the next symbol. On encountering a space, punctuation, or other special character, the dictionary to encode the next symbol reverts to the default dictionary. For the decoding technique, the first codeword is decoded by performing a lookup in the default dictionary. Once that symbol is decoded, the next codeword is decoded by using that symbol's dictionary. Letters that are not present in the dictionary can be encoded or decoded according to their ASCII values. In one embodiment, SMS Gateway 615 encodes the SMS message, and the appliance 200 decodes the SMS message. In this example, the dictionaries are stored in databases accessible by SMS gateway 615 and the appliance 200.

In one embodiment, example compression pseudo code for encoding may comprise:

```
repeat
input a letter X;
    if we are starting use default dictionary
    else use particular character's dictionary
if the rank(K) of letter(X) in the dictionary is less than 8
    get the value(V) to be encoded using the formula
```

$$V = \left\lceil \frac{k}{2} + 1 \right\rceil$$

```
else if rank(K) is between 9 and 32
    codeword will be of 7 bits, first 2 bits will be "11" which will act as a
    switch use the group encoding method
    {00, 01, 10} will indicate the group and
    {000, 001, . . . , 110, 111} as offset into the group
else
    codeword will be 11 bits, first 4 bits will be
    "1111", this will act as the second switch and will tell the program to read
    the next 8 bits and treat them as ASCII value of the encoded letter(X)
endif
```

In one embodiment, example decompression pseudo code for decoding may comprise:

```
repeat
read the bits from the file till 2 consecutive bits comes out to be the
same convert these to value (V), which will be the rank (K) of the
letter(X) in the dictionary
If 2 consecutive bits are not 11
    if starting bits is 1 means number is odd
        k= ((V – 1)*2 – 1)
    else its even number
        k= ((V – 1)*2)
else
    read next 2 bits
    if these two bits are "11"
        read next 8 bits while will give you the
ASCII value of the letter(X)
    else
        these 2 bits will tell the group number.
        read next 3 bits which will tell the offset in
that group.
endif
```

Continuing with this example, the compression scheme can assign shorter codewords to entries associated with larger probabilities. The codewords can be pre-generated and looked up in a table for encoding and decoding operations. For example and with reference to the above pseudo code, codewords can be assigned in a default mode or in a group mode. In this example, the sequence "11" can be used as a switch to move between the default and group modes for assigning codewords, and "1111" can be used to send a symbol of the SMS message (e.g., a letter) using its complete 8 bit ASCII value.

In some embodiments, the symbols can be sorted according to their probabilities of usage in English with ranks from 2 to n, where 2 corresponds to the most frequently used symbol and n corresponds to the least frequently used symbol. In this example, for any symbol k between 2 and n, the count of k is less than the count of k+1. The length of the codeword for k in this example is represented by equation (2) below:

$$L((C(k)) = \left\lceil \frac{k}{2} + 1 \right\rceil \qquad (2)$$

When k is even, the first bit of the codeword is "0" and the bits alternate from "0" to "1" until the last bit of the codeword. In this example the last bit of the codeword is the same as the bit before the last bit. If k is odd, the first bit of the codeword is "1" and the bits alternate from "1" to "0" until the last bit of the codeword, which in this example is the same as the bit before the last bit. For example, if k=7, the codeword can be defined as "10100" when k is less then or equal to 8. If k>8, the compression scheme uses the group mode to assign a codeword to that symbol. For example, in the group mode the first two bits identify a group number and the last three bits are an offset for that group. With "11" used to indicate a switch in this example, the available two bit groups are "00" "01" and "10". In the default mode, when k becomes greater than 9, the switch "11" is triggered while encoding the SMS message (or other data) to indicate that while encoding the group mode for codeword generation is being used for that symbol. Once that symbol is encoded using the group mode, the compression scheme can revert back to the default mode to assign a codeword to the next symbol. When the compression scheme encounters "1111" this signifies, in this example that the next 8 bits are read to determine the ASCII value corresponding to the symbol being encoded.

The above compression scheme can be used to compress SMS messages or other data (e.g., tweets) for transmission through a communications network to or from mobile phones (SMEs 605) or automated message generators or receives (ESMEs 655). The appliance 200 and other network components such as the SMS Gateway 615 can access databases containing static dictionaries to encode and decode the SMS messages. The compression scheme may employ static dictionaries that are generated using a probability measure based on the frequency of character distribution in a message. The dictionary entries can be encoded using a group based encoding scheme where higher frequency letters are encoded using fewer bits.

Figure 7:
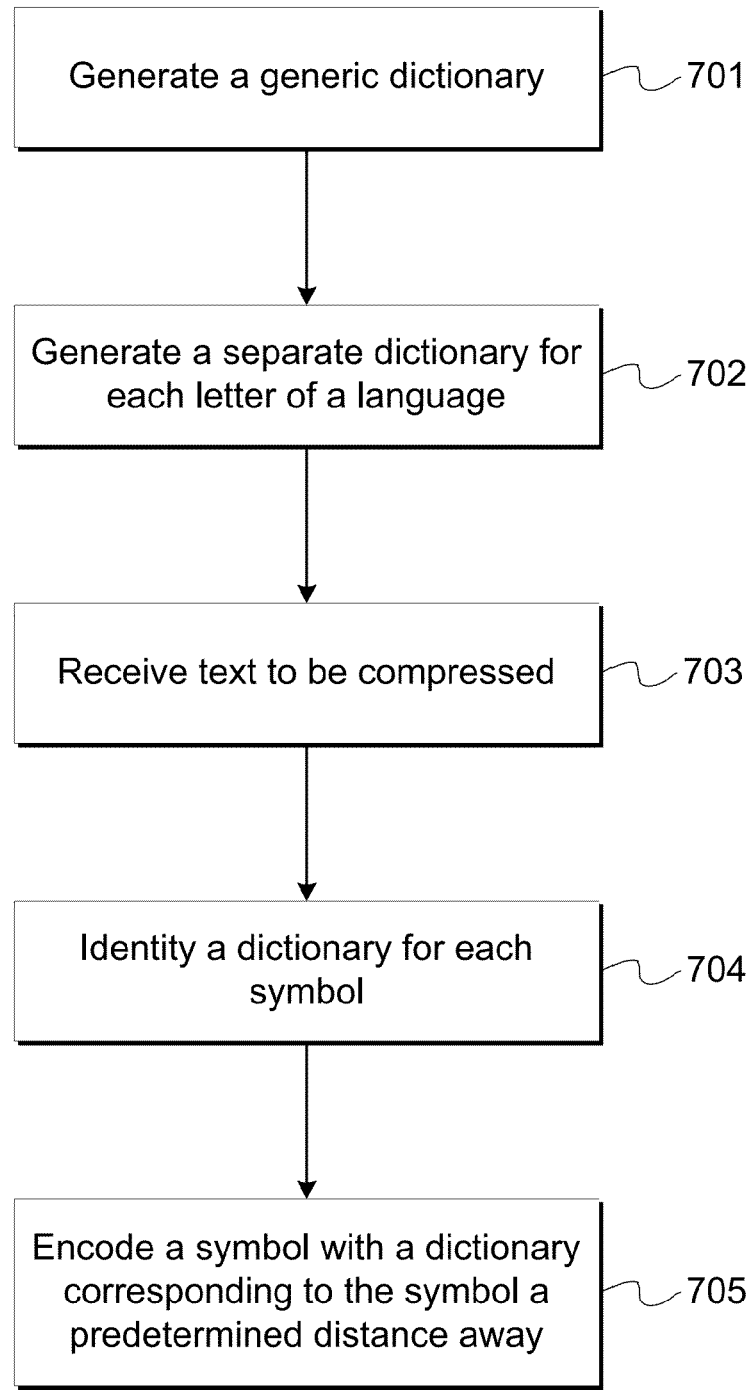
FIG. 7 is a flow chart of an embodiment of a method for compressing small text data.

FIG. 7 is a flow chart of an embodiment of a method 700 to compress short text data with a device, such as embodiments of the appliance 200 described above. The device generates a generic dictionary (step 701) and a separate dictionary for each letter of a language (step 702). The device receives a text to be compressed (step 703). The device, identifies a dictionary for each symbol in the text (step 704), and encodes the symbols with the appropriate dictionary (step 705).

As set forth above, method 700 begins by generating a generic dictionary (step 701). As described above, the generic dictionary comprises a list of all letters in a language. The list is ordered based on the probability of the letter occurring as the first letter of every letter in the language. For example, "S" is the most commonly occurring first letter of English words, with 11% of English words beginning with an "S". Thus, "S" would be the first entry of the generic dictionary. In some embodiments, a space is added as the first entry of the generic dictionary, before the ordered letters. In some embodiments, the generic dictionary is generated once and then stored on the device. In some embodiments, the generic dictionary is generated to reflect a specific subset of English words. For example, if the appliance described above is intended to be used by the military, the probabilities used to order the letters may be calculated on words that are more common in a military setting. Similarly, the method 700 generates a separate dictionary for each letter of a language. In some embodiments, the separate dictionaries are generated once and then stored on the device. Similar to the generic dictionary, in some embodiments, the separate dictionaries are generated to reflect a subset of English words.

The method 700 also includes receiving a text to be compressed (step 703). In some embodiments, the text received includes a limited number of characters, such as 100, 200, or 300 characters. In some embodiments, the received text has no size limit. For example, the text can be, but is not limited to texts, tweets, or emails.

Responsive to receiving the text, the method 700 identifies the proper encoding dictionary for each symbol in the text (step 704). As described above, a dictionary is constructed based on ordering the letters in the dictionary based on the probability of the letter occurring after the letter for which the dictionary was generated. In some embodiments, the probability is not based on the probability of the letter occurring immediately after the letter for which the dictionary was generated. For example, the probability may be based on the letter occurring before the letter for which the dictionary was generated. In such an example, the letters may be encoded from the end of the text rather than the beginning. In another example, the ordering may be based on the probability of the letters occurring two letters after the letter for which the dictionary was created.

The method 700 also includes encoding each of the letters in the text. In some embodiments, the encoding begins with the first letter of the text, and then iteratively encodes each sequential letter. In other embodiments, the encoding begins with the last letter of the text, and encodes the preceding letter of the text. For example, in an embodiment to encode the letters starting with the first letter of the word "HAT" the location of "H" in the default dictionary is identified to encode the letter "H". In this example, the letter H can correspond to the 15$^{th}$ location in the default dictionary. The compression scheme switches to the "H" dictionary, where the letter "A" can be, in this example, the 4$^{th}$ location in the "H" dictionary. The compression scheme then evaluates the "A" dictionary and identified the letter "T" as being at the 4$^{th}$ location in the letter "A" dictionary.

In this example the values for encoding the word "HAT" are (15, 4, 4). The compressed coded SMS message can then be transmitted through at least part of the communications network 600 (e.g., from SMS Gateway 615 to the appliance 200), where the compressed coded SMS message can be decoded. To decode the encoded message in this example, the compression scheme starts with the default dictionary and looks up the location of 15th, which corresponds to the letter "H". The dictionary for "H" is then evaluated, where the fouth location returns an "A", and the "A" dictionary is evaluated, and the fourth location of the "A" dictionary returns a "T". In this example the SMS message has been decoded to reform the word "HAT" and the SMS message can be forwarded, for example from the appliance 200 to the SMS Center 610 and onward to a final destination (e.g., SME 605 or ESME 655). Although the steps have been illustrated being executed in a particular order, they can be done in any order or certain steps may be skipped entirely.

Example default, letter "H" and letter "A" dictionaries are provided below:

| Default | H | A |
|---|---|---|
| 2 = Space | 2 = Space | 2 = Space |
| 3 = s | 3 = e | 3 = n |
| 4 = c | 4 = a | 4 = t |
| 5 = p | 5 = o | 5 = s |
| 6 = d | 6 = i | 6 = l |
| 7 = r | 7 = t | 7 = y |
| 8 = a | 8 = y | 8 = r |
| 9 = b | 9 = r | 9 = c |
| 10 = m | 10 = u | 10 = k |
| 11 = t | 11 = l | 11 = b |
| 12 = i | 12 = n | 12 = m |
| 13 = e | 13 = m | 13 = d |
| 14 = f | 14 = w | 14 = v |
| 15 = h | 15 = f | 15 = p |
| 16 = u | 16 = b | 16 = g |
| 17 = i | 17 = s | 17 = e |
| 18 = g | 18 = p | 18 = i |
| 19 = w | 19 = d | 19 = u |
| 20 = o | 20 = h | 20 = f |
| 21 = n | 21 = c | 21 = w |
| 22 = v | 22 = g | 22 = x |
| 23 = j | 23 = k | 23 = z |
| 24 = k | 24 = v | 24 = h |
| 25 = q | 25 = z | 25 = o |
| 26 = y | 26 = q | 26 = q |
| 27 = z | 27 = j | 27 = j |
| 28 = x | 28 = x | 28 = a |
| 29 = and | 29 = and | 29 = and |
| 30 = in | 30 = in | 30 = in |
| 31 = the | 31 = the | 31 = the |
| 32 = for | 32 = for | 32 = for |

Experimental Results

The table below compares the multiple dictionary based compression scheme described above (identified as szip) with other compression schemes (gzip. bzip2, zip, rar, and 7zip) to compress small texts such as SMS messages. The results of the table below indicate the compression of short texts. The dataset in this example includes 10 random sentences from a book. As indicated in the table, the right hand column indicates the compressed bit size compared to other compression schemes and compared to the original uncompressed size of the message.

| File Name | Original Size | Zip Size | Rar Size | Bzip2 Size | Gzip Size | 7Zip Size | Our method (szip) |
|---|---|---|---|---|---|---|---|
| 1.txt | 172 | 276 | 196 | 147 | 140 | 239 | 97 |
| 2.txt | 138 | 253 | 170 | 125 | 117 | 204 | 76 |
| 3.txt | 229 | 301 | 211 | 175 | 165 | 261 | 122 |
| 4.txt | 142 | 249 | 168 | 123 | 113 | 201 | 80 |
| 5.txt | 90 | 233 | 148 | 101 | 97 | 181 | 45 |
| 6.txt | 124 | 225 | 176 | 125 | 119 | 210 | 67 |
| 7.txt | 119 | 252 | 167 | 121 | 116 | 199 | 63 |
| 8.txt | 174 | 280 | 201 | 147 | 144 | 240 | 97 |
| 9.txt | 198 | 288 | 208 | 160 | 152 | 242 | 100 |
| 10.txt | 165 | 276 | 196 | 147 | 140 | 239 | 84 |

Figure 6D:
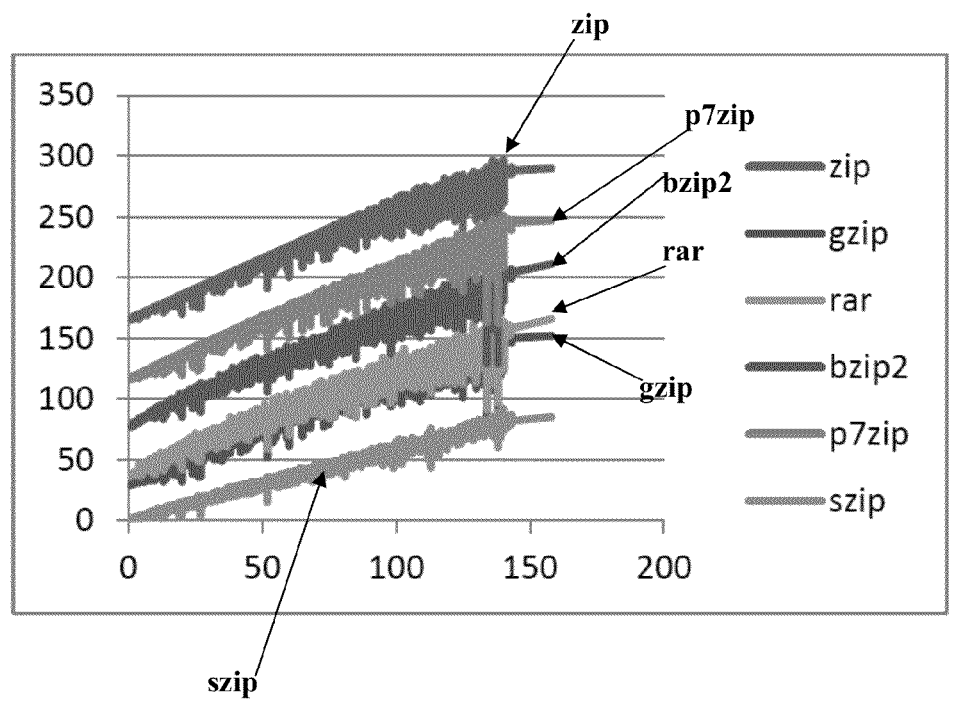
FIG. 6D is an example chart depicting results of a compression technique for compressing short messages.

FIG. 6D illustrates another experimental result. With reference to FIG. 6D, the dataset includes 4500 tweets collected from a twitter public stream application programming interface. As illustrated in the chart, the szip compression scheme outperformed the other compression scheme and achieved an average compression of 44%, which is about 20% better than the closest other compression curve of FIG. 6D. The sizes indicated in FIG. 6D are in bytes, with the X-axis indicating the original size of the message and the Y-axis indicating the size of the message after compression. In this example the original file size is less than about 150 bytes. As illustrated in FIG. 6D, the slope of the lines indicates the level of compression achieved, with a lower slope indicating a higher rate of compression. The size of the messages in this example was clustered around 100-150 bytes.

Figure 6E:
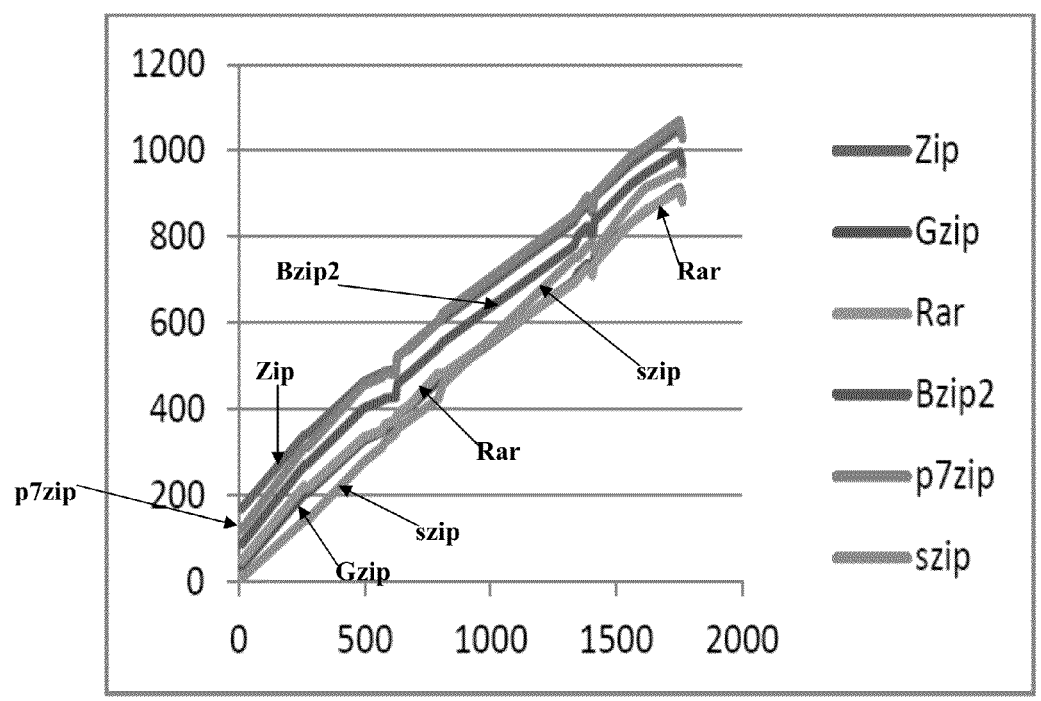
FIG. 6E is an example chart depicting results of a compression technique for compressing messages.

FIG. 6E illustrates another experimental result with original file sizes of less than about 2000 bytes, which is larger than the sample size of FIG. 6D and of the above table. The content in this example is passages of a book. In the example of FIG. 6E, the X-axis indicates the original size of the message and the Y-axis indicates the size of the message after compression. With reference to FIG. 6E, the compression scheme described above (identified in FIG. 6E as szip) outperformed other compression schemes with message sizes of less than approximately 1000 bytes.

The table below illustrates another example of the compression technique described above integrated with the Short Message Peer to Peer (SMPP) protocol, for example. The protocol is based on pairs of request/response protocol data units, or packets exchanged over OSI layer 4 (e.g., TCP session or X.25 SVC3) connections. The protocol data units (PDUs) are binary coded for efficiency in this example, and the SMPP PDU includes a header and body in this example. This table illustrates an example of an SMS message send from ESME 655 to SMSC 610 using the SMPP protocol:

| | | | | | | | | | | | | | | | | | | | | | | | |
|---|---|---|---|---|---|---|---|---|---|---|---|---|---|---|---|---|---|---|---|---|---|---|---|
| 00 | 00 | 00 | 3C | 00 | 00 | 00 | 04 | 00 | 00 | 00 | 00 | 00 | 00 | 00 | 05 | 00 | 02 | 08 | 35 | 35 | 35 | 00 | 01 | 01 |
| 35 | 35 | 35 | 35 | 35 | 35 | 35 | 35 | 35 | 00 | 00 | 00 | 00 | 00 | 00 | 00 | 00 | 00 | 00 | 0F | 48 | 65 | 6C | 6C | 6F |
| 20 | 77 | 69 | 6B | 69 | 70 | 65 | 64 | 69 | 61 | | | | | | | | | | | | | | | |

The following table illustrates a message that says hello to an entity, (e.g., "Hello Wikipedia" in this example). In the following table the message body includes 'data coding' which defines the format of the message, and can default to ASCII, e.g., a 32 bit integer. In one embodiment the compression encoding can be given a unique number that is understood by both the SMS Gateway 615 and the appliance 200.

| | | | | | | | | | | |
|---|---|---|---|---|---|---|---|---|---|---|
| 'command_length',(60) | ... | | | 00 | | 00 | | 00 | | 3C |
| 'command_id',(4) | ... | | 00 | | 00 | | 00 | | 04 | |
| 'command_status',(0) | ... | | 00 | | 00 | | 00 | | 00 | |
| 'sequence_number', (5) ... 00 00 00 05 | | | | | | | | | | |
| 'service_type', | ( ) | | | ... | | | | | 00 | |
| 'source_addr_ton', | (2) | | | ... | | | | | 02 | |
| 'source_addr_npi', | (8) | | | ... | | | | | 08 | |
| 'source_addr', | (555) | ... | | 35 | | 35 | | 35 | | 00 |
| 'dest_addr_ton', | (1) | | | ... | | | | | 01 | |
| 'dest_addr_npi', | (1) | | | ... | | | | | 01 | |
| 'dest_addr', (555555555) ... | 35 | 35 | 35 | 35 | 35 | 35 | 35 | 35 | 00 | |
| 'esm_class', | (0) | | | ... | | | | | 00 | |
| 'protocol_id', | (0) | | | ... | | | | | 00 | |
| 'priority_flag', | (0) | | | ... | | | | | 00 | |
| 'schedule_delivery_time', | | (0) | | | ... | | | | 00 | |
| 'validity_period', | (0) | | | ... | | | | | 00 | |
| 'registered_delivery', | (0) | | | ... | | | | | 00 | |
| 'replace_if_present_flag', | | (0) | | | ... | | | | 00 | |
| 'data_coding', | (0) | | | ... | | | | | 00 | |
| 'sm_default_msg_id', | (0) | | | ... | | | | | 00 | |
| 'sm_length', | (15) | | | ... | | | | | 0F | |
| 'short_message', (Hello wikipedia) ... 48 65 6C 6C 6F 20 77 69 6B 69 70 65 64 69 61' | | | | | | | | | | |

What is claimed:

1. A method for compressing short text data, the method comprising;
receiving, by a device, a text to be compressed, the text comprising a plurality of symbols;
identifying, by the device, a dictionary for each symbol of a plurality of symbols, the dictionary comprising a list of the symbols sorted in decreasing probability of occurring a predetermined distance from a symbol for which the dictionary was generated; and
encoding, by the device, a first symbol in a first position of the text with the dictionary corresponding to the symbol the predetermined distance away from the first position.

2. The method of claim 1, wherein the predetermined distance is a text position immediately after the symbol for which the dictionary was generated.

3. The method of claim 1, further comprising generating, by the device, a generic dictionary, wherein the generic dictionary comprises a list of symbols, ordered in decreasing probability of occurring at the beginning of words of a language.

4. The method of claim 3, further comprising encoding, by the device, the symbol the predetermined distance from one of a space or a special character with the default dictionary.

5. The method of claim 3, further comprising encoding, by the device, the symbol at the beginning of the text with the generic dictionary.

6. The method of claim 1, further comprising encoding, by the device, each symbol of the text with the dictionary of the symbol the predetermined distance away from the symbol to be encoded.

7. The method of claim 1, wherein the symbol comprises one of a letter, a number, a group of symbols, or a special character.

8. The method of claim 1, further comprising generating, by the device, a separate dictionary for each letter of a language and a numerical dictionary for numbers.

9. The method of claim 1, further comprising setting, by the device, a first entry of the plurality of dictionaries to be a space.

10. The method of claim 1, further comprising encoding, by the device, a second symbol in a second position of the text with the dictionary corresponding to the symbol the predetermined distance away from the second position.

11. A device for compressing short text data, the device comprising;
a receiving module configured to receive a text to be compressed; and
an encoding module configured for:
identifying, a dictionary for each symbol of a plurality of symbols, and
encoding a first symbol in a first position of the text with the dictionary corresponding to the symbol the predetermined distance away from the first position and
wherein the encoding module is configured to encode each symbol of the text with the dictionary of the symbol the predetermined distance away from the symbol to be encoded.

12. The device of claim 11, wherein the predetermined distance is a text position immediately after the symbol for which the dictionary was generated.

13. The device of claim 11, wherein the encoding module is further configured to generate a generic dictionary, the generic dictionary comprising a list of symbols, ordered in decreasing probability of occurring at the beginning of words of a language.

14. The device of claim 13, wherein the encoding module is further configured to encode the symbol the predetermined distance from one of a space or a special character with the default dictionary.

15. The device of claim 13, wherein the encoding module is further configured to encode the symbol at the beginning of the text with the generic dictionary.

16. The device of claim 11, wherein the symbol comprises one of a letter, a number, a group of symbols, or a special character.

17. The device of claim 11, wherein the encoding module is further configured to generate a separate dictionary for each letter of a language and a numerical dictionary for numbers.

18. The device of claim 11, wherein the encoding module is further configured to set a first entry of the plurality of dictionaries to be a space.

19. The device of claim 11, wherein the encoding module is further configured to encode a second symbol in a second position of the text with the dictionary corresponding to the symbol the predetermined distance away from the second position.

* * * * *